(12) United States Patent
Yamashita et al.

(10) Patent No.: US 6,388,295 B1
(45) Date of Patent: May 14, 2002

(54) SEMICONDUCTOR DEVICE AND METHOD OF MANUFACTURING THE SAME

(75) Inventors: Tomohiro Yamashita; Yoshinori Okumura; Atsushi Hachisuka; Shinya Soeda, all of Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/663,717

(22) Filed: Sep. 18, 2000

(30) Foreign Application Priority Data

Apr. 5, 2000 (JP) ........................................ 2000-103083

(51) Int. Cl.⁷ ............................................... H01L 29/76
(52) U.S. Cl. ........................ 257/371; 257/296; 257/544; 257/655; 438/275
(58) Field of Search ................................. 257/371, 368, 257/296, 544, 550, 548, 655, 392; 438/275, 224, 228

(56) References Cited

U.S. PATENT DOCUMENTS 5,404,042 A    4/1995   Okumura et al. ........... 257/371

FOREIGN PATENT DOCUMENTS

| JP | 4-212453 | 8/1992 |
| JP | 5-267606 | 10/1993 |
| JP | 11-26601 | 1/1999 |

*Primary Examiner*—Mark V. Prenty
(74) *Attorney, Agent, or Firm*—McDermott, Will & Emery

(57) ABSTRACT

The semiconductor device has a triple well structure. The triple well and other wells have impurity concentration distributions in the depth direction, which are determined in accordance with required function. Thereby, the required performances such as suppression of a leak current can be achieved even in a miniaturized structure.

20 Claims, 41 Drawing Sheets

SEMICONDUCTOR DEVICE AND METHOD OF MANUFACTURING THE SAME

BACKGROUND OF THE INVENTION

1. Field of the Invention

The present invention relates to a MOS (Metal Oxide Silicon) semiconductor device and a method of manufacturing the same, and particularly a semiconductor device provided with wells having different depths as well as a method of manufacturing the same.

2. Description of the Background Art

In accordance with advances in design technology and process technology, it is now becoming possible to manufacture a high-density integrated circuit provided with a plurality of integrated circuits, which are the same as those manufactured independently of each other in the prior art, on a single chip. It is now becoming possible to produce a structure, in which a semiconductor device such as a DRAM (Dynamic Random Access Memory) as well as a high-density integrated logic circuit such as an MPU (Micro Processing Unit) are formed in a single chip. For manufacturing such integrated circuits, it is necessary to arrange within a single chip a plurality of MOS field-effect elements having different structures according to purposes.

A semiconductor device in which memory cells and a peripheral circuit are formed on a common substrate is disclosed, e.g., in Japanese Patent Laying-Open Nos. 4-212453 and 5-267606. These publications have disclosed semiconductor devices, in which a p-well region provided with memory cell transistors is surrounded by an n-region.

FIG. 50 is a cross section showing elements of a semiconductor device in the prior art. In FIG. 50, 101 indicate a p-type semiconductor substrate, 102 indicates an isolating and insulating film, 103 indicates an n-well and 104 indicates a p-well. According to this structure, in which p-well 104 of a memory cell part is surrounded by n-wells 103 and thereby is electrically isolated from the peripheral circuit part, the potential on p-well 104 can be determined independently, and n-wells 103 surrounding p-well 104 intercept electrons coming from p-type semiconductor substrate 101 so that soft error can be prevented.

For providing a deeper well, however, it is necessary to provide a wider region, which is not provided with a transistor, in the well end. In accordance with further miniaturization of the semiconductor integrated circuit, therefore, an isolation width and a width of the well are reduced, and the depth of the well is reduced. Thereby, the impurity concentration of the well increases, and the impurity concentration at the surface of the semiconductor substrate increases, resulting in a problem of deterioration of element characteristics such as increase in junction leak current. For suppressing the junction leak current, the impurity concentration of the well may be reduced. However, this results in a problem of increase in well resistance. Particularly in the memory cell region, the junction leak current deteriorates refresh characteristics.

SUMMARY OF THE INVENTION

The invention has been developed for overcoming the above problems, and it is an object to provide a semiconductor device, in which a semiconductor integrated circuit can be miniaturized while providing a memory cell region having improved refresh characteristics as well as a logic circuit having including shallow wells and therefore including miniaturized circuits capable of achieving required performances, and can achieve intended respective performances. It is also an object of the invention to provide a method of manufacturing such a semiconductor device.

It is an object of the invention to provide a semiconductor device, in which refresh characteristics are improved in a memory cell region, relatively shallow wells are employed in a logic circuit region for miniaturizing a circuit structure, and thereby performances required in the respective regions can be achieved in the miniaturized semiconductor integrated circuit having the memory cell region and the logic circuit region, as well as a method of manufacturing the semiconductor device.

For achieving the above object, a semiconductor device according to an aspect of the invention includes a semiconductor layer of a first conductivity type; a first impurity region of a second conductivity type formed at a main surface of the semiconductor layer and having a first impurity concentration peak; a second impurity region of the first conductivity type formed at the main surface of the semiconductor layer, located within a planar region provided with the first impurity region, and having a second impurity concentration peak at a smaller depth than the first impurity concentration peak; a third impurity region of the second conductivity type formed at the main surface of the semiconductor layer, located within the planar region provided with the first impurity region, surrounding the second impurity region, and having a third impurity concentration peak at a smaller depth than the first impurity concentration peak; a fourth impurity region of the second conductivity type formed at the main surface of the semiconductor layer, located in a region spaced from the first impurity region, and having a fourth impurity concentration peak; a fifth impurity region of the first conductivity type formed at the main surface of the semiconductor layer, located within a planar region provided with the fourth impurity region, and having a fifth impurity concentration peak at a smaller depth than the second and fourth impurity concentration peaks; a sixth impurity region of the second conductivity type formed at the main surface of the semiconductor layer, located within a planar region provided with the fourth impurity region, surrounding the fifth impurity region and having a sixth impurity concentration peak at a smaller depth than the fourth impurity concentration peak; a first field-effect element of the second conductivity type formed at the main surface of the second impurity region; and a second field-effect element of the second conductivity type formed at the main surface of the fifth impurity region.

Owing to the above structure, a triple well structure can be employed for allowing setting of the substrate potential of the element independently of the semiconductor substrate while suppressing a junction leak current by the second impurity region, and allowing miniaturization by the fifth impurity region.

In the semiconductor device of the above aspect, the first impurity concentration peak and the fourth impurity concentration peak may be formed at the substantially equal depths from the main surface of the semiconductor layer, respectively. Thus, the first and fourth impurity regions may have the substantially same impurity concentration distributions in the direction of the substrate depth, whereby the semiconductor device having the triple well structure suitable to the multifunction configuration can be achieved through simple steps.

In this case, the first and third impurity regions may be spaced by a predetermined distance from each other in a direction of a depth determined from the main surface of the semiconductor layer, and the fourth and sixth impurity regions may be spaced by a predetermined distance from each other in the direction of the depth determined from the main surface of the semiconductor layer. According to the above structure, the semiconductor device having the triple well structure suitable to the multifunction configuration can be obtained while suppressing increase in number of steps.

According to an embodiment of the above aspect, the semiconductor device further includes a seventh impurity region of the second conductivity type formed at the main surface of the semiconductor layer, located within a planar region provided with the first impurity region, surrounding the second impurity region, and having a seventh impurity concentration peak located shallower than the first impurity concentration peak and deeper than the third impurity concentration peak and being lower in concentration than the first and third impurity concentration peaks; and an eighth impurity region of the second conductivity type formed at the main surface of the semiconductor layer, located in a region provided with the fourth impurity region, surrounding the fifth impurity region, and having an eighth impurity concentration peak located shallower than the fourth impurity concentration peak and deeper than the sixth impurity concentration peak and being lower in concentration than the fourth and sixth impurity concentration peaks.

According to this structure, since the first and fourth impurity regions have the same impurity concentration distributions in the direction of the substrate depth, the second or fifth impurity region can be electrically isolated from the semiconductor substrate with reliability. Therefore, the semiconductor device having the triple well structure suitable to the multifunction configuration can be obtained.

According to still another embodiment of the above aspect, the semiconductor device further includes a seventh impurity region of the second conductivity type formed at the main surface of the semiconductor layer, located within a planar region provided with the first impurity region, surrounding the second impurity region with a predetermined distance therebetween, and having a seventh impurity concentration peak located shallower than the first impurity concentration peak and deeper than the third impurity concentration peak; and a third field-effect element of the first conductivity type formed in the third impurity region.

According to this structure, the impurity region of the conductivity type opposite to that of the substrate surrounds the second and fifth impurity regions for electrically isolating them from the substrate, and further the seventh and second impurity regions are formed in the spaced positions, respectively. Therefore, the third element can be formed even in the end of the third impurity region.

The fourth impurity concentration peak may be shallower than the first impurity concentration peak. According to this structure, the depths of the second and fifth impurity regions are utilized to change the depths of the impurity regions, which have the conductivity type opposite to that of the substrate and surround the second and fifth impurity regions, respectively. Thereby, further miniaturization can be achieved.

According to yet another embodiment, the semiconductor device of the above aspect further includes a ninth impurity region of the first conductivity type formed at the main surface of the semiconductor layer, located in a region different from the first and fourth impurity regions, and having a ninth impurity concentration peak at the substantially same depth as the second impurity concentration peak; a tenth impurity region of the first conductivity type formed at the main surface of the semiconductor layer, located in a region different from the first, fourth and ninth impurity regions, and having a tenth impurity concentration peak at the substantially same depth as the fifth impurity concentration peak; an eleventh impurity region of the second conductivity type formed at the main surface of the semiconductor layer, located in a region different from the first, fourth, ninth and tenth impurity regions, and having an eleventh impurity concentration peak at the substantially same depth as the fifth impurity concentration peak; a twelfth impurity region of the second conductivity type formed at the main surface of the semiconductor layer, located in a region different from the first, fourth, ninth, tenth and eleventh impurity regions, and having a twelfth impurity concentration peak at the substantially same depth as the second impurity concentration peak; a third field-effect element of the second conductivity type formed at the main surface of the ninth impurity region; a fourth field-effect element of the second conductivity type formed at the main surface of the tenth impurity region; a fifth field-effect element of the first conductivity type formed at the main surface of the eleventh impurity region; and a sixth field-effect element of the first conductivity type formed at the main surface of the twelfth impurity region.

According to the above structure, the concentration distribution of the well, which is not required to carry a fixed potential, is changed similarly to the other wells, if necessary. Therefore, elements corresponding to the required functions can be formed.

According to further another embodiment, the semiconductor device of the above aspect further includes a ninth impurity region of the first conductivity type formed at the main surface of the semiconductor layer, located in a region different from the first and fourth impurity regions, and having a ninth impurity concentration peak at the substantially same depth as the second impurity concentration peak; a tenth impurity region of the first conductivity type formed at the main surface of the semiconductor layer, located in a region different from the first, fourth and ninth impurity regions, and having a tenth impurity concentration peak at the substantially same depth as the fifth impurity concentration peak; an eleventh impurity region of the second conductivity type formed at the main surface of the semiconductor layer, located in a region different from the first, fourth, ninth and tenth impurity regions, and having an eleventh impurity concentration peak; a third field-effect element of the second conductivity type formed at the main surface of the ninth impurity region; a fourth field-effect element of the second conductivity type formed at the main surface of the tenth impurity region; and a fifth field-effect element of the first conductivity type formed at the main surface of the eleventh impurity region, wherein the third, sixth and eleventh impurity concentration peaks are located at the substantially same depth as the fifth impurity concentration peak.

According to the above structure, since the third, sixth and eleventh impurity concentration peaks are present at the substantially same depth, the third, sixth and eleventh impurity regions can be formed at the same time.

In the semiconductor device of the above aspect, the third and sixth impurity concentration peaks may be shallower than the second impurity concentration peak and deeper than the fifth impurity concentration peak.

In this case, the concentration distributions are controlled so that the semiconductor device having a miniaturized structure and multiple functions can be achieved through simple steps.

In an embodiment, the semiconductor device further includes an impurity region of the second conductivity type formed at the main surface of the semiconductor layer, located in a region different from the first and fourth regions, and having an impurity concentration peak at the substantially same depth as the third and sixth impurity concentration peaks; and an element of the first conductivity type formed in this impurity region.

According to this structure, the impurity regions of the conductivity type opposite to that of the substrate have the same concentration distributions in the region of the triple well structure and the region other than the triple well structure, and these concentration distributions are controlled so that these can be formed simultaneously.

According to a further embodiment, the semiconductor device of the above aspect further includes an impurity region of the first conductivity type formed at the main surface of the semiconductor layer, located in a region between the second and third impurity regions, and having an impurity concentration peak shallower than the second impurity concentration; and an element of the second conductivity type formed in this impurity region. According to this structure, since the impurity regions to be set to the same potential are formed as shallow as possible, further miniaturization can be achieved.

According to a further embodiment, the semiconductor device of the above aspect further includes another semiconductor layer disposed on another main surface of the semiconductor layer, and having a higher impurity concentration than the semiconductor layer. According to this structure, since the elements having multiple functions are disposed on the high-concentration substrate, latch-up in the deep portion of the well structure is suppressed.

A semiconductor device according to another aspect of the invention includes a semiconductor layer of a first conductivity type; a first impurity region of a second conductivity type formed at a main surface of the semiconductor layer and having a first impurity concentration peak; a second impurity region of the first conductivity type formed at the main surface of the semiconductor layer provided with the first impurity region, surrounded entirely by the first impurity region and having a second impurity concentration peak at a smaller depth than the first impurity concentration peak; a third impurity region of the first conductivity type formed at the main surface of the semiconductor layer, located in a region between the first and second impurity regions, surrounding the second impurity region, and having a third impurity concentration peak at a smaller depth than the second impurity concentration peak; and a first field-effect element of the second conductivity type formed at the main surface of the second impurity region.

Owing to the above structure, the third impurity region can reduce an electric field between the first and second impurity regions.

In the semiconductor device of the above aspect, the impurity region of the second conductivity type may not be present between the second and third impurity regions. Owing to this structure, the third impurity region can suppress the electric field between the first and second impurity regions.

According to an embodiment, the semiconductor device of the above aspect further includes a fourth impurity region of the first conductivity type formed at the main surface of the semiconductor layer, located in a region different from the first impurity region, and having a fourth impurity concentration peak at the substantially same depth as the second impurity concentration peak; a fifth impurity region of the first conductivity type formed at the main surface of the semiconductor layer, located in a region different from the first and fourth impurity regions, and having a fifth impurity concentration peak at a smaller depth than the second and fourth impurity concentration peaks; a sixth impurity region of the second conductivity type formed at the main surface of the semiconductor layer, located in a region different from the first, fourth and fifth impurity regions, and having a sixth impurity concentration peak at the substantially same depth as the fifth impurity concentration peak; a seventh impurity region of the second conductivity type formed at the main surface of the semiconductor layer, located in a region different from the first, fourth and sixth impurity regions, and having a seventh impurity concentration peak at the substantially same depth as the fourth impurity concentration peak; a second field-effect element of the second conductivity type formed at the main surface of the fourth impurity region; a third field-effect element of the second conductivity type formed at the main surface of the fifth impurity region; a fourth field-effect element of the first conductivity type formed at the main surface of the sixth impurity region; a fifth field-effect element of the first conductivity type formed at the main surface of the seventh impurity region; and a capacitor connected to one of source/drain regions of the first element.

According to the above structure, since a memory cell transistor is formed in the second impurity region, the junction leak current can be suppressed.

According to an embodiment, the semiconductor device of the above aspect further includes another semiconductor layer disposed on another main surface of the semiconductor layer, and having a higher impurity concentration than the semiconductor layer. According to this structure, since elements having multiple functions are disposed on the high concentration substrate, latch-up in a deep portion of the well structure can be suppressed.

A method of manufacturing a semiconductor device according to the invention includes the steps of forming a first impurity region of a second conductivity type having a first impurity concentration peak at a main surface of a semiconductor layer of a first conductivity type; forming a second impurity region of the second conductivity type arranged at the main surface of the semiconductor layer, located in a region different from the first impurity region and having a second impurity concentration peak; forming a third impurity region of the first conductivity type arranged at the main surface of the semiconductor layer provided with the first impurity region, and having a third impurity concentration peak at a smaller depth than the first impurity concentration peak; forming a fourth impurity region of the first conductivity type formed at the main surface of the semiconductor layer provided with the second impurity region, and having a fourth impurity concentration peak at a smaller depth than the second impurity concentration peak; forming a fifth impurity region of the second conductivity type arranged at the main surface of the semiconductor layer provided with the first impurity region, and having a fifth impurity concentration peak at a smaller depth than the first and third impurity concentration peaks, and a sixth impurity region of the second conductivity type arranged at the main surface of the semiconductor layer provided with the second impurity region, surrounding the fourth impurity region and having the fifth impurity concentration peak; forming a first element of the second conductivity type at the main surface of the third impurity region; and forming a second element of the second conductivity type at the main surface of the fourth impurity region.

Owing to the above steps, a triple well structure can be employed for allowing setting of the substrate potential of the element independently of the semiconductor substrate, in which case the second impurity region can be deep and the fifth impurity region can be shallow. Further, the depths of the third and fourth impurity regions are utilized to change the depths of the impurity regions having the conductivity type opposite to that of the substrate and surrounding the third and fourth impurity regions, respectively.

According to an embodiment, the method of manufacturing the semiconductor device of the invention further includes the steps of forming a seventh impurity region of the second conductivity type arranged at the main surface of the semiconductor layer, located in a planar region provided with the first impurity region, surrounding the third impurity region, and having a seventh impurity concentration peak located shallower than the first impurity concentration peak and deeper than the fourth impurity concentration peak and being lower in concentration than the first and sixth impurity concentration peaks; and an eighth impurity region of the second conductivity type arranged at the main surface of the semiconductor layer, located in a region provided with the second impurity region, surrounding the fourth impurity region, and having the seventh impurity concentration peak.

According to the above steps, since the first and fourth impurity regions have the same impurity concentration distributions in the direction of the substrate depth, the second or fifth impurity region can be electrically isolated from the semiconductor substrate with reliability through simple steps. Therefore, the semiconductor device having the triple well structure suitable to the multifunction configuration can be obtained.

According to another embodiment of the method of manufacturing the semiconductor device of the invention, the step of forming the third impurity region includes the step of forming a ninth impurity region of the first conductivity type arranged at the main surface of the semiconductor layer, located in a region different from the first and second impurity regions, and having a ninth impurity concentration peak; the step of forming the fourth impurity region includes the step of forming a tenth impurity region of the first conductivity type arranged at the main surface of the semiconductor layer, located, in a region different from the first, second and ninth impurity regions, and having a tenth impurity concentration peak; and the step of forming the fifth and sixth impurity regions includes the step of forming an eleventh impurity region of the second conductivity type arranged at the main surface of the semiconductor layer, located in a region different from the first, second, ninth and tenth impurity regions, and having an eleventh impurity concentration peak.

According to the above steps, the concentration distribution of the well, which is not required to carry a fixed potential, can be changed similarly to the other wells, if necessary.

In the manufacturing method described above, the fifth, sixth and eleventh impurity concentration peaks may be disposed shallower than the third impurity concentration peak and deeper than the fourth impurity concentration peak.

The invention described above can achieve the following distinctive features.

According to the invention, the triple well structure is employed for setting the substrate potential of the element independently of the semiconductor substrate. In this case, the well provided with the element, which may suffer from a junction leak current, is formed at a large depth for achieving the function of the element, and the well provided with the element, which does not suffer from the junction leak current, is formed at a small depth for miniaturization. Thereby, the multiple functions and the miniaturization of the structure can be achieved at the same time. Independently of the depths of the wells provided with the elements, the impurity regions for electrically isolating the wells provided with the elements from the semiconductor substrates have the same impurity concentration distributions in the direction of depth of the substrate. Therefore, the semiconductor device having the multiple functions and the miniaturized structure can be achieved through simple steps.

The impurity region of the conductivity type opposite to that of the substrate surrounds the well for electrically isolating the well from the substrate, and this impurity region of the conductivity type opposite to that of the substrate has the impurity concentration distribution, which is changed for providing the well having the shallow impurity concentration peak. Therefore, the element can be formed even in the end of the well so that further miniaturization can be achieved.

In the semiconductor device having the triple well structure, the impurity region of the opposite conductivity type surrounding the shallow well is formed at a small depth, and the impurity region of the opposite conductivity type surrounding the deep well is formed at a large depth. Therefore, the semiconductor device having the multiple functions and the further miniaturized structure can be achieved.

The well which is not required to carry a fixed potential is configured to have a variable concentration distribution, if necessary. Therefore, both the multiple functions and the miniaturized structure can be simultaneously achieved in the semiconductor device.

A portion of the impurity region surrounding the well of the same conductivity type as the substrate in the triple well structure has the same concentration distribution as the impurity region, which is formed in another portion and is provided with the element. Therefore, these impurity regions can be formed at the same time, and the semiconductor device having the multifunctional structure and the miniaturized structure can be achieved through simple steps.

The impurity regions, which have the conductivity type opposite to that of the substrate, and are formed in the region of the triple well structure and the other region, have the same impurity concentration distributions which are controlled. Therefore, the semiconductor device having the multifunctional structure and the miniaturized structure can be achieved through simple steps.

In the semiconductor device having the triple well structure, wells of different depths are formed in the portion surrounded by the impurity region of the conductivity type opposite to that of the substrate, and these wells are formed as shallow as possible even in the case where the same potential is to be placed on these wells. Therefore, further miniaturization can be achieved.

In the semiconductor device, having the triple well structure, the memory transistor is formed in the well which is deep and has the same conductivity type as the substrate. Therefore, the junction leak current is suppressed, and the semiconductor device can have improved refresh characteristics.

In the semiconductor device having the triple well structure, the impurity region which has the same conductivity type as the substrate, and has the shallow impurity concentration peak is arranged between the well of the same conductivity type as the substrate and the impurity region of the opposite conductivity type surrounding this well. Therefore, the electric field between the well and the impurity region of the opposite conductivity type can be suppressed, and the junction leak current can be suppressed.

In the semiconductor device having the triple well structure, the memory cell transistor is formed in the deep well of the same conductivity type as the substrate. Therefore, it is possible to achieve the semiconductor device, in which the junction leak current is suppressed, and the refresh characteristics are improved.

Since the elements having multiple functions are disposed on the high-concentration substrate, latch-up in a deep portion of the well structure can be suppressed, and the semiconductor device having improved reliability can be achieved.

The triple well structure is employed for setting the substrate potential of the element independently of the semiconductor substrate. In this case, the well provided with the element, which may suffer from a junction leak current, is formed at a large depth for achieving the required function of the element, and the well provided with the element, which does not suffer from the junction leak current, is formed in the shallow well for achieving the miniaturization. Further, independently of the depths of the wells provided with the elements, the impurity regions for electrically isolating the respective wells provided with the elements from the semiconductor substrate have the same impurity concentration distributions in the direction of the substrate depth. Therefore, the semiconductor device in which the multifunctional structure and the miniaturized structure are simultaneously achieved can be obtained through simple steps.

Further, the impurity region of the conductivity type opposite to that of the substrate surrounds the well for electrically isolating the substrate from the well, and the portion of the impurity region provided with the element has the shallow impurity concentration peak. Therefore, the element can be formed even in the end of the above portion so that further miniaturization can be achieved.

In the semiconductor device having the triple well structure, the impurity region of the opposite conductivity type surrounding the shallow well can be formed at a small depth, and the impurity region of the opposite conductivity type surrounding the deep well can be formed at a large depth. Therefore, the semiconductor device can have the multiple functions and the further miniaturized structure.

In the triple well structure, a portion of the impurity region of the second conductivity type surrounding the well of the same conductivity type as the substrate has the same concentration distributions as the impurity region of the second conductivity type, which is formed in the other portion and is provided with the element. Therefore, these can be formed simultaneously. Accordingly, the semiconductor device having the multiple functions and the miniaturized structure can be achieved through simple steps.

In the semiconductor device having the triple well structure, the wells of different depths are formed in the portion surrounded by the impurity region of the conductivity type opposite to that of the substrate, and these wells are formed as shallow as possible even in the case where the same potential is to be placed thereon. Therefore, the semiconductor device can be further miniaturized.

In the semiconductor device having the triple well structure, the memory cell transistor is formed in the deep well of the same conductivity type as the substrate. Therefore, it is possible to provide the semiconductor device, in which the junction leak current is suppressed, and the refresh characteristics are improved.

In the semiconductor device having the triple well structure, the impurity region having the same conductivity type as the substrate and having the shallow impurity concentration peak is formed between the well of the same conductivity type as the substrate and the impurity region of the opposite conductivity type surrounding this well. Therefore, it is possible to suppress the electric field between the well and the impurity region of the opposite conductivity type, and it is possible to provide the semiconductor device in which the junction leak current is suppressed.

In the semiconductor device having the triple well structure, the memory cell transistor is formed in the deep well of the same conductivity type as the substrate. Therefore, it is possible to provide the semiconductor device in which the junction leak current is suppressed, and the refresh characteristics are improved.

Since epitaxial growth is executed on the surface of the high-concentration substrate, and the multifunctional elements are formed also on the epitaxial layer thus formed. Therefore, latch-up is likewise suppressed in a deep portion of the well structure, and the semiconductor device having improved reliability can be obtained.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
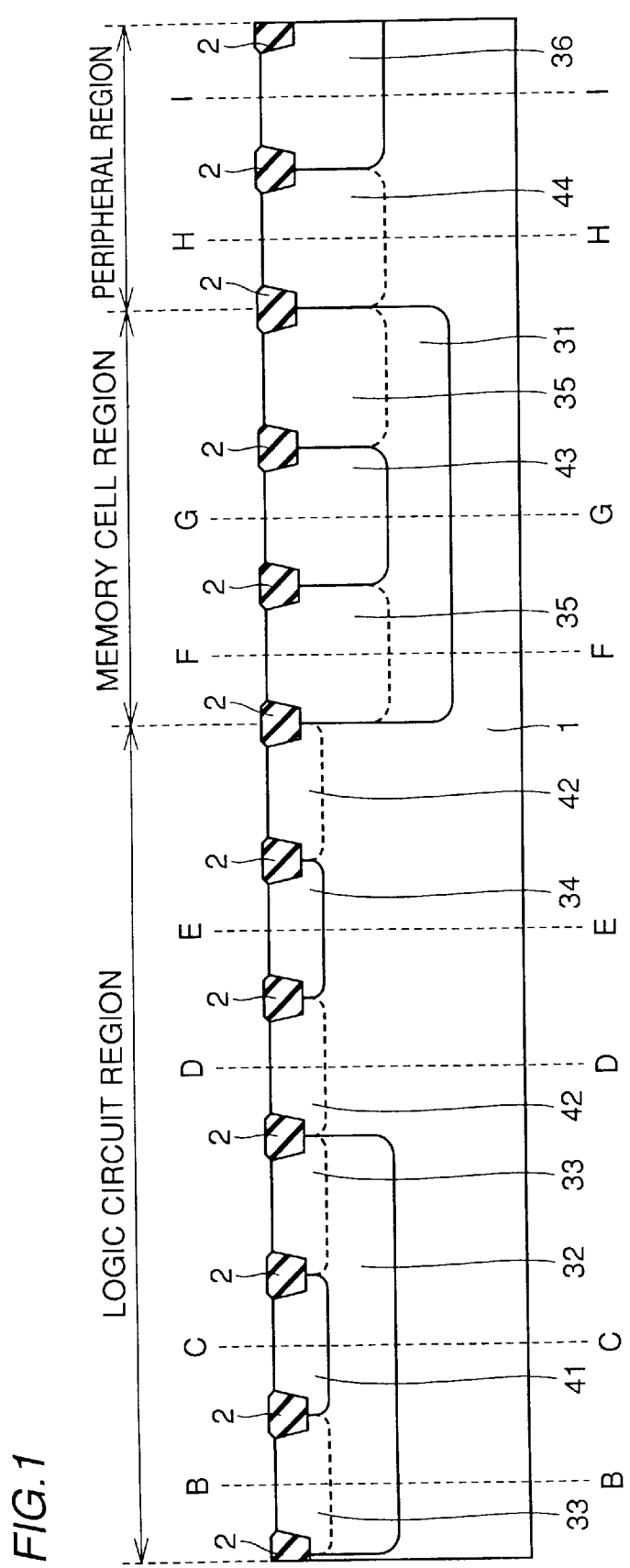
FIG. 1 is a cross section showing a semiconductor device according to a first embodiment of the invention.

Referring to FIG. 1, a semiconductor substrate 1 contains a p-type or n-type impurity exhibiting a specific resistance of about 10 Ω.cm equivalent to a concentration of about $1 \times 10^{15}/cm^3$, and is provided at an isolating region with an isolating and insulating film 2 formed of a silicon oxide film, a silicon nitride film or a silicon oxynitride film. Surface portions of semiconductor substrate 1, which are isolated by the isolating and insulating film 2, are doped with impurities to form n-wells 31–36 and p-wells 41–44.

FIG. 1 shows by way of example a semiconductor device provided with a logic circuit, memory cells and a peripheral circuit. Although not shown, pMOS transistors according to intended uses are formed in n-wells 33–36, and nMOS transistors according to the intended uses are formed in p-wells 41–44. However, n-wells 33 and 35 may not be provided with a transistor, and form triple well structures, respectively, in which n-well 33 cooperates with n-well 32 (bottom n-well) to surround p-well 41, and n-well 35 cooperates with n-well 31 (bottom n-well) to surround p-well 43 so that p-wells 41 and 43 are electrically isolated from the other portions.

If necessary, each of the transistors is provided with a layer such as a punch-through stop layer containing an impurity of the same conductivity type as the semiconductor substrate (well), or a channel doped layer containing an impurity (embedded channel type) of the conductivity type opposite to that of the semiconductor substrate (well) or an impurity (surface channel type) of the same conductivity type as the semiconductor substrate (well). These layers are formed, e.g., by ion implantation, but are not shown in the figures.

Figure 2:
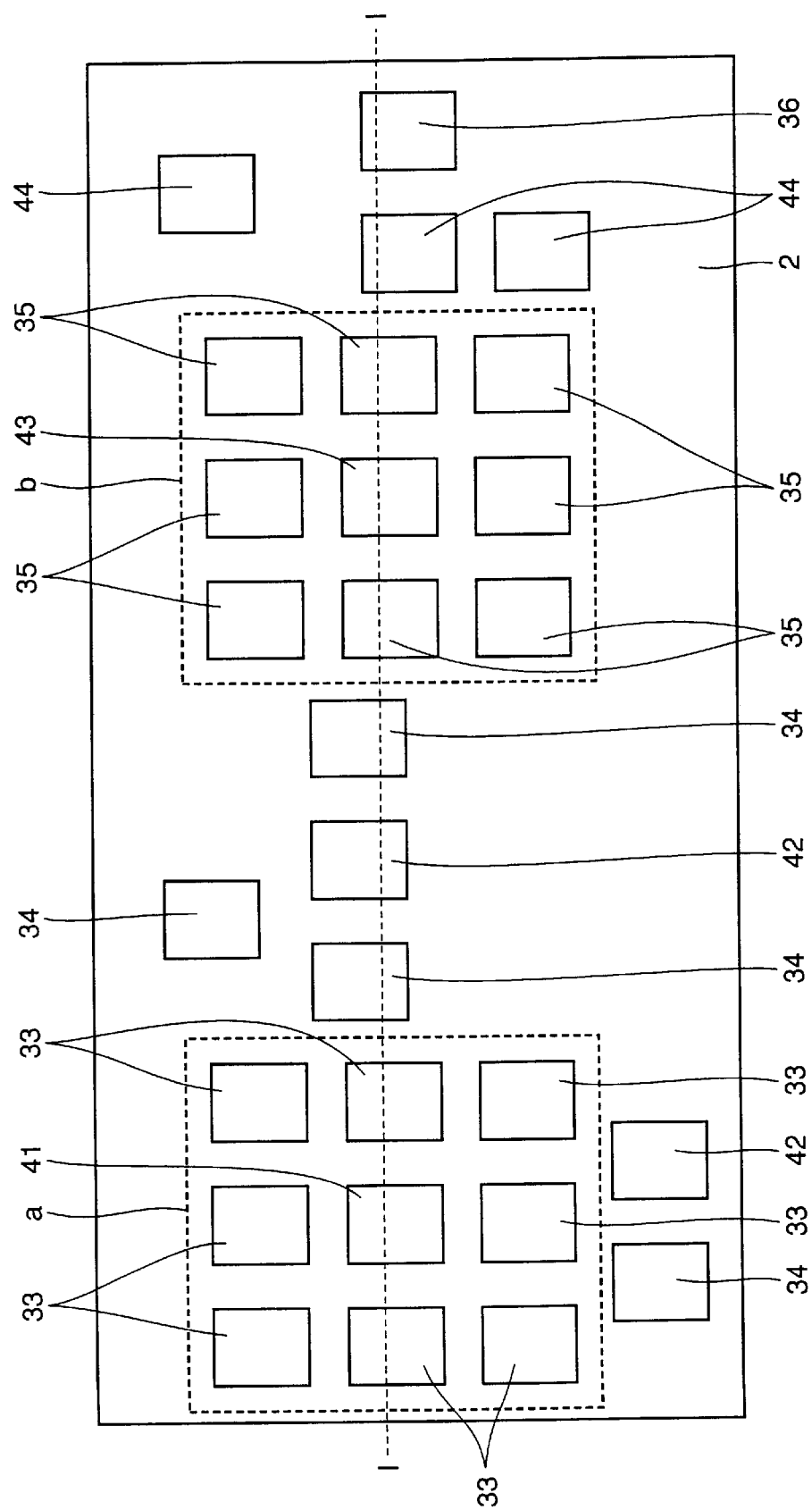
FIG. 2 is a top view showing a semiconductor device according to the first embodiment of the invention.

FIG. 2 is a top view of the semiconductor device according to the first embodiment of the invention. The section shown in FIG. 1 is taken along line A—A in FIG. 2. In FIG. 2, n-well 32 is formed at a position deeper than p-well 41 and n-well 33 within a portion surrounded by broken line a, and n-well 31 is formed at a position deeper than p-well 43 and n-well 35 in a portion surrounded by broken line b so that p-wells 41 and 43 are electrically isolated from semiconductor substrate 1.

Figure 3:
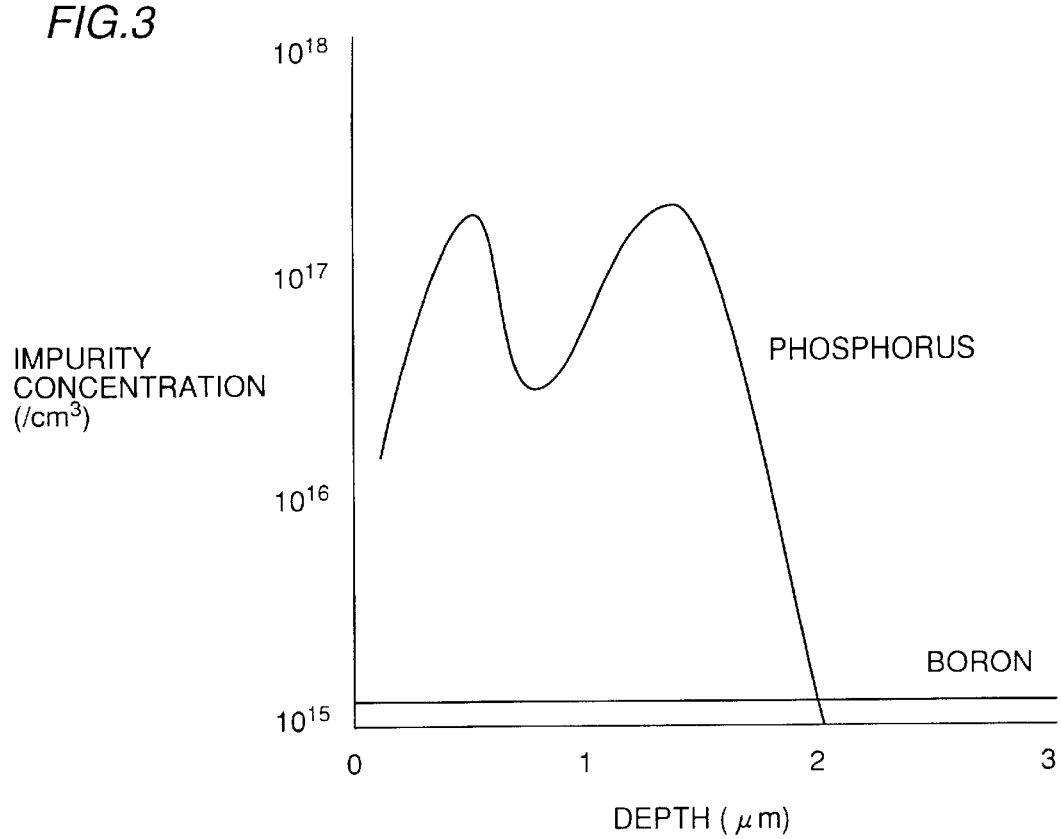
FIGS. 3–10 are graphs showing distributions of impurity concentrations on sections of the semiconductor device taken along lines B—B, C—C, D—D, E—E, F—F, G—G, H—H and I—I in FIG. 1 according to the first embodiment of the invention, respectively.

FIG. 3 is a graph showing distributions of impurity concentrations in the semiconductor device according to the first embodiment of the invention, and more specifically shows the impurity concentration distributions in n-wells 32 and 33 as well as semiconductor substrate 1 on a section taken along line B—B in FIG. 1. Referring to FIG. 3, n-well 32 contains the impurity such as phosphorus at about $1 \times 10^{17} - 1 \times 10^{19}/cm^3$, and the peak of the impurity concentration thereof is located at a depth of about 1–1.5 μm from the surface of the semiconductor substrate. n-well 33 contains an impurity such as phosphorus at about $1 \times 10^{17} - 1 \times 10^{19}/cm^3$, and the peak of the impurity concentration thereof is located at a depth of about 0.5–0.8 μm from the surface of the semiconductor substrate.

Figure 4:
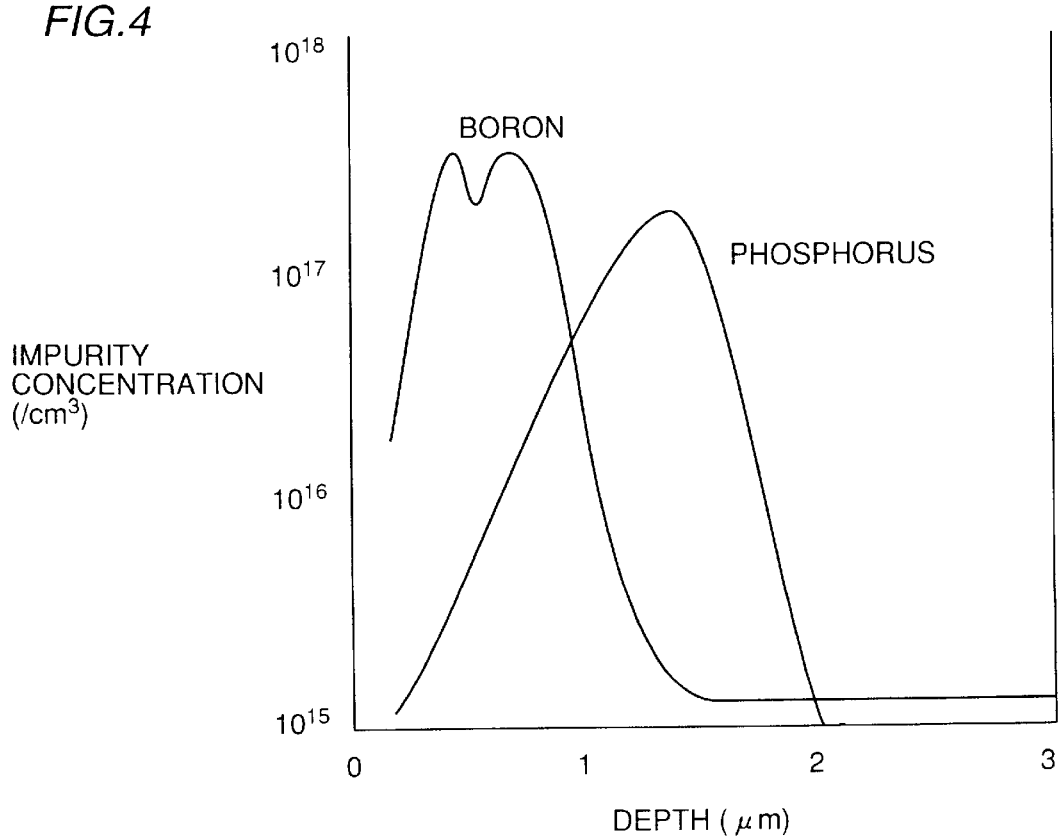

FIG. 4 is a graph showing distributions of impurity concentrations in the semiconductor device according to the first embodiment of the invention, and more specifically shows the impurity concentration distributions in n-well 32, p-well 41 and semiconductor substrate 1 on a section taken along line C—C in FIG. 1. Referring to FIG. 4, n-well 32 contains an impurity such as phosphorus at about $1 \times 10^{17} - 1 \times 10^{19}/cm^3$, and the peak of the impurity concentration thereof is located at a depth of about 1–1.5 μm from the surface of the semiconductor substrate. p-well 41 contains an impurity such as boron at about $1 \times 10^{17} - 1 \times 10^{19}/cm^3$, and the peak of the impurity concentration thereof is located at a depth of about 0.5–0.8 μm from the surface of the semiconductor substrate. Further, FIG. 4 shows the impurity concentration distribution in a channel stop layer (not shown in FIG. 1), which contains an impurity such as boron at about $1 \times 10^{17} - 1 \times 10^{19}/cm^3$ and has the impurity concentration peak at a depth of about 0.2–0.5 μm from the semiconductor substrate surface.

Figure 5:
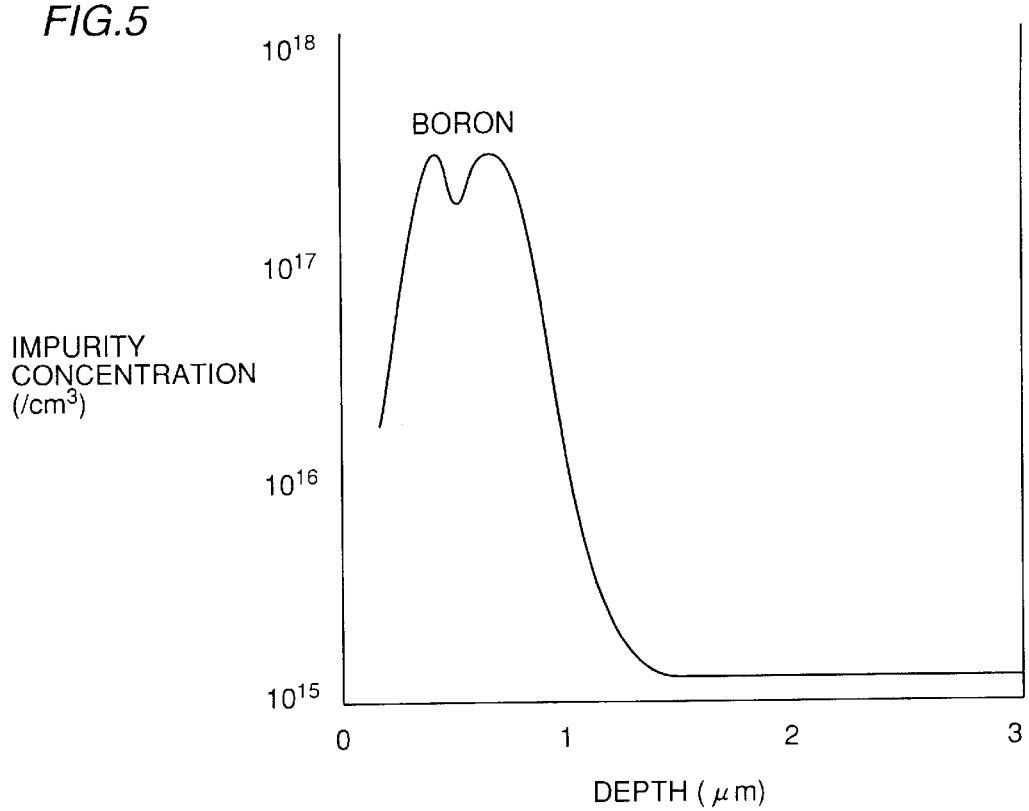

FIG. 5 is a graph showing distributions of impurity concentrations in the semiconductor device according to the first embodiment of the invention, and more specifically shows the impurity concentration distributions in p-well 42 and semiconductor substrate 1 on a section taken along line D—D in FIG. 1. The impurity concentration distributions in this portion are the same as those shown in FIG. 4 except for that n-well 32 is not formed.

Figure 6:
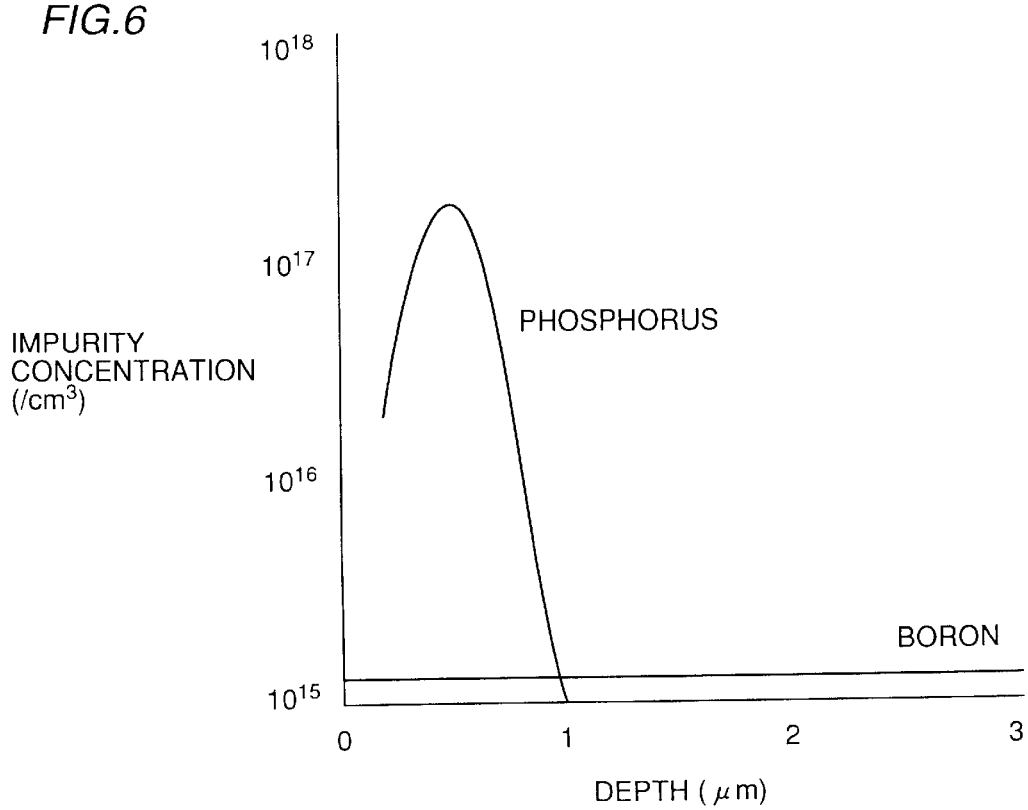

FIG. 6 is a graph showing distributions of impurity concentrations in the semiconductor device according to the first embodiment of the invention, and more specifically shows the impurity concentration distributions in n-well 34 and semiconductor substrate 1 on a section taken along line E—E in FIG. 1. Referring to FIG. 6, the impurity concentration distributions in this portion are the same as those shown in FIG. 3 except for that n-well 32 is not formed.

Figure 7:
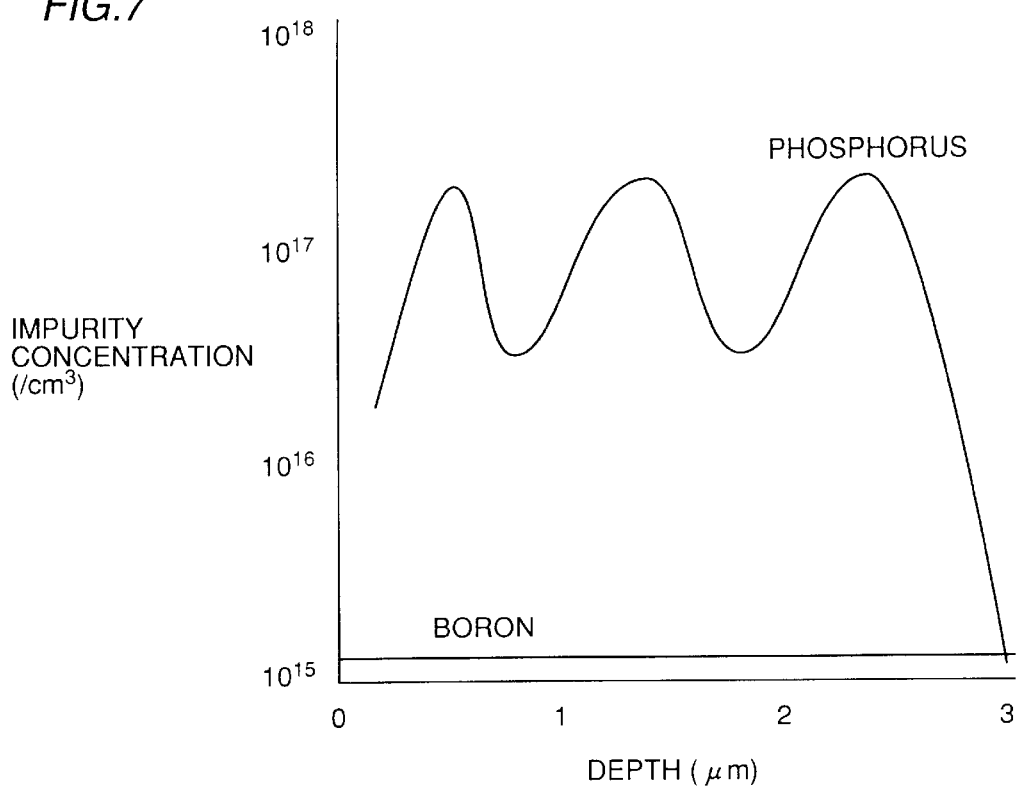

FIG. 7 is a graph showing distributions of impurity concentrations in the semiconductor device according to the first embodiment of the invention, and more specifically shows the impurity concentration distributions in n-wells 35 and 31 and semiconductor substrate 1 on a section taken along line F—F in FIG. 1. Referring to FIG. 7, n-well 31 contains an impurity such as phosphorus at about $1 \times 10^{17} - 1 \times 10^{19}/cm^3$, and the peak of the impurity concentration thereof is located at a depth of about 2–2.5 μm from the surface of the semiconductor substrate. n-well 35 contains an impurity such as phosphorus at about $1 \times 10^{17} - 1 \times 10^{19}/cm^3$, and the peaks of the impurity concentration are located at a depth of about 1–1.5 μm and a depth of about 0.5–0.8 μm from the surface of the semiconductor substrate.

Figure 8:
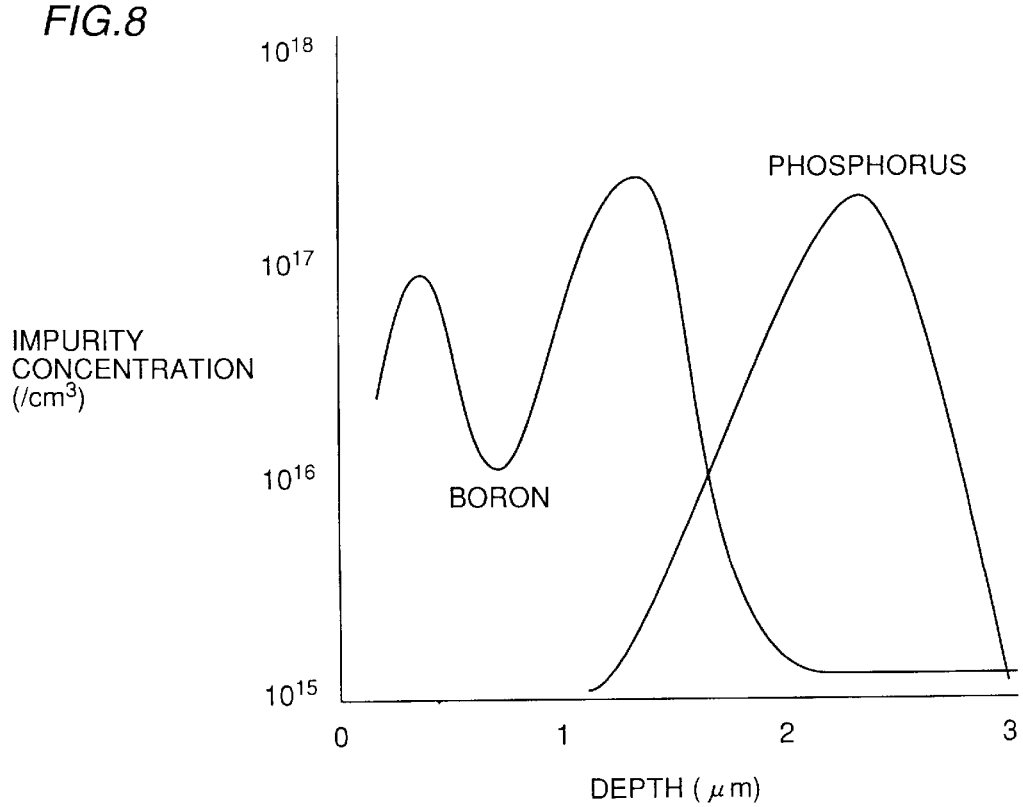

FIG. 8 is a graph showing distributions of impurity concentrations in the semiconductor device according to the first embodiment of the invention, and more specifically shows the impurity concentration distributions in n-well 31, p-well 43 and semiconductor substrate 1 on a section taken along line G—G in FIG. 1. Referring to FIG. 8, n-well 31 contains an impurity such as phosphorus at about $1 \times 10^{17} - 1 \times 10^{19}/cm^3$, and the peak of the impurity concentration thereof is located at a depth of about 2–2.5 μm from the surface of the semiconductor substrate. p-well 43 contains an impurity such as boron at about $1 \times 10^{17} - 1 \times 10^{19}/cm^3$, and the peak of the impurity concentration thereof is located at a depth of about 1–1.5 μm from the surface of the semiconductor substrate. Further, FIG. 8 shows the impurity concentration distribution in a channel stop layer (not shown in FIG. 1), which contains an impurity such as boron at about $1 \times 10^{17} - 1 \times 10^{19}/cm^3$ and has the impurity concentration peak at a depth of about 0.2–0.5 μm from the semiconductor substrate surface.

Figure 9:
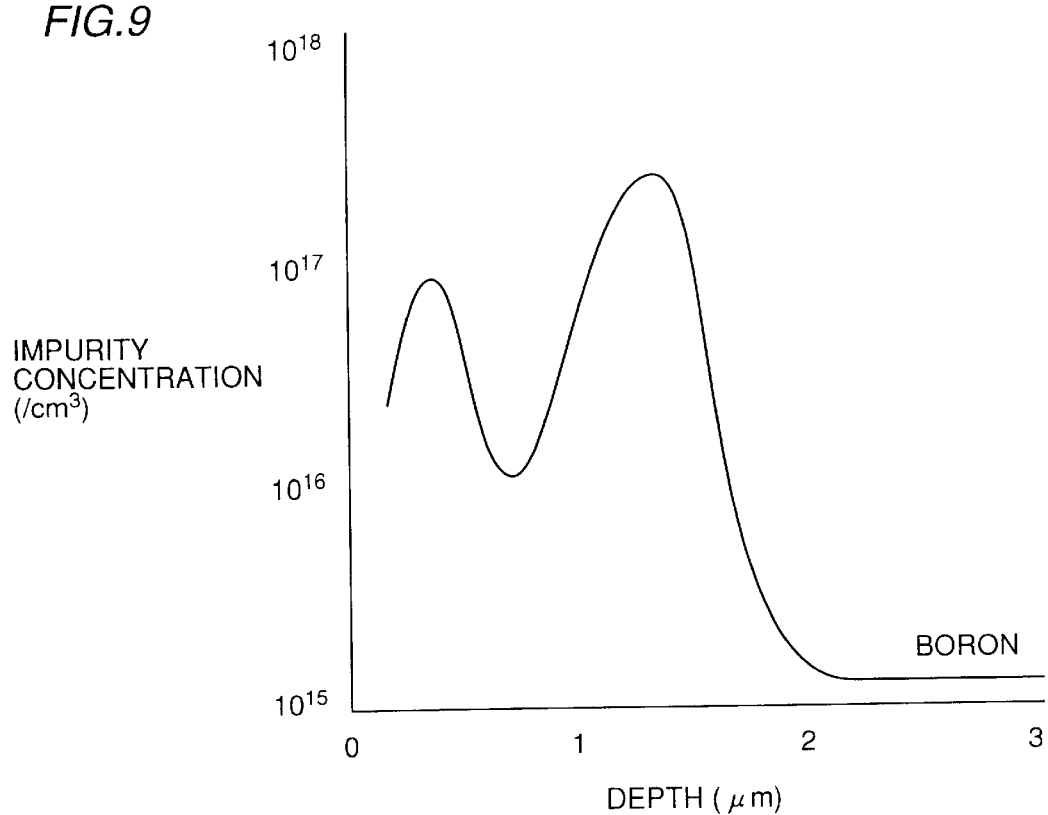

FIG. 9 is a graph showing distributions of impurity concentrations in the semiconductor device according to the first embodiment of the invention, and more specifically shows the impurity concentration distributions in p-well 44 and semiconductor substrate 1 on a section taken along line H—H in FIG. 1. Referring to FIG. 9, the impurity concentration distributions in this portion are the same as those shown in FIG. 8 except for that n-well 31 is not formed.

Figure 10:
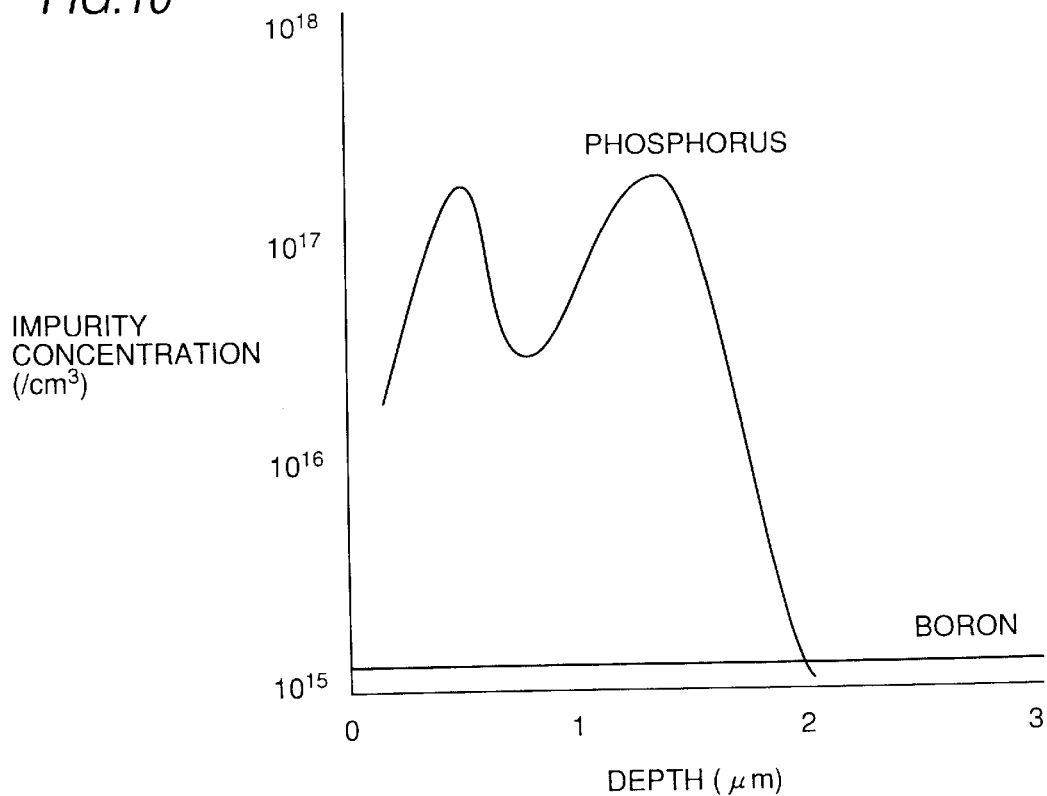

FIG. 10 is a graph showing distributions of impurity concentrations in the semiconductor device according to the first embodiment of the invention, and more specifically shows the impurity concentration distributions in n-well 36 and semiconductor substrate 1 on a section taken along line I—I in FIG. 1. Referring to FIG. 10, the impurity concentration distributions in this portion are the same as those shown in FIG. 7 except for that n-well 31 is not formed.

Although the impurity concentration distributions have been described by way of example, it is natural that the impurity concentration and the depth of the position of the impurity concentration peak are variable according to conditions required in the transistors and design rules of well isolation.

Figure 11:
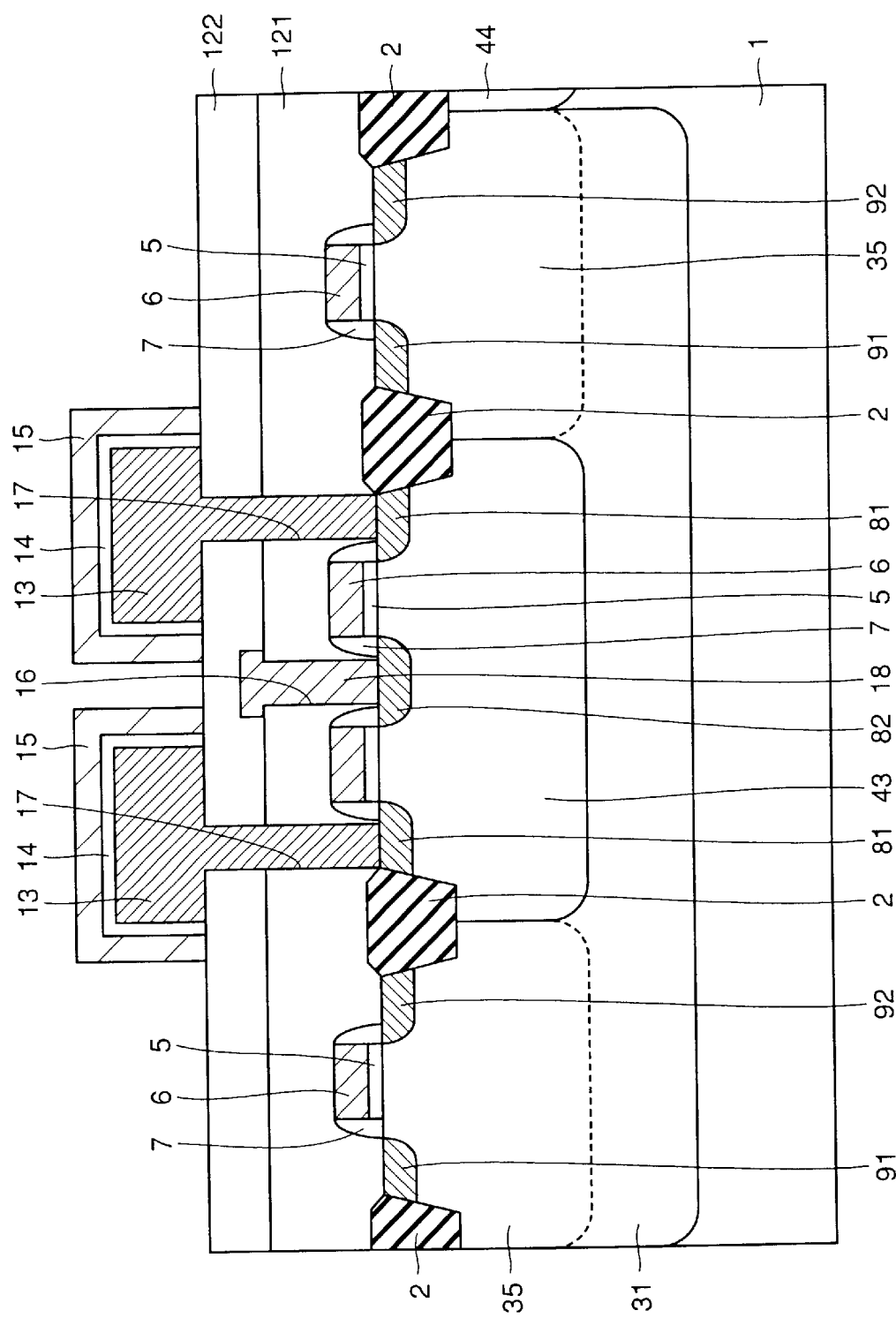
FIGS. 11–13 are cross sections showing the semiconductor device according to the first embodiment of the invention, respectively.

FIG. 11 is a cross section of the semiconductor device according to the first embodiment of the invention, and shows, on an enlarged scale, the memory cell region in the section of the semiconductor device shown in FIG.

Referring to FIG. 11, a transistor of a DRAM memory cell serving as 1.

Referring to FIG. 11, a transistor of a DRAM memory cell serving as a first field-effect element has a gate length $L_1$ of about 200 nm. In this case, isolating and insulating film 2 has a width which is variable depending on the position, and more specifically has a minimum isolating width of 100 nm–200 nm and a width of about 200 nm–400 nm in the other positions. Isolating and insulating film 2 has a thickness of about 150–500 nm.

A gate oxide film 5 having a thickness of about 5–10 nm is formed on the surface of semiconductor substrate 1 provided with p-well 43, and a polycrystalline silicon layer and a gate electrode 6 are formed on gate oxide film 5. This polycrystalline silicon layer has a thickness of about 150–250 nm, and contains an n-type impurity such as phosphorus or arsenic at a concentration of about $2-15 \times 10^{20}/cm^3$. Gate electrode 6 has a thickness of about 40–60 nm, and is made of a layer of metal (silicide) such as tungsten silicide.

Source/drain regions 81 and 82 contain an impurity such as phosphorus or arsenic at about $1 \times 10^{15}/cm^3$. An interconnection 18 is connected to source/drain region 82 through a contact hole 16 formed in an interlayer insulating film 121, which is made of, e.g., a TEOS (Tetraethyl Orthosilicate) oxide film. Further, a capacitor is connected to source/drain region 81 through a contact hole 17 formed in an interlayer insulating film 122 made of, e.g., a TEOS oxide film. The capacitor is formed of a storage node 13 made of polycrystalline silicon which contains phosphorus at about $1-5 \times 10^{20}/cm^3$, a capacitor insulating film 14 which has a thickness of about 5–10 nm and is made of a silicon nitride-oxide film, and a cell plate 15 made of polycrystalline silicon which contains phosphorus at about $1-5 \times 10^{20}/cm^3$. Storage node 13 is connected to source/drain region 81 via contact hole 17. Although the capacitor shown in the figure is of a stack type, it may be of another type such as a trench type.

Gate oxide film 5 having a thickness of about 5–10 nm is formed on the surface of semiconductor substrate 1 provided with n-well 35. A polycrystalline silicon layer and gate electrode 6 are formed on gate oxide film 5. This polycrystalline silicon layer has a thickness of about 150–250 nm, and contains a p-type impurity such as boron at about $2-15 \times 10^{20}/cm^3$. The gate electrode 6 has a thickness of about 40–60 nm, and is formed of a layer of metal (silicide) such as tungsten silicide. The polycrystalline silicon layer may contain an n-type impurity such as phosphorus or arsenic, in which case the channel region is doped with an impurity for optimizing the threshold voltage. The gate electrode 6 may not include the metal (silicide) layer, and may be formed of only the polycrystalline silicon layer. In some cases, polycrystalline silicon layer in the NMOS transistor contains an n-type impurity, and the polycrystalline silicon layer in the PMOS transistor contains a p-type impurity so that a dual gate structure is employed.

Source/drain regions 91 and 92 contain an impurity such as boron at $1 \times 10^{18}/cm^3$.

In the figures showing the foregoing structure, only one p-well 43 is formed in the region surrounded by n-wells 35 and 31. However, transistors of the memory cells provided with such capacitors are generally formed in an array form.

In the figure, only one pMOS transistor is formed in each n-well 35. However, a plurality of pMOS transistors may be formed in n-well 35, or no transistor may be formed in n-well 35. In the case where the plurality of pMOS transistors are formed, each transistor is generally isolated by an isolating and insulating film from the others, but the plurality of transistors may be formed in a single active region.

The transistors in the peripheral region have the substantially same structures as the transistors in the memory cell region except for that n-well well 31 is not formed.

Figure 12:
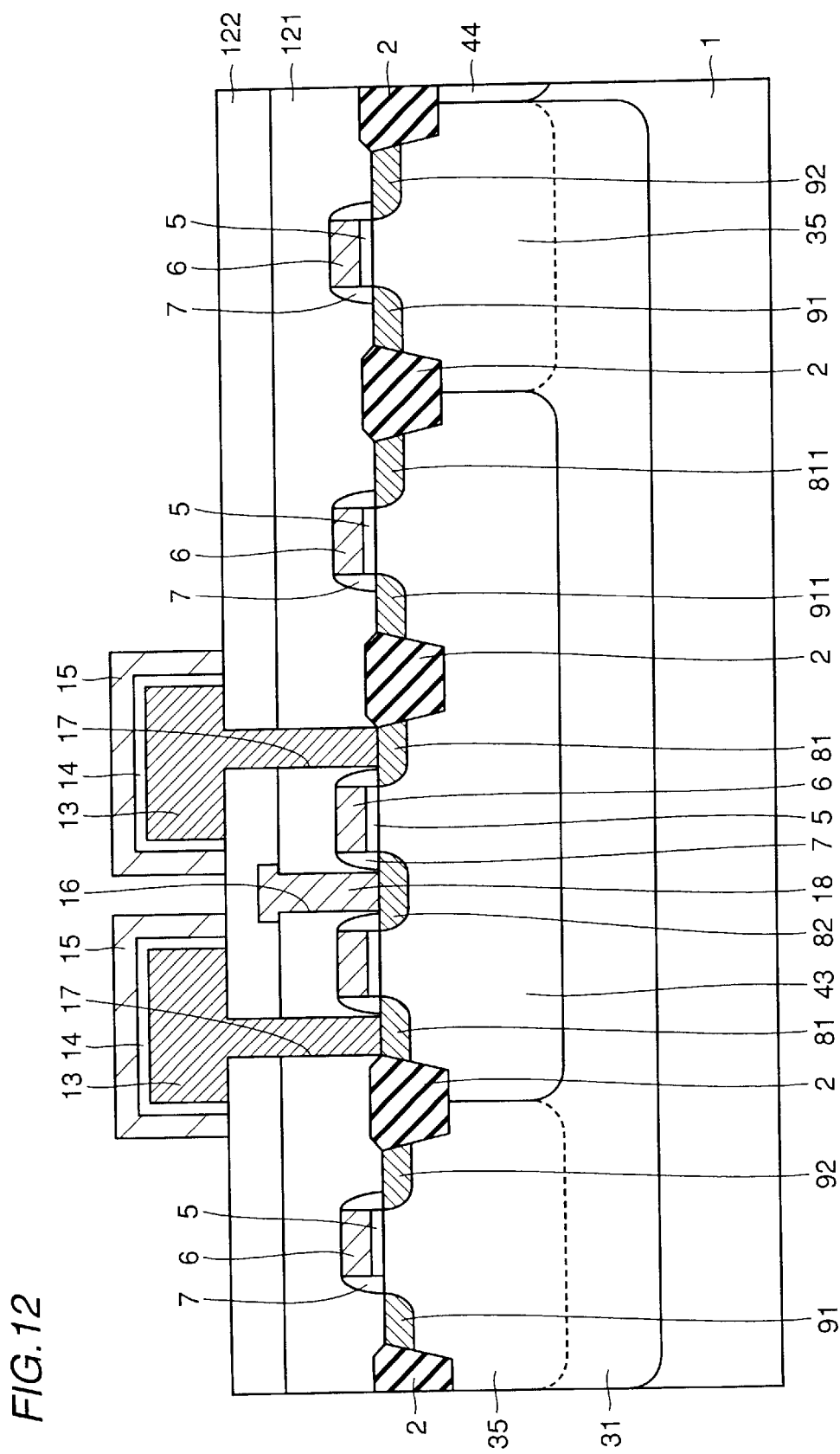

FIG. 12 is a cross section of a semiconductor device according to the first embodiment of the invention, and shows, on an enlarged scale, the memory cell region of the semiconductor device in the cross section of FIG. 1. In FIG. 12, 811 and 911 indicate source/drain regions, respectively. In addition to the transistors of the memory cell, a transistor having source/drain regions 811 and 911 for another purpose may be formed in p-well 43 as shown in FIG. 12.

Figure 13:
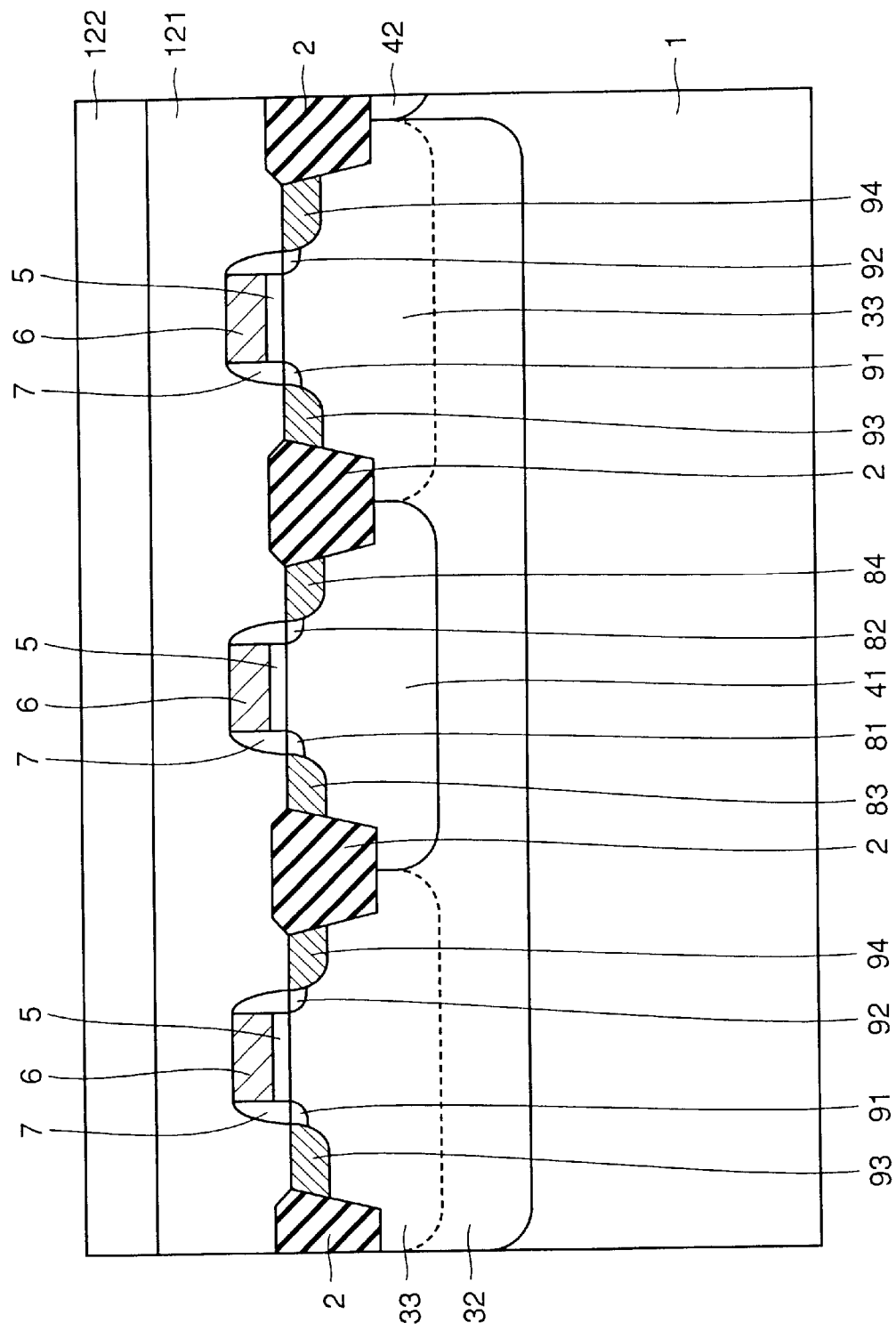

FIG. 13 is a cross section of the semiconductor device according to the first embodiment of the invention, and more specifically, shows on an enlarged scale a portion provided with p-well 32 within the logic circuit region of the semiconductor device shown in the cross section of FIG. 1.

The transistor serving as a second field-effect element in the logic circuit region has a gate length $L_2$ of about 200 nm. In this case, isolating and insulating film 2 in the logic circuit region has a width of about 200–500 nm and a thickness of about 150–500 nm. However, isolating and insulating film 2 may locally have a width of about 5000 nm. In this case, the width of isolating and insulating film 2 is adjusted, for example, by leaving semiconductor substrate 1 (a dummy pattern) in a portion, which is not to be used for forming the element, so that irregularities (i.e., concavities and convexities) may be suppressed on the surfaces of semiconductor substrate 1 and isolating and insulating film 2.

Source/drain regions 83 and 84 contain an impurity such as phosphorus or arsenic at about $1\times10^{20}/cm^3$, and cooperate with source/drain regions 81 and 82, which contain an impurity such as phosphorus or arsenic at $1\times10^{18}/cm^3$, to form LDD (Lightly Doped Drain) structures. Source/drain regions 93 and 94 contain an impurity such as boron or boron fluoride at about $1\times10^{20}/cm^3$, and cooperate with source/drain regions 91 and 92, which contain an impurity such as boron or boron fluoride at $1\times10^{18}/cm^3$, to form LDD (Lightly Doped Drain) structures. The LDD structure is employed when necessary, and source/drain regions 81, 82, 91 and 92 are not formed in some cases.

Gate oxide film 5 in the logic circuit region may have a thickness similar to that of the gate oxide film in the DRAM memory cell, but is desirably in a range from about 4–7 nm because the smaller thickness can provide a faster transistor, in which a sufficient ON current can flow and a drive capacity is high. Gate electrode 6 and a sidewall insulating film 7 in the logic circuit region have structures similar to those of the DRAM memory cell.

Although not shown, the structure is also provided with an interconnections connected to source/drain region 91 or 92 through a contact hole formed in interlayer insulating films 121 and 122.

Although the embodiment employs the interconnections which have been described by way of example, the number and arrangement of the interlayer insulating films formed between the transistors are changed depending on the circuit structure.

In the foregoing description, only one p-well 41 is formed in the region surrounded by n-wells 32 and 33 as shown in the figure. However, two or more p-wells 41 may be formed in the above region, and two or more n-wells 33 may likewise be formed. Although one transistor is formed in each of n-well 41 and p-well 33, two or more transistors may be formed in each of them. A transistor may not be formed in p-well 33. In the structure provided with the plurality of transistors, each transistor is generally isolated from the others by the isolating and insulating film, but the plurality of transistors may be formed in a single active region.

The transistors (not shown) formed in n- and p-wells 34 and 42 in the logic circuit region have structures similar to that of the transistor in the region provided with n-well 32 and the arrangement and the number of p- and n-wells 42 and 34, the number of transistors formed in the well and others change depending on the circuit arrangement.

The arrangement of the logic circuit region, memory cell region and peripheral circuit region have been described by way of example, and are not restricted to the foregoing arrangement.

Gate electrode 6 may be made of only metal such as copper, may be formed of only polycrystalline silicon containing an impurity, and may selectively have various structures.

In the logic circuit region, memory cell region and peripheral circuit region, impurity regions (not shown) or the like are formed for preventing punch-through between the elements, if necessary.

Operations will now be described. In the DRAM memory cell, information is stored by means of electric charges accumulated in a capacitor, and refresh (read/write) is performed at constant intervals. When a junction leak current flows through the element connected to the capacitor, information stored in the capacitor is excessively lost, and refresh characteristics (data holding characteristics) are deteriorated. Therefore, compared with transistors in the other portions, it is further important to suppress the leak current.

For writing data into the capacitor, a voltage VG of 3.6 V and a voltage VB of −1.0 V are applied to the respective electrodes of the memory cell, a voltage of 0 V is applied to interconnection 18 (bit line) connected to source/drain region 82, and a voltage of 1.0 V is applied to cell plate 15. For erasing data, voltage VG of 3.6 V and voltage VB of −1.0 V are applied, a voltage of 2.0 V is applied to interconnection 18 connected to source/drain region 82, and a voltage of about 1.0 V is applied to cell plate 15. For reading the data, the voltage applied to the bit line is set to about 1.0 V. These values of voltages are merely examples, and are variable depending on the thickness of the gate oxide film and the gate length.

In the logic circuit, voltages are applied to gate electrode 6, source/drain regions 81–84 and 91–94, and semiconductor substrate 1 (n-wells 32–34 and p-wells 41 and 42), whereby a channel is formed at the surface of semiconductor substrate 1 under gate electrode 6. Thereby, one of paired regions 81 and 83 (91 and 93) and one of paired regions 82 and 84 (92 and 94) form the sources, respectively, and the others form the drains, respectively, so that the structure operates as a circuit. For example, in the case of NMOS transistor, VG of about 2.5 V, VD of about 2.5 V, VS of about 0 V and VB of about 0 V are applied to the respective electrodes in the logic circuit. In the case of pMOS transistor, VG of about 0 V, VD of about 0 V, VS of about 2.5 V and VB of about 2.5 V are applied to the respective electrodes in the logic circuit. These values of voltages are merely examples, and are variable depending on the thickness of the gate oxide film and the gate length.

As described above, the transistors formed in the logic circuit region are connected to the transistors in the memory cell region and peripheral region for controlling the circuit operations.

According to the semiconductor device of the first embodiment, even in the case where the depth of well is reduced in accordance with reduction in isolation width and well width due to miniaturization of the semiconductor integrated circuit, it is possible to suppress deterioration of element characteristics such as increase in leak current at the pn junction between the semiconductor substrate (well) and the source/drain region in a portion provided with the capacitor within the memory cell region, and the refresh characteristics can be improved.

The transistor in DRAM memory cell region is formed in the deep p-well, which is surrounded by the bottom n-well. Thereby, the potential can be set independently of the substrate, and soft error is suppressed.

In the logic circuit region, since the well is formed in a shallow position, the circuit can be miniaturized, and the potential on the triple well can be independently set so that even the logic circuit provided with the transistors having various functions can achieve various required performances, and can have multiple functions.

A method of manufacturing the semiconductor device according to the first embodiment of the invention will now be described below.

Figure 14:
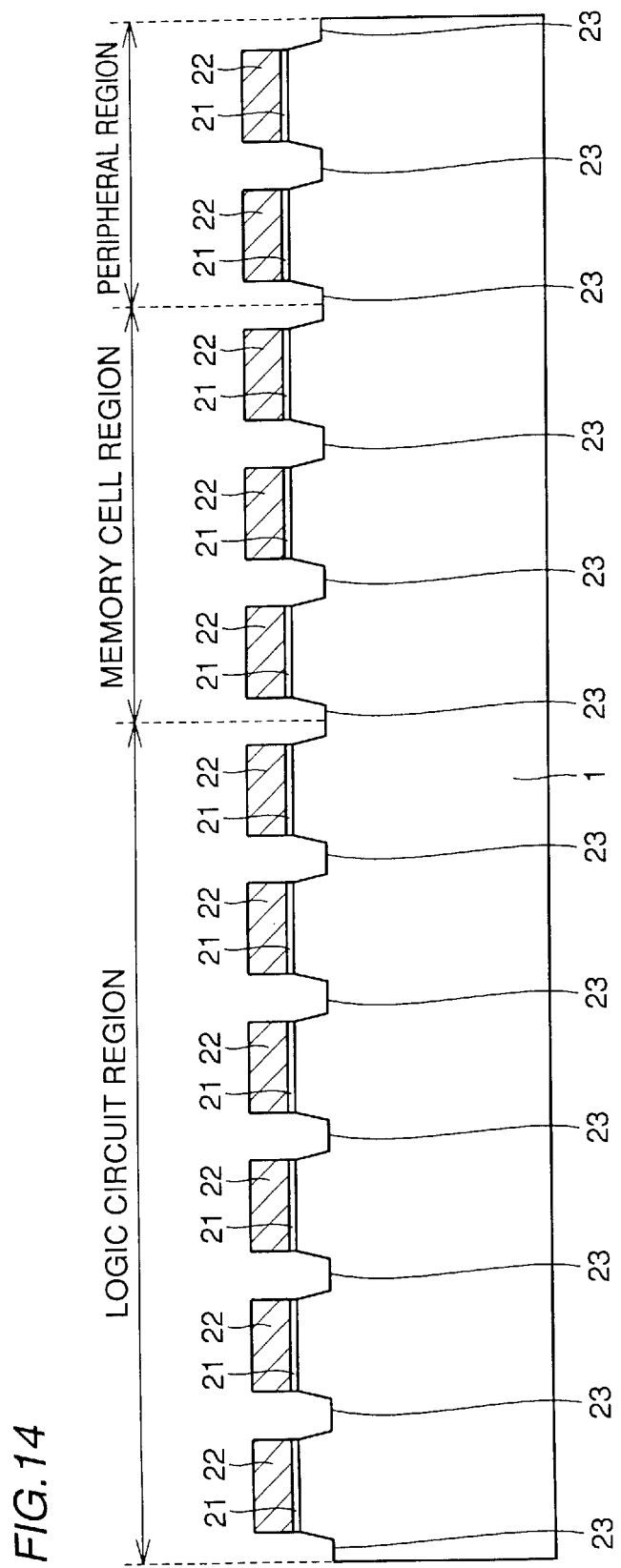
FIGS. 14–20 are cross sections showing steps in a method of manufacturing the semiconductor device according to the first embodiment of the invention, respectively.

FIGS. 14–20 are cross sections showing steps in the method of manufacturing the semiconductor device according to the first embodiment, respectively. In FIG. 14, 21 indicates a silicon oxide film, 22 indicates a silicon nitride film and 23 indicates a groove. Referring to FIG. 14, silicon oxide film 21 having a thickness of about 5–30 nm as well as silicon nitride film 22 having a thickness of about 100–300 nm are formed on the surface of semiconductor substrate 1, and anisotropic etching is effected on silicon nitride film 22 and silicon oxide film 21, which are located on the isolation region, to remove them selectively, using a photoresist mask (not shown). After removing the photoresist mask, anisotropic etching is effected on semiconductor substrate 1 masked with silicon nitride film 22 so that grooves 23 each having a width of about 200–500 nm and a depth of about 150–500 nm are formed at the surface of semiconductor substrate 1. FIG. 14 shows a sectional structure of the elements of the semiconductor device after completion of the foregoing step.

Figure 15:
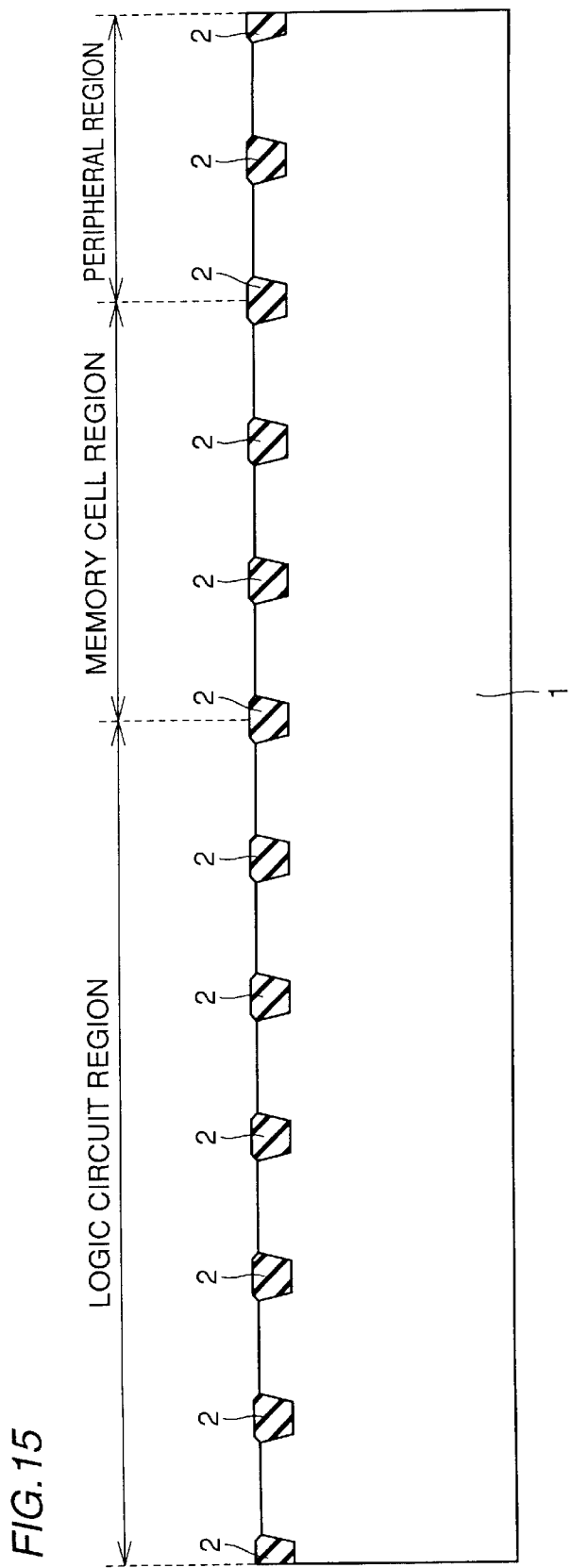

Then, a low-pressure CVD method is executed to form an insulating film, which is formed of, e.g., a silicon oxide film of about 300–800 nm in thickness and is not shown, on the whole surface, and then a CMP (Chemical Mechanical Polishing) method using silicon nitride film 22 as a stop is executed to remove the silicon oxide film on the surface of silicon nitride film 22 so that the silicon oxide film is left only within grooves 23 and openings in silicon nitride film 22. Thereafter, wet etching is effected with hot phosphoric acid to remove silicon nitride film 22, and then silicon oxide film 21 is removed so that isolating and insulating film 2 is formed. FIG. 15 shows a sectional structure of the elements of the semiconductor device after completion of the foregoing step.

Figure 16:
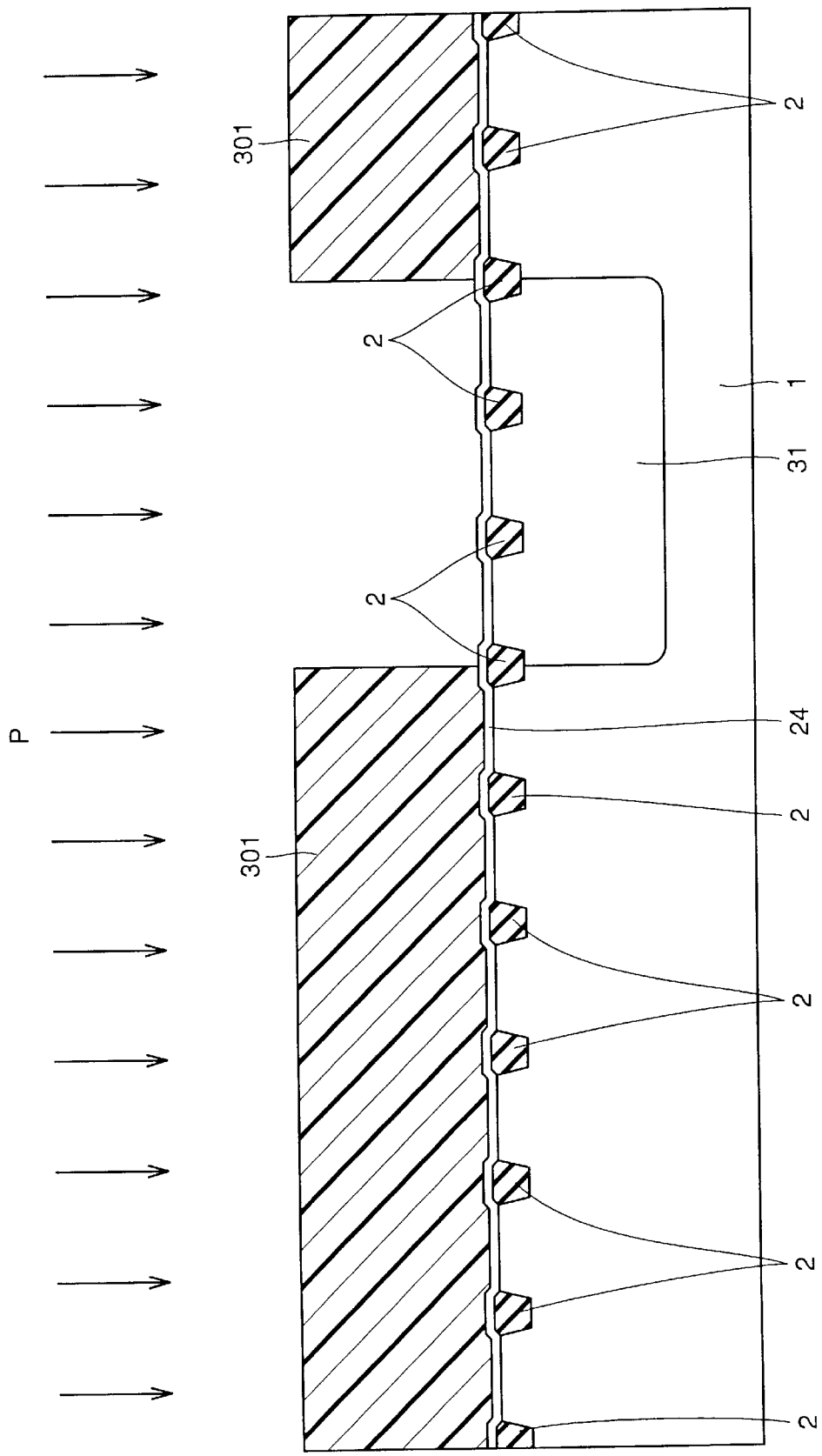

Referring to FIG. 16, thermal oxidation is effected on the surface of semiconductor substrate 1 to form a silicon oxide film 24 having a thickness of about 10 nm. A photoresist mask 301 having an opening located above the surface of the memory cell region is formed, and high-energy implantation of the n-type impurity such as phosphorus is effected on the whole surface to form n-well 31 under the conditions of about 2–10 MeV and $1 \times 10^{12}$–$1 \times 10^{14}$/cm$^2$. FIG. 16 shows a sectional structure of the elements of the semiconductor device after completion of the foregoing step. Thereafter, photoresist mask 301 is removed.

Figure 17:
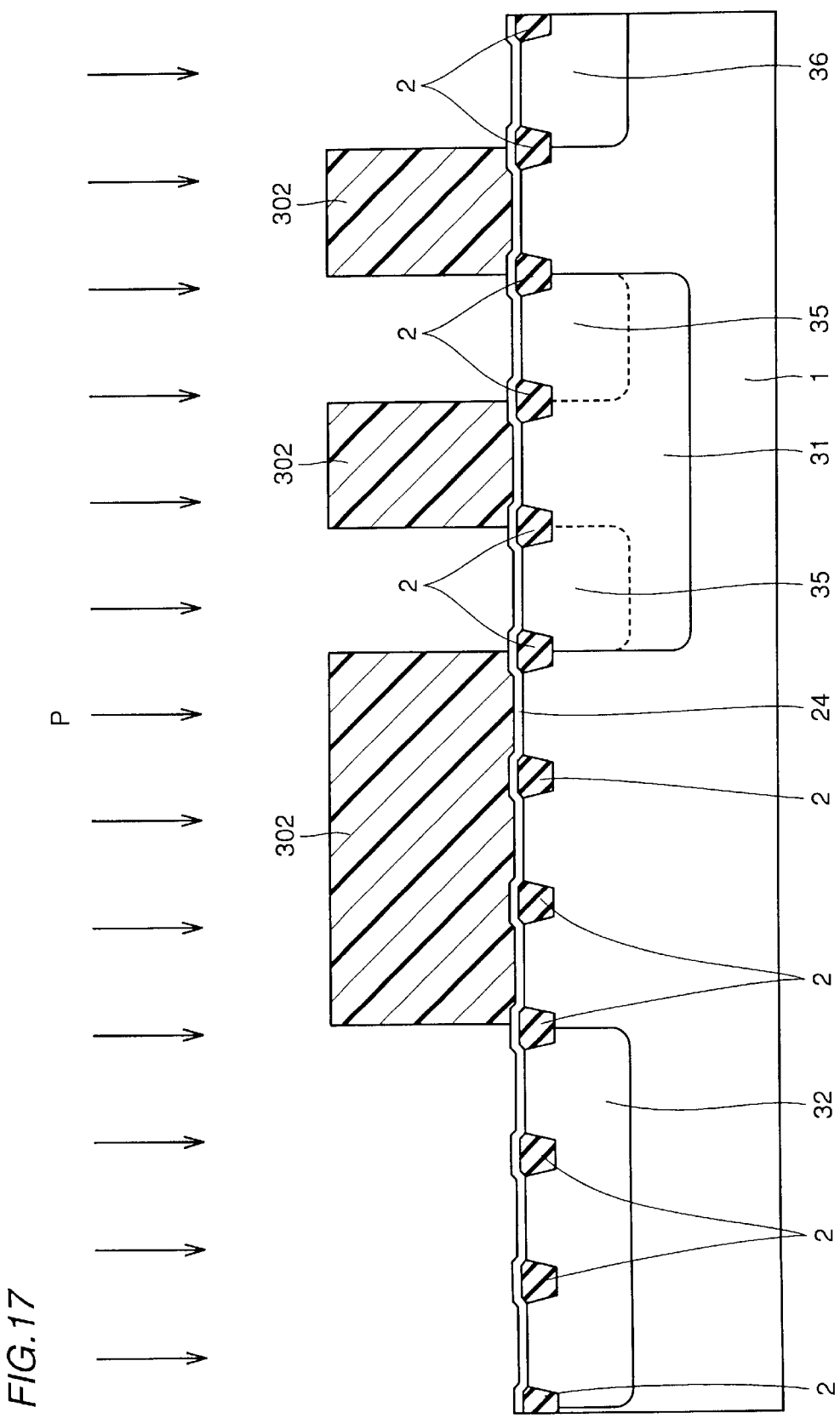

In FIG. 17, a photoresist mask 302 is formed. Photoresist mask 302 has an opening located above the surfaces of the portions, which will form the triple well structures of the n-well formation region in the memory cell region, the n-well formation region in the peripheral region and the logic circuit region. High-energy implantation of the n-type impurity such as phosphorus is effected on the whole surface masked with photoresist mask 302 under the conditions of about 500 KeV–3 MeV and about $1 \times 10^{12}$–$1 \times 10^{14}$/cm$^2$. Thereby, n-wells 35 and 36 are partially formed, and n-well 32 is formed. FIG. 17 shows a sectional structure of the elements of the semiconductor device after completion of the above step. Thereafter, photoresist mask 302 is removed.

Figure 18:
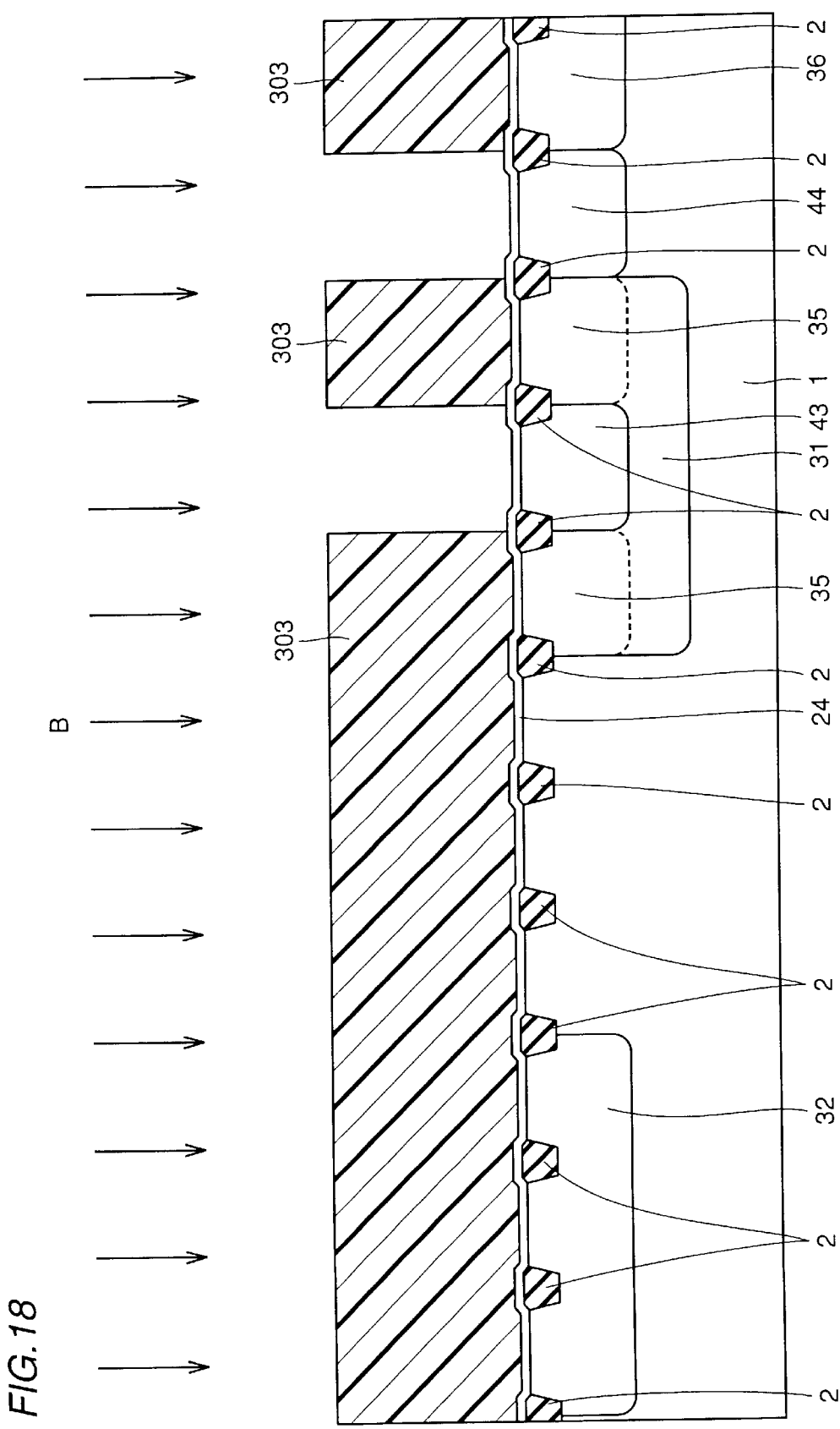

Referring to FIG. 18, a photoresist mask 303 is formed. Photoresist mask 303 has an opening located above the surfaces of the p-well formation region in the memory cell region and the p-well formation region in the peripheral region. High-energy implantation of a p-type impurity such as boron is effected on the whole surface masked with photoresist mask 303 under the conditions of about 300 KeV–1.5 MeV and about $1 \times 10^{12}$–$1 \times 10^{14}$/cm$^2$. Thereby, p-wells 43 and 44 are formed. FIG. 18 shows a sectional structure of the elements of the semiconductor device after completion of the above step. Thereafter, photoresist mask 303 is removed.

Figure 19:
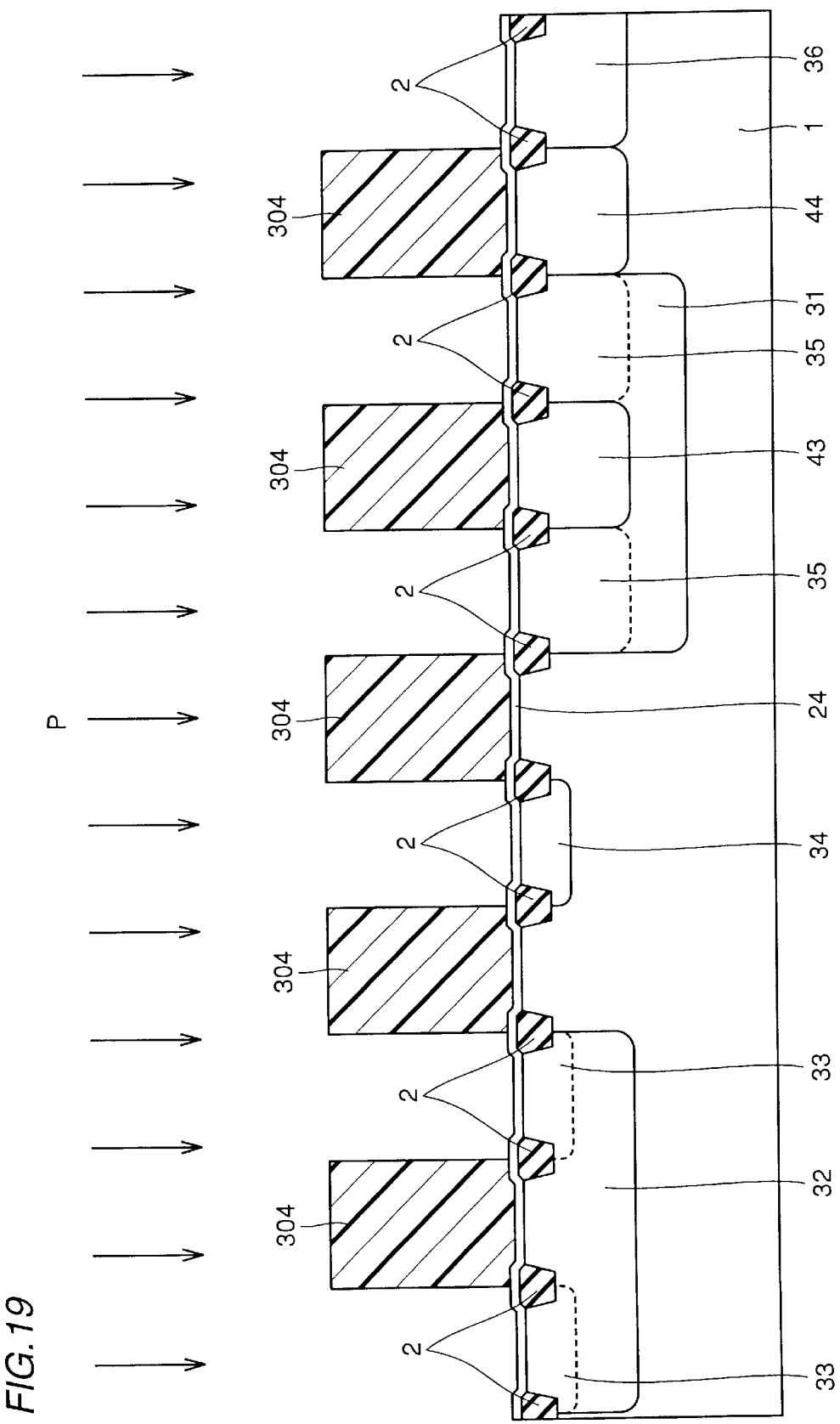

Referring to FIG. 19, a photoresist mask 304 is formed. Photoresist mask 304 has an opening located above the surfaces of n-well formation regions in all the memory cell region, the peripheral region and the logic circuit region. High-energy implantation of the n-type impurity such as phosphorus is effected on the whole surface masked with photoresist mask 304 under the conditions of about 200 KeV–2 MeV and about $1 \times 10^{12}$–$1 \times 10^{14}$/cm$^2$. Thereby, n-wells 35 and 36 are partially formed, and n-wells 33 and 34 are formed. FIG. 19 shows a sectional structure of the elements of the semiconductor device after completion of the above step. Thereafter, photoresist mask 304 is removed.

Figure 20:
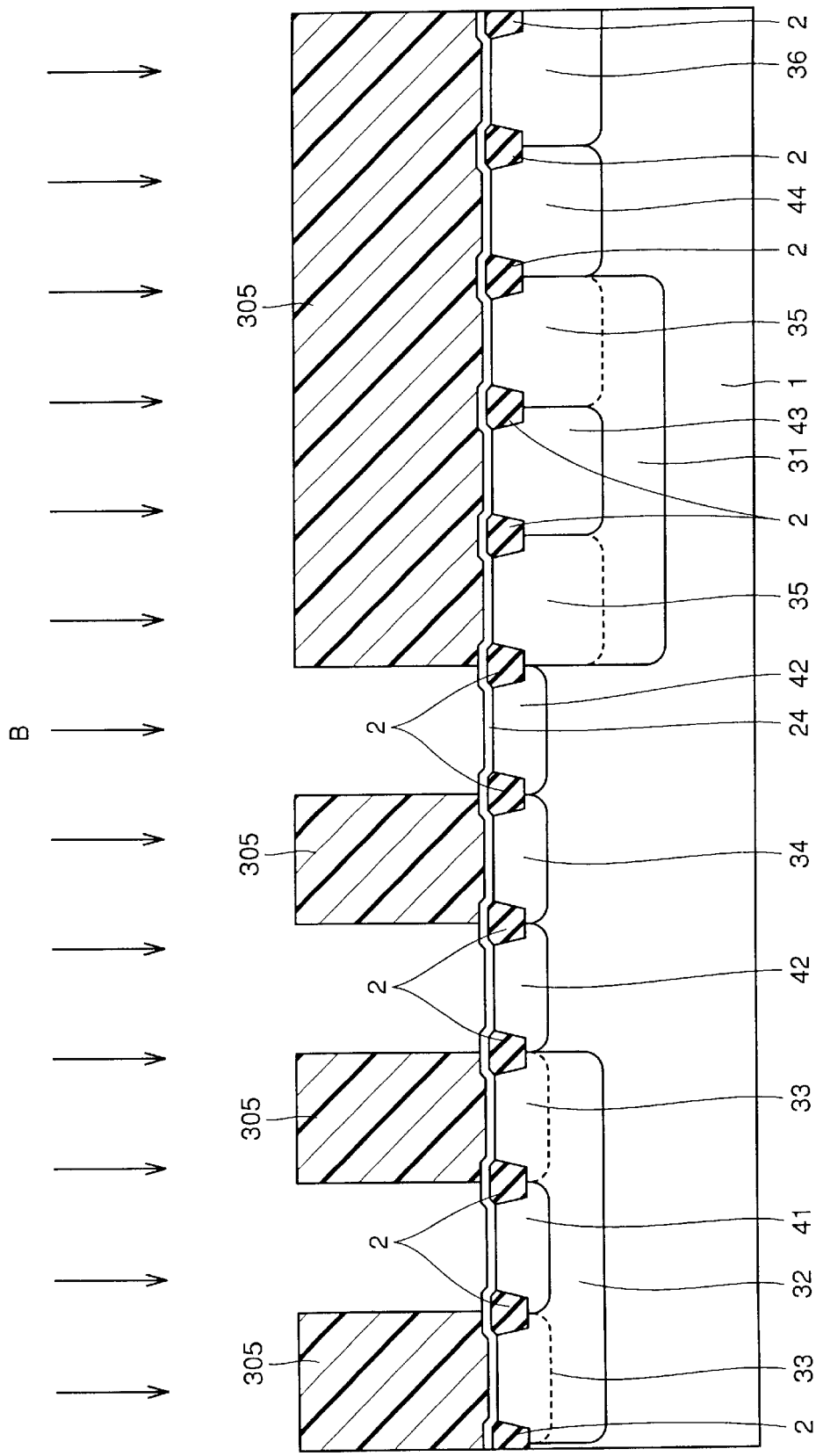

Referring to FIG. 20, a photoresist mask 305 is formed. Photoresist mask 305 has an opening located above the surfaces of all the p-well formation regions in the logic circuit region. High-energy implantation of a p-type impurity such as boron is effected on the whole surface masked with photoresist mask 305 under the conditions of about 150 KeV–1 MeV and about $1 \times 10^{12}$–$1 \times 10^{14}$/cm$^2$. Thereby, p-wells 41 and 42 are formed. FIG. 20 shows a sectional structure of the elements of the semiconductor device after completion of the above step. Thereafter, photoresist mask 305 is removed.

Photoresist masks are formed, if necessary, and ion implantation is performed to form the punch-through stop layer and the channel implantation layer. Even if these impurity layers are employed for the transistors in different regions among the logic circuit region, memory cell region and peripheral region, these impurity layers can be formed simultaneously if conditions such as impurity concentration distributions are the same. The respective wells can be formed in any order.

Thereafter, silicon oxide film 24 is removed. Silicon oxide film 24 is provided for protecting the surface of semiconductor substrate 1 from damages by various kinds of ion implantation for well formation and others as well as contamination by the photoresist.

A silicon oxide film or the like of about 5–10 nm in thickness is then formed as gate insulating film 5 by thermal oxidation on the whole surface of semiconductor substrate 1. In the case where the thickness of gate oxide film 5 in the logic circuit region is to be smaller than those in the other regions, the silicon oxide film is removed from the logic circuit region after forming the silicon oxide film of about 4–7 nm in thickness on the whole surface by the thermal oxidation, and thereafter a silicon oxide film of about 3–7 nm in thickness is formed to provide gate insulating film 5.

A polycrystalline silicon layer which contains an n-type impurity such as phosphorus at about $1 \times 10^{20}$–$5 \times 10^{20}$/cm$^3$ and has a thickness of about 150–250 nm is formed on the whole surface by a LPCVD (Low-Pressure CVD) method, and then is patterned to form gate electrode 6. For providing the gate electrode of a double layer structure including a polycrystalline silicon layer and a metal (silicide) layer, such a manner is employed that a metal (silicide) layer such as a tungsten silicide layer of about 40–60 nm in thickness is formed after forming a polycrystalline silicon layer which has a thickness of about 150–250 nm and contains an n-type impurity such as phosphorus at about $2$–$15 \times 10^{20}$/cm$^3$, and these layers are patterned. The impurity contained in the gate electrode may be a p-type impurity such as boron.

The gate electrode of nMOS transistor may contain an n-type impurity, and the gate electrode of pMOS transistor may contain a p-type impurity. For preparing this dual gate structure, a polycrystalline silicon layer not containing an impurity is formed on the whole surface after forming gate insulating film 5, and then n- and p-type impurities are ion-implanted into the NMOS and pMOS regions, respectively, which are appropriately masked.

Thereafter, a photoresist mask (not shown) covering the nMOS region is formed, and a p-type impurity such as boron is implanted into the whole surface with about 40 KeV and about $1 \times 10^{14}$/cm$^2$ so that source/drain regions 91 and 92 are formed.

A photoresist mask (not shown) covering the pMOS region is formed, and an n-type impurity such as phosphorus or arsenic is ion-implanted into the whole surface with about 40 KeV and $1 \times 10^{14}$/cm$^2$ so that source/drain regions 81 and 82 are formed.

In the above method, processing for forming the source/drain regions in the PMOS region is performed independently of the processing for the nMOS region. This independent processing is performed not only in the above case where the difference in conductivity type is present but also in the case where a difference is present in concentration, concentration distribution or the like, using the masks for achieving the required conditions. The implantation conditions varies depending on whether the drain region has the LDD structure or not, and the ion implantation for the nMOS region and that for the pMOS region may be performed in the order opposite to the above.

The CVD method is then executed to form an insulating film such as a silicon oxide film of about 30–100 nm in thickness on the whole surface, and etch-back is performed to form side wall insulating film 7. For preparing the source/drain regions having the LDD structure, a p-type impurity such as boron and an n-type impurity such as phosphorus or arsenic are implanted into the pMOS region and the nMOS region with about 100 KeV and about $1 \times 10^{15}$/cm$^2$, respectively, so that source/drain regions 83, 84, 93 and 94 are formed.

A sidewall 10 may be a layered film formed of a silicon oxide film and a silicon nitride film. In this case, the silicon nitride film is deposited by the CVD method after forming the silicon oxide film by RTO (Rapid Thermal Oxidation), and then etch-back is performed to complete sidewall 10.

The ion implantation may be effected on the nMOS and PMOS regions in the opposite order.

In the case where a metal silicide layer is to be formed on the surfaces of gate electrode 6 and source/drain regions 81–84 and 91–94 in the logic circuit region, a cobalt may be deposited on the structure which is in the above stage, and RTA (Rapid Thermal Anneal) processing is effected so that reaction occurs to form a metal silicide layer in the portion where silicon is exposed. Thereafter, the cobalt which remains without causing reaction is removed, although not shown.

By the low-pressure CVD method, the silicon oxide film which will form interlayer insulating film 121 of about 200–600 nm in thickness is deposited, and then a contact hole 16, which has a diameter of about 0.1 µm–0.5 µm and reaches source/drain region 82 in memory cell region, is formed by the dry etching method. After filling contact hole 16 with an interconnection material by the CVD method, patterning is performed to form interconnection 18. Likewise, interlayer insulating film 122 is formed, contact hole 17 reaching source/drain region 81 in the memory cell region is formed, and a capacitor connected through contact hole 17 is formed. Also, interconnections connected to source/drain regions in regions other than the memory cell region are formed in a similar manner.

The connection structure between the contact holes and the interconnections can be changed according to the circuit arrangement, and the order in which these portions are formed can also be changed. Further, an interconnection may be formed at a higher level of the structure with another interlayer insulating film therebetween so that the multi-layer interconnections may be employed. The material of the interconnection may be polycrystalline silicon doped with an impurity or metal. In the case where the metal is used, barrier metal such a TiN is formed on the inner wall of each contact hole for preventing diffusion of the metal into the source/drain regions.

In this manner, the semiconductor device including the transistors in the memory cell region shown in FIG. 11 as well as the transistors in the logic circuit region shown in FIG. 13 is formed.

According to the method of manufacturing the semiconductor device of the first embodiment of the invention, even in the case where the depth of well is reduced in accordance with reduction in isolation width and well width due to miniaturization of the semiconductor integrated circuit, the well in the memory cell region can be formed at a large depth. Accordingly, it is possible to suppress deterioration of element characteristics such as increase in leak current at the pn junction between the semiconductor substrate (well) and the source/drain region, and the refresh characteristics can be improved.

Since the p-well provided with the transistor within the memory cell region is surrounded by the bottom n-well, the potential can be set independently of the substrate, and soft error is suppressed in the semiconductor device manufactured in the foregoing method.

In the logic circuit region, since the well is formed in a shallow position, the circuit can be miniaturized, and the potential on the triple well can be independently set so that even the logic circuit provided with the transistors having various functions can achieve various required performances, and can have multiple functions. The semiconductor device having these advantages can be manufactured through the simple steps.

The bottom n-well which is formed at the bottom of the p-well in the triple well of the logic circuit region is formed simultaneously with the n-well, which is formed on the side of the p-well in the triple well of the memory cell region. Therefore, the number of required masks as well as the number of masking steps can be reduced.

In the memory cell region and the logic circuit region, the p-wells surrounded by the n-wells of the triple well structures can be formed in different steps to provide different concentration distributions, respectively. Accordingly, the nMOS transistors having different characteristics can be formed, and the device having multiple functions can be provided.

Second Embodiment

Figure 21:
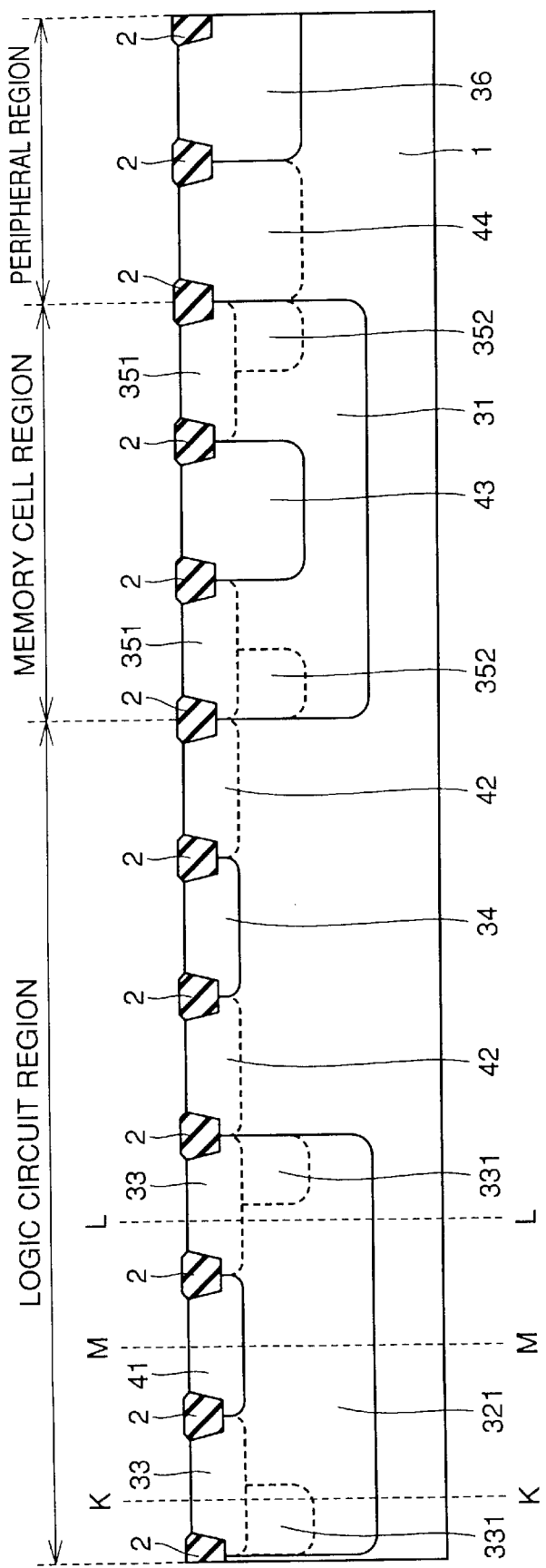
FIG. 21 is a cross section showing a semiconductor device according to a second embodiment of the invention.

FIG. 21 shows a semiconductor device according to a second embodiment of the invention, which is provided with, e.g., a logic circuit, memory cells and a peripheral circuit. Although not shown, pMOS transistors for the respective purposes are formed in n-wells 33, 34, 351 and 36, and nMOS transistors for the respective purposes are formed in p-wells 41–44. In some cases, a transistor is not formed in n-wells 33 and 351. n-wells 33 and 331 surround p-well 41 together with n-well 321 (bottom n-well), and n-wells 351 and 352 surround p-well 43 together with n-well 31 (bottom n-well). In this manner, p-wells 41 and 43 are electrically isolated from the other portions, and the triple well structure is achieved as described above. n-well 352 has a width of about 0.5–2.0 $\mu$m.

Figure 22:
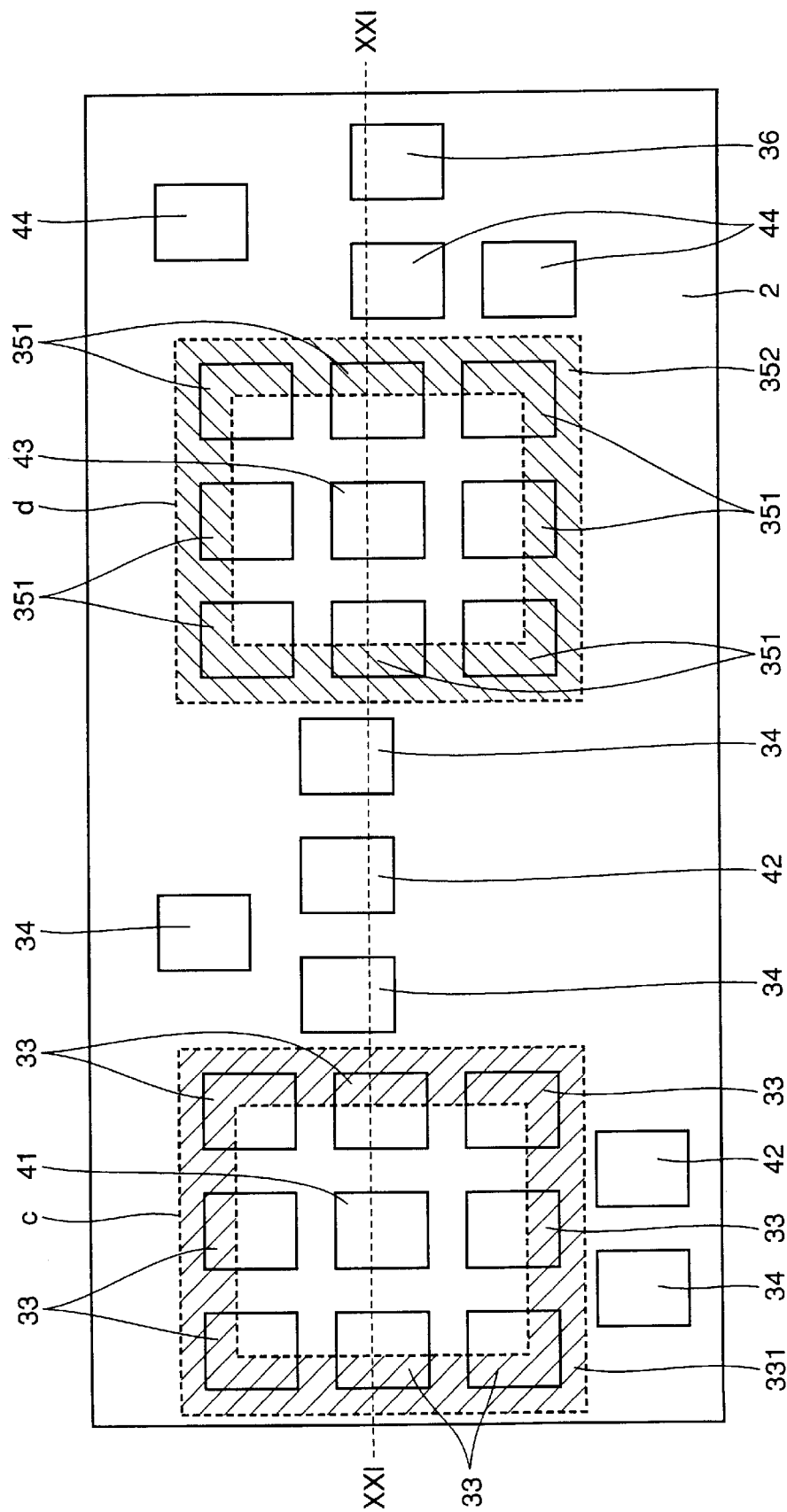
FIG. 22 is a top view showing the semiconductor device according to the second embodiment of the invention.

FIG. 22 is a top view of the semiconductor device according to the second embodiment of the invention. The section shown in FIG. 21 is taken along line J—J in FIG. 22. In FIG. 22, n-well 331 represented by hatching is formed in a position deeper than n-well 33. A portion surrounded by broken line c is provided with n-well 321, which is located at a larger depth than p-well 41 and n-wells 33 and 331, so that p-well 41 is electrically isolated from semiconductor substrate 1. n-well 353 represented by hatching is formed at a larger depth than n-well 351. A portion surrounded by broken line d is provided with n-well 31, which is located at a larger depth than p-well 43 and n-wells 351 and 352, so that p-well 43 is electrically isolated from semiconductor substrate 1.

The semiconductor device according to the second embodiment differs from the semiconductor device of the first embodiment in that n-well 352 is formed in a portion, which is located between n-well 351 formed at a shallow position and n-well 31, and has the impurity concentration decreasing in the depth direction of substrate, within the memory cell region for compensating the impurity concentration, and that n-well 351 is formed in a portion, which is located between n-well (bottom n-well) 321 formed at a deep position and n-well 33, and has the impurity concentration decreasing in the depth direction of substrate, within the logic circuit region for compensating the impurity concentration. Structures other than the above are the same as those of the semiconductor device of the first embodiment. The triple well structure in either the logic circuit region or the memory cell region of the second embodiment may be replaced with the triple well structure in the first embodiment.

Figure 23:
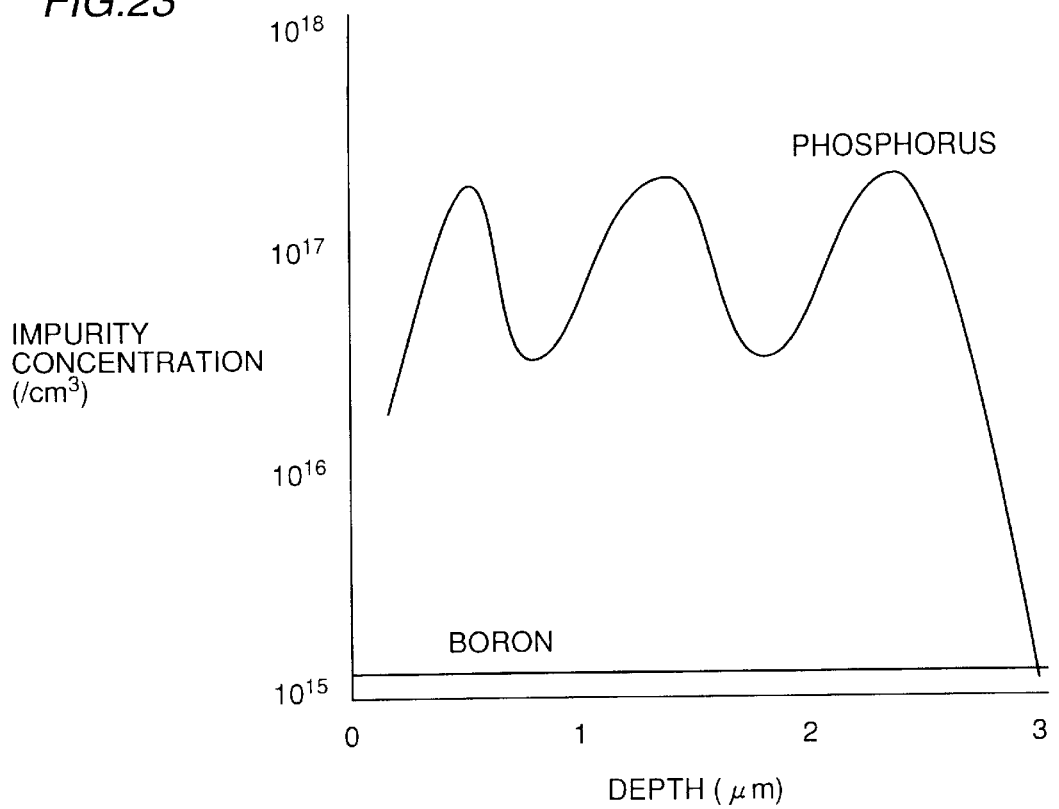
FIGS. 23–25 are graphs showing distributions of impurity concentrations on sections of the semiconductor device taken along lines K—K, L—L and M—M in FIG. 22 according to the second embodiment of the invention, respectively.

FIG. 23 is a graph showing distributions of impurity concentrations in the semiconductor device according to the second embodiment of the invention, and more specifically shows the impurity concentration distributions in n-wells 33, 331 and 321 as well as semiconductor substrate 1 on a section taken along line K—K in FIG. 22. Referring to FIG. 23, n-well 33 contains the impurity such as phosphorus at about $1\times10^{17}$–$1\times10^{19}$cm$^3$, and the peak of the impurity concentration thereof is located at a depth of about 0.5–0.8 $\mu$m from the surface of the semiconductor substrate. n-well 331 contains the impurity such as phosphorus at about $1\times10^{17}$–$1\times10^{19}$/cm$^3$, and the peak of the impurity concentration thereof is located at a depth of about 1–1.5 $\mu$m from the surface of the semiconductor substrate. n-well 321 contains the impurity such as phosphorus at about $1\times10^{17}$–$1\times10^{19}$/cm$^3$, and the peak of the impurity concentration thereof is located at a depth of about 2–2.5 $\mu$m from the surface of the semiconductor substrate.

Figure 24:
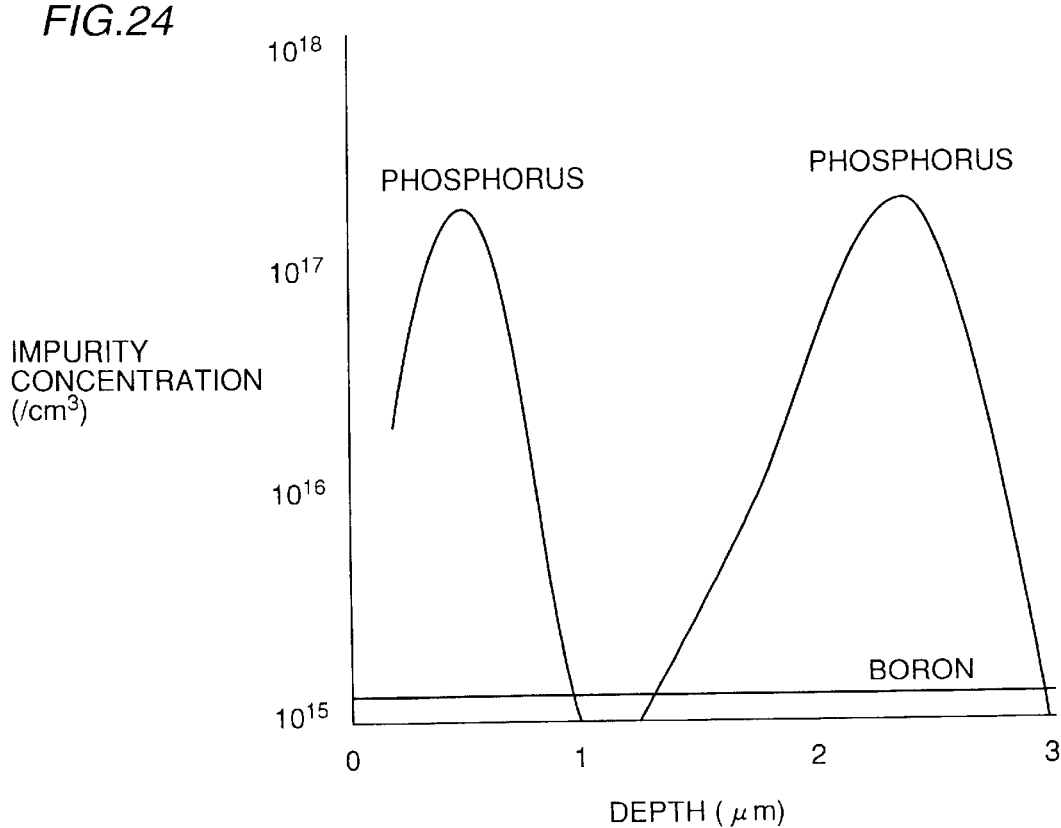

FIG. 24 is a graph showing distributions of impurity concentrations in the semiconductor device according to the second embodiment of the invention, and more specifically shows the impurity concentration distributions in n-wells 33 and 321 as well as semiconductor substrate 1 on a section taken along line L—L in FIG. 22. Referring to FIG. 24, n-well 33 contains the impurity such as phosphorus at about $1\times10^{17}$–$1\times10^{19}$/cm$^3$, and the peak of the impurity concentration thereof is located at a depth of about 0.5–0.8 $\mu$m from the surface of the semiconductor substrate. n-well 321 contains the impurity such as phosphorus at about $1\times10^{17}$–$1\times10^{19}$/cm$^3$, and the peak of the impurity concentration thereof is located at a depth of about 2–2.5 $\mu$m from the surface of the semiconductor substrate.

Figure 25:
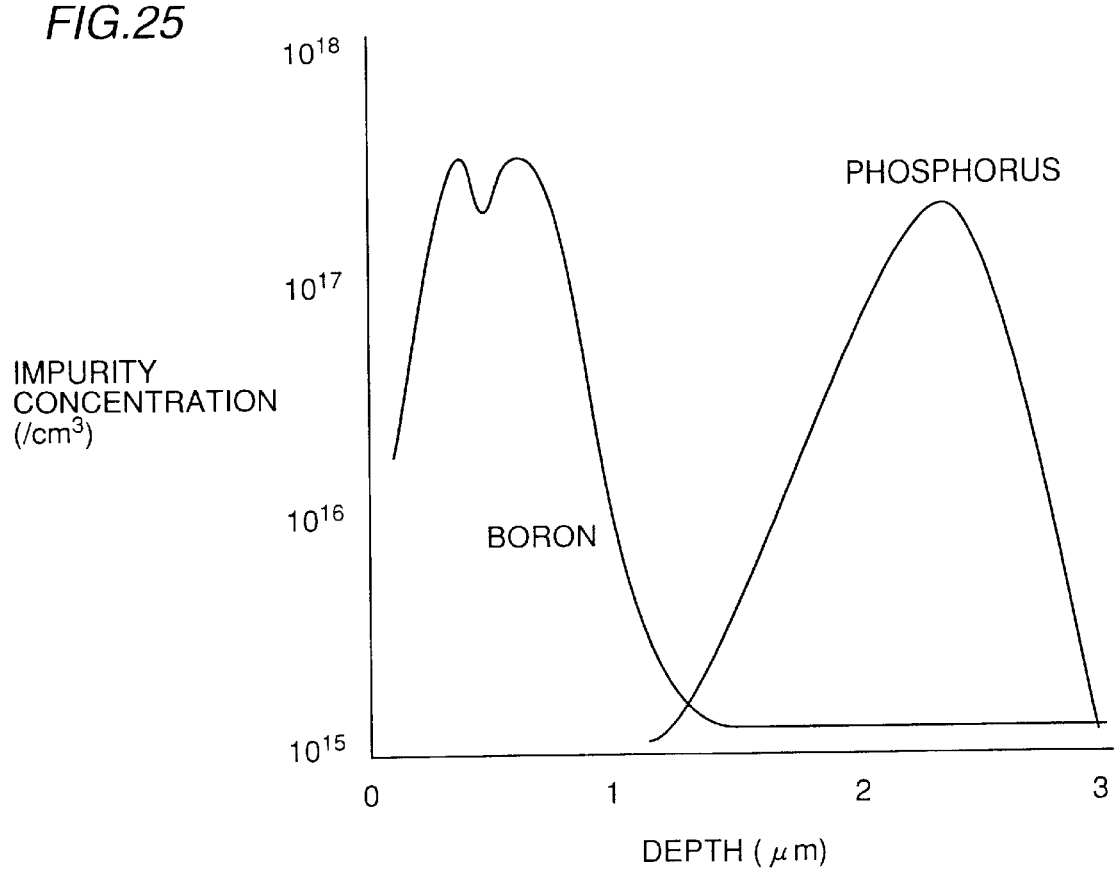

FIG. 25 is a graph showing distributions of impurity concentrations in the semiconductor device according to the second embodiment of the invention, and more specifically shows the impurity concentration distributions in p-well 41, n-well 321 and semiconductor substrate 1 on a section taken along line M-M in FIG. 22. Referring to FIG. 25, p-well 41 contains the impurity such as boron at about $1\times10^{17}$–$1\times10^{19}$/cm$^3$, and the peak of the impurity concentration thereof is located at a depth of about 0.5–0.8 $\mu$m from the surface of the semiconductor substrate. Further, FIG. 25 shows the impurity concentration distribution in a channel stop layer (not shown in FIG. 21), which contains the impurity such as boron at about $1\times10^{17}$–$1\times10^{19}$/cm$^3$, and has the impurity concentration peak at a depth of about 0.2–0.5 $\mu$m from the semiconductor substrate surface.

According to the semiconductor device of the second embodiment, even in the case where the depth of well is reduced in accordance with reduction in isolation width and well width due to miniaturization of the semiconductor integrated circuit, it is possible to suppress deterioration of element characteristics such as increase in leak current at the pn junction between the semiconductor substrate (well) and the source/drain region in a portion provided with the capacitor within the memory cell region, and the refresh characteristics can be improved.

The transistor in DRAM memory cell region is formed in the deep p-well, which is surrounded by the bottom n-well. Thereby, the potential can be set independently of the substrate, and soft error is suppressed.

In the logic circuit region, since the well is formed in a shallow position, the circuit can be miniaturized, and the potential on the triple well can be independently set so that even the logic circuit provided with the transistors having various functions can achieve various required performances, and can have multiple functions.

In general, a transistor formed in a well, which has a peak of impurity concentration at a large depth from the surface of the semiconductor substrate, must be spaced from the end of the well by a certain distance for suppressing deterioration of the transistor characteristics. In the semiconductor device according to the second embodiment, however, n-wells 331 and 352 are spaced from p-wells 41 and 43, respectively, so that miniaturization can be achieved to a higher extent.

A method of manufacturing the semiconductor device according to the second embodiment of the invention will now be described.

Figure 26:
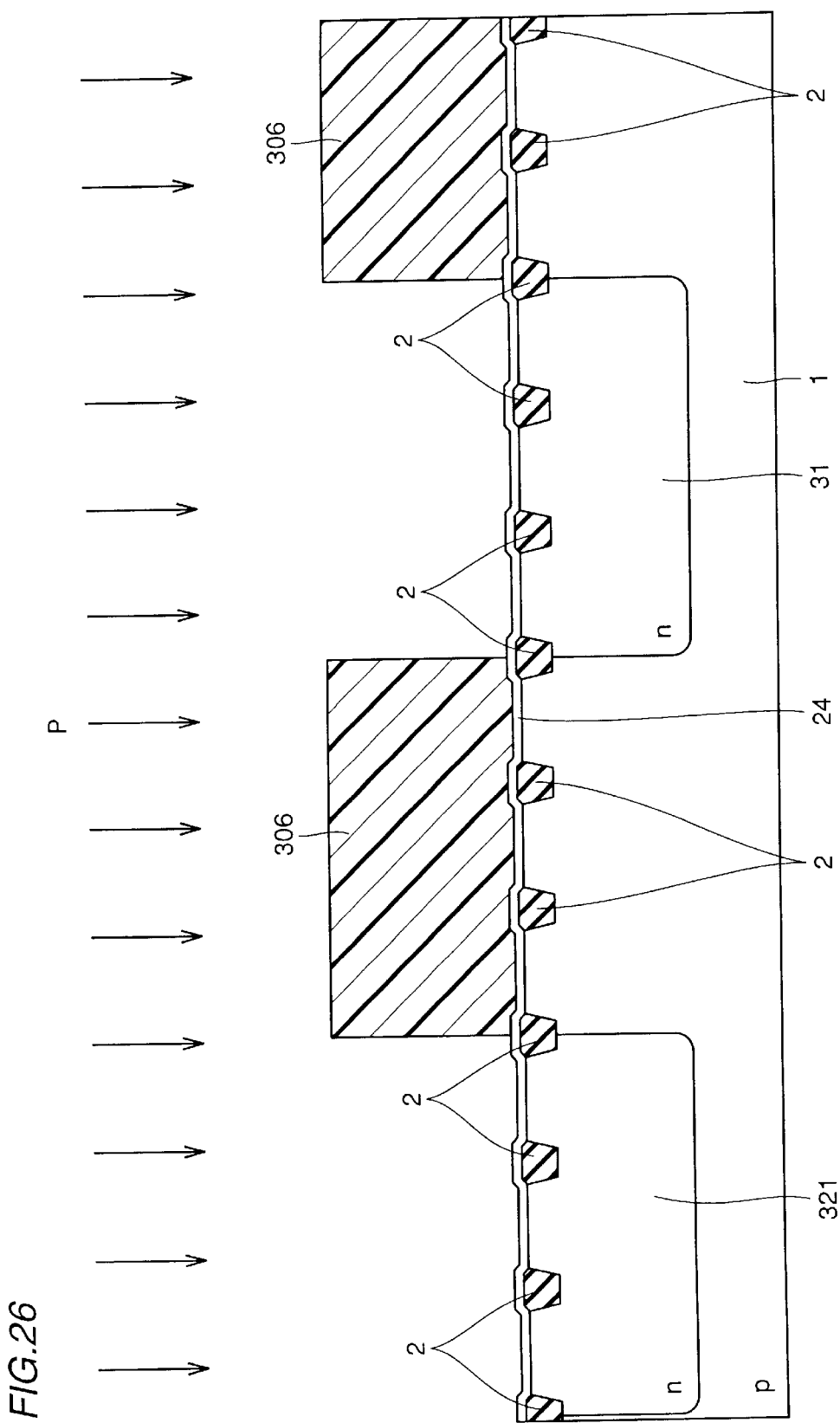
FIGS. 26 and 27 are cross sections showing steps in a method of manufacturing the semiconductor device according to the second embodiment of the invention, respectively.
Figure 27:
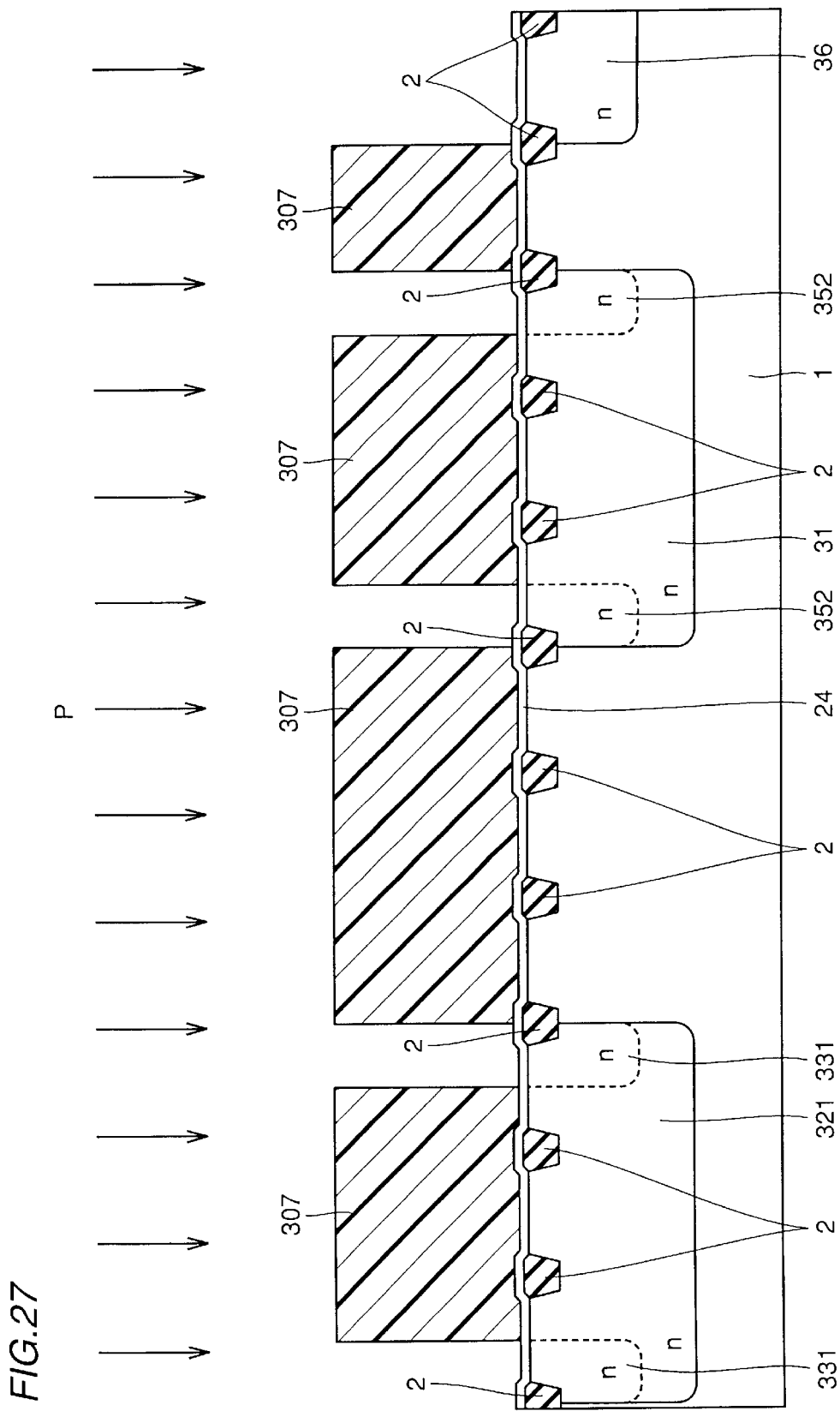

FIGS. 26 and 27 are cross sections showing steps in a method of manufacturing the semiconductor device according to the second embodiment, respectively.

First, isolating and insulating film 2 and silicon oxide film 24 are formed at the surface of semiconductor substrate 1, similarly to the first embodiment. Then, a photoresist mask 306 having an opening located above the surface of the region, in which the triple well structure will be formed, is formed and high-energy implantation of the n-type impurity such as phosphorus is effected on the whole surface masked with photoresist mask 306 under the conditions of about 2–10 MeV and about $1 \times 10^{12}$–$1 \times 10^{14}$/cm$^2$. Thereby, n-wells 31 and 32 are formed. FIG. 26 shows a sectional structure of the elements of the semiconductor device after completion of the above step. Thereafter, photoresist mask 306 is removed.

In FIG. 27, 307 indicates a photoresist mask. Photoresist mask 307 has an opening located above the surface of the region, in which n-wells 31 and 321 are in contact with semiconductor substrate 1, i.e., the ends of n-wells 31 and 321 and the n-well formation region of the peripheral region. High-energy implantation of the n-type impurity such as phosphorus is effected on the whole surface masked with photoresist mask 307 under the conditions of about 500 KeV–3 MeV and about $1 \times 10^{12}$–$1 \times 10^{14}$/cm$^2$. Thereby, n-wells 331, 352 and 36 are formed. FIG. 27 shows a sectional structure of the elements of the semiconductor device after completion of the above step. Thereafter, photoresist mask 307 is removed.

Similarly to the first embodiment, p-wells 41–44 as well as n-wells 34 and 351 are formed. n-well 351 has the same impurity concentration distribution as n-wells 33 and 34, and is formed simultaneously with them in the manufacturing process. Thereafter, required elements are formed in the respective wells similar to those in the first embodiment. n-well 36 may be formed in the step of forming n-wells 33, 34 and 351, and therefore at the same time as them. In this case, n-well 36 has the same concentration distribution as n-wells 33, 34 and 351. If formation in the same step is allowed as described above, such an effect can be achieved that the mask for forming n-well 36 as well as the ion implanting step using it can be eliminated.

In the method of manufacturing the semiconductor device of the second embodiment, n-wells 321, 331, 351 and 352 are formed in the manner different from that in the method of manufacturing the semiconductor device of the first embodiment. Structures other than the above are formed in the same manners as the first embodiment. The order of formation of the respective wells and the interconnection structure can be changed similarly to the first embodiment, and the triple well structure in either the logic circuit region or the memory cell region of the second embodiment can be replaced with the triple structure in the first embodiment.

In the manners described above, the semiconductor device having the well structure shown in FIG. 21 is formed.

According to the method of manufacturing the semiconductor device of the second embodiment, even in the case where the depth of well is reduced in accordance with reduction in isolation width and well width due to miniaturization of the semiconductor integrated circuit, the well in the memory cell region can be formed at a large depth. Accordingly, it is possible to suppress deterioration of element characteristics such as increase in leak current at the pn junction between the semiconductor substrate (well) and the source/drain region, and the refresh characteristics can be improved.

Since the p-well provided with the transistor within the memory cell region is surrounded by the bottom n-well, the potential can be set independently of the substrate, and soft error is suppressed in the semiconductor device manufactured in the foregoing method.

In the logic circuit region, since the well is formed in a shallow position, the circuit can be miniaturized, and the potential on the triple well can be independently set so that even the logic circuit provided with the transistors having various functions can achieve various required performances, and can have multiple functions. The semiconductor device having these advantages can be manufactured through the simple steps.

Since the logic circuit region and the triple well in the memory cell region are formed simultaneously, the number of required masks as well as the number of masking steps can be reduced.

In the memory cell region and the logic circuit region, the p-wells surrounded by the n-wells of the triple well structures can be formed in different steps to provide different concentration distributions, respectively. Accordingly, the nMOS transistors having different characteristics can be formed, and the device having multiple functions can be provided.

In general, a transistor formed in a well, which has a peak of impurity concentration at a large depth from the surface of the semiconductor substrate, must be spaced from the end of the well by a certain distance for suppressing deterioration of the transistor characteristics. In the semiconductor device according to the second embodiment, however, n-wells 331 and 352 are spaced from p-wells 41 and 43, respectively, so that the semiconductor device can be further miniaturized.

Third Embodiment

Figure 28:
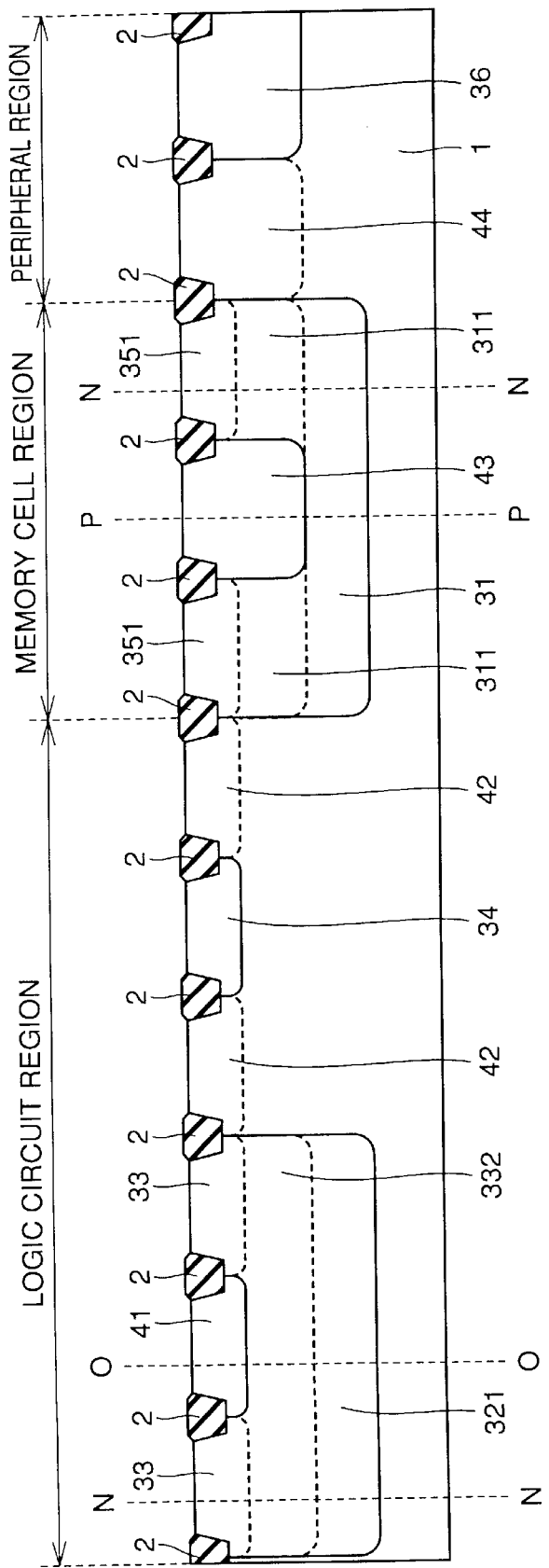
FIG. 28 is a cross section showing a semiconductor device according to a third embodiment of the invention.

FIG. 28 shows a semiconductor device according to a third embodiment of the invention, which is provided with, e.g., a logic circuit, memory cells and a peripheral circuit. Although not shown, PMOS transistors for the respective purposes are formed in n-wells 33, 34, 351 and 36, and NMOS transistors for the respective purposes are formed in p-wells 41–44. In some cases, a transistor is not formed in n-wells 33 and 351. n-wells 33 and 332 surround p-well 41 together with n-well 321 (bottom n-well), and n-wells 351 and 311 surround p-well 43 together with n-well 31 (bottom n-well). In this manner, p-wells 41 and 43 are electrically isolated from the other portions, and the triple well structure is achieved as described above.

Figure 29:
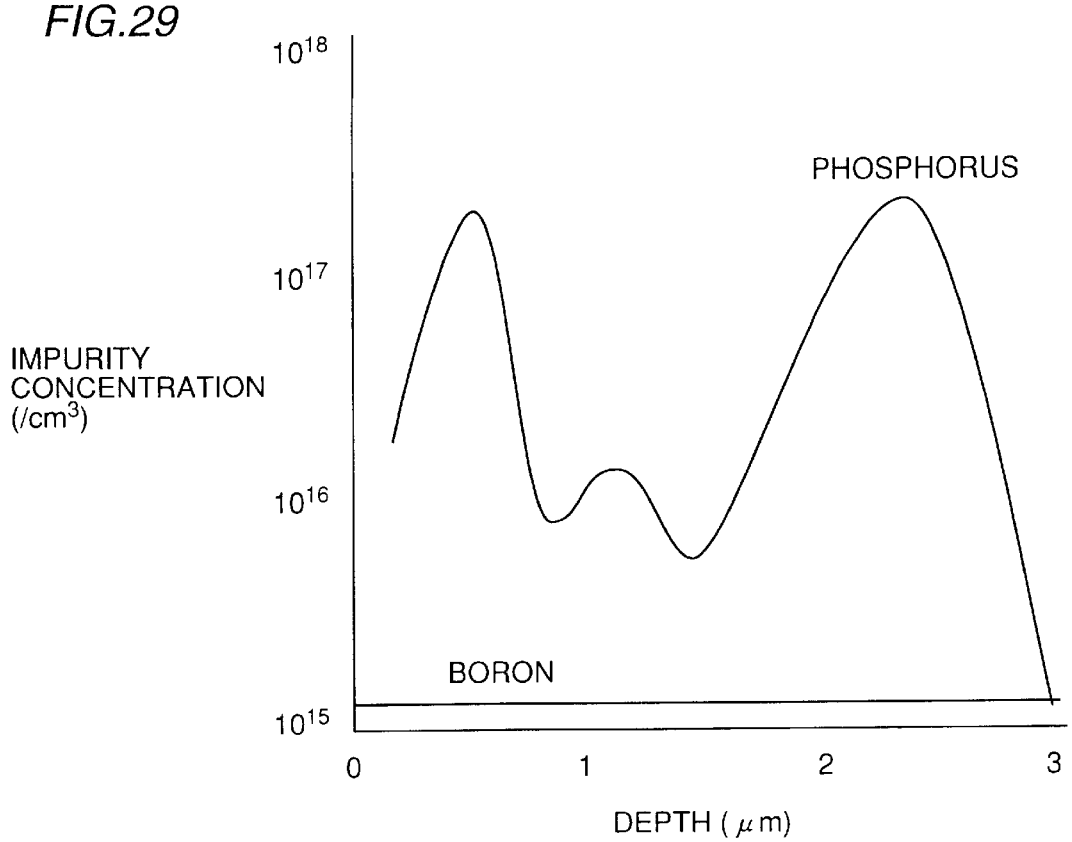
FIGS. 29–31 are graphs showing concentration distributions of impurities contained in the semiconductor device according to the third embodiment of the invention, respectively.

FIG. 29 is a graph showing distributions of impurity concentrations in the semiconductor device according to the third embodiment of the invention, and more specifically shows the impurity concentration distributions in n-wells 33 (or 351), 332 and 321 as well as semiconductor substrate 1 on a section taken along line N—N in FIG. 28. Referring to FIG. 29, n-well 33 (or 351) contains the impurity such as phosphorus at about $1 \times 10^{17}$–$1 \times 10^{19}$/cm$^3$, and the peak of the impurity concentration thereof is located at a depth of about 0.5–0.8 $\mu$m from the surface of the semiconductor substrate. n-well 332 contains the impurity such as phosphorus at about $1 \times 10^{16}$–$1 \times 10^{18}$/cm$^3$, and the peak of the impurity concentration thereof is located at a depth of about 1–1.5 m from the surface of the semiconductor substrate. n-well 321 contains the impurity such as phosphorus at about $1 \times 10^{17}$–$1 \times 10^{19}$/cm$^3$, and the peak of the impurity concentration thereof is located at a depth of about 2–2.5 $\mu$m from the surface of the semiconductor substrate.

Figure 30:
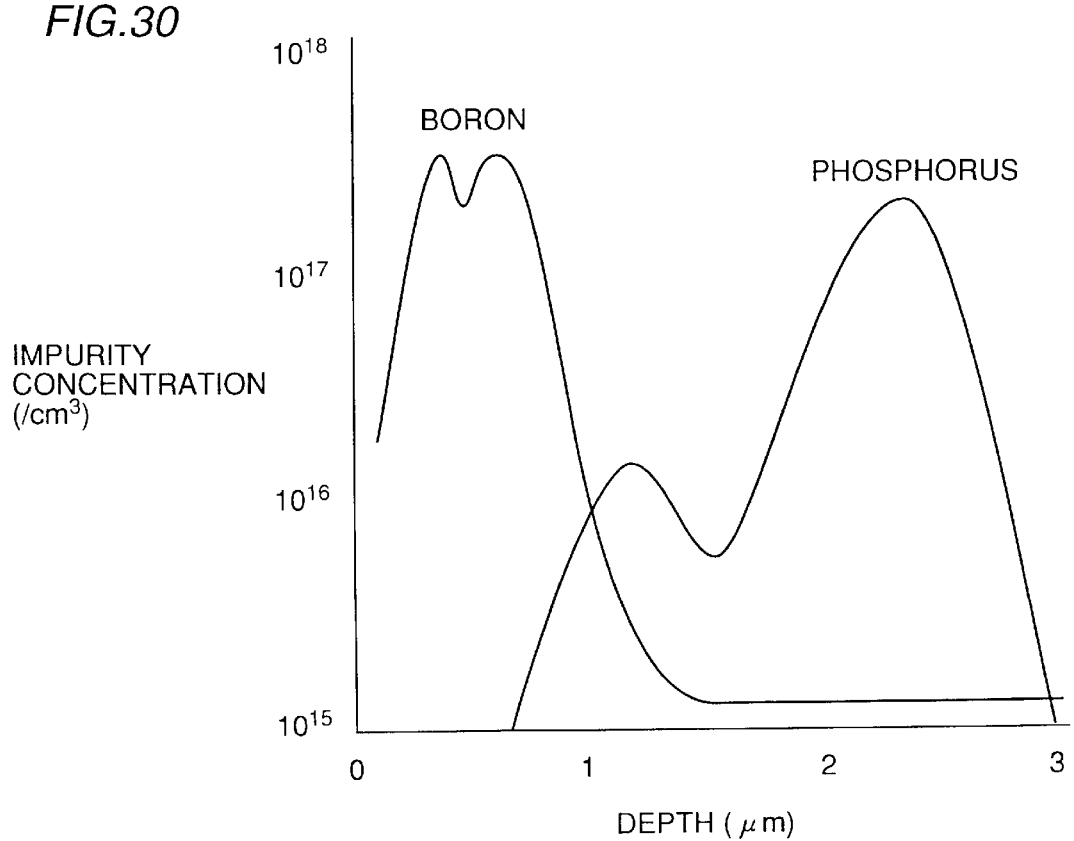

FIG. 30 is a graph showing distributions of impurity concentrations in the semiconductor device according to the third embodiment of the invention, and more specifically shows the impurity concentration distributions in n-wells 321 and 332, p-well 41 and semiconductor substrate 1 on a section taken along line O—O in FIG. 28. Referring to FIG. 30, n-well 321 contains the n-type impurity such as phosphorus at about $1\times10^{17}$–$1\times10^{19}$/cm$^3$, and the peak of the impurity concentration thereof is located at a depth of about 2–2.5 μm from the surface of the semiconductor substrate. n-well 322 contains the impurity such as phosphorus at about $1\times10^{16}$–$1\times10^{18}$/cm$^3$, and the peak of the impurity concentration thereof is located at a depth of about 1–1.5 μm from the surface of the semiconductor substrate. p-well 41 contains the impurity such as boron at about $1\times10^{17}$–$1\times10^{19}$/cm$^3$, and the peak of the impurity concentration thereof is located at a depth of about 0.5–0.8 μm from the surface of the semiconductor substrate. Further, FIG. 30 shows the impurity concentration distribution in a channel stop layer (not shown in FIG. 28), which contains the impurity such as boron at about $1\times10^{17}$–$1\times10^{19}$/cm$^3$, and has the impurity concentration peak at a depth of about 0.2–0.5 μm from the semiconductor substrate surface.

Figure 31:
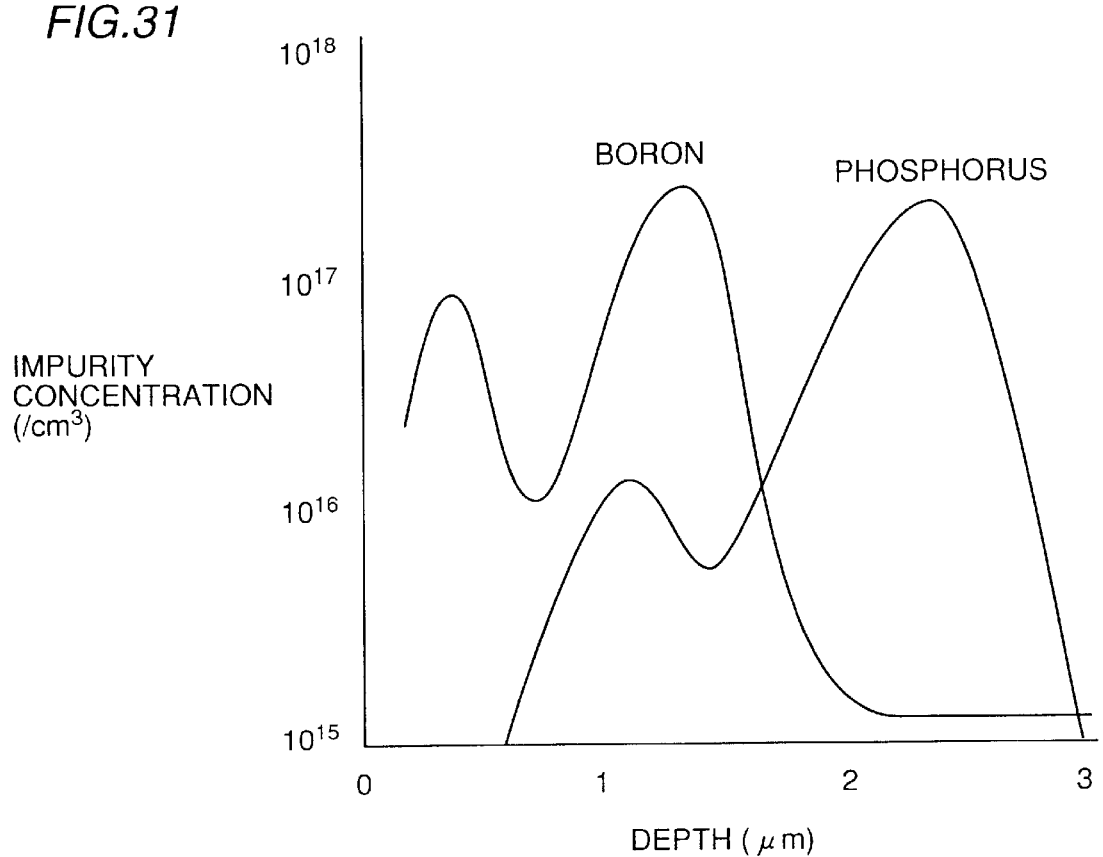

FIG. 31 is a graph showing distributions of impurity concentrations in the semiconductor device according to the third embodiment of the invention, and more specifically shows the impurity concentration distributions in n-well 31, p-well 43 and semiconductor substrate 1 on a section taken along line P—P in FIG. 28. Referring to FIG. 31, n-well 31 contains the impurity such as phosphorus at about $1\times10^{17}$–$1\times10^{19}$/cm$^3$, and the peak of the impurity concentration thereof is located at a depth of about 2–2.5 μm from the surface of the semiconductor substrate. p-well 43 contains the impurity such as boron at about $1\times10^{17}$–$1\times10^{19}$/cm$^3$, and the peak of the impurity concentration thereof is located at a depth of about 1–1.5 μm from the surface of the semiconductor substrate. As a result of implantation of the impurity into p-well 43 for forming n-well 311, the concentration peak of the impurity such as phosphorus is formed at the substantially same depth as the impurity concentration peak of p-well 43. In this portion, however, the concentration of the p-type impurity is sufficiently higher than that of the n-type impurity. Therefore, there is no possibility of occurrence of the leak current.

The semiconductor device according to the third embodiment differs from the semiconductor device of the first embodiment in that n-well 311 is formed in a portion, which is located between n-well 351 formed at a shallow position and n-well 31, and has the impurity concentration decreasing in the depth direction of substrate, within the memory cell region for compensating the impurity concentration, and that n-well.332 is formed in a portion, which is located between n-well (bottom n-well) 321 formed at a deep position and n-well 33, and has the impurity concentration decreasing in the depth direction of substrate, within the logic circuit region for compensating the impurity concentration. Structures other than the above are the same as those of the semiconductor device of the first embodiment. The triple well structure in either the logic circuit region or the memory cell region of the third embodiment may be replaced with the triple well structure in the first or second embodiment.

According to the semiconductor device of the third embodiment, even in the case where the depth of well is reduced in accordance with reduction in isolation width and well width due to miniaturization of the semiconductor integrated circuit, it is possible to suppress deterioration of element characteristics such as increase in leak current at the pn junction between the semiconductor substrate (well) and the source/drain region in a portion provided with the capacitor within the memory cell region, and the refresh characteristics can be improved.

The transistor in DRAM memory cell region is formed in the deep p-well, which is surrounded by the n-well. Thereby, the potential can be set independently of the substrate, and soft error is suppressed.

In the logic circuit region, since the well is formed in a shallow position, the circuit can be miniaturized, and the potential on the triple well can be independently set so that even the logic circuit provided with the transistors having various functions can achieve various required performances, and can have multiple functions.

A method of manufacturing the semiconductor device according to the third embodiment of the invention will now be described.

Figure 32:
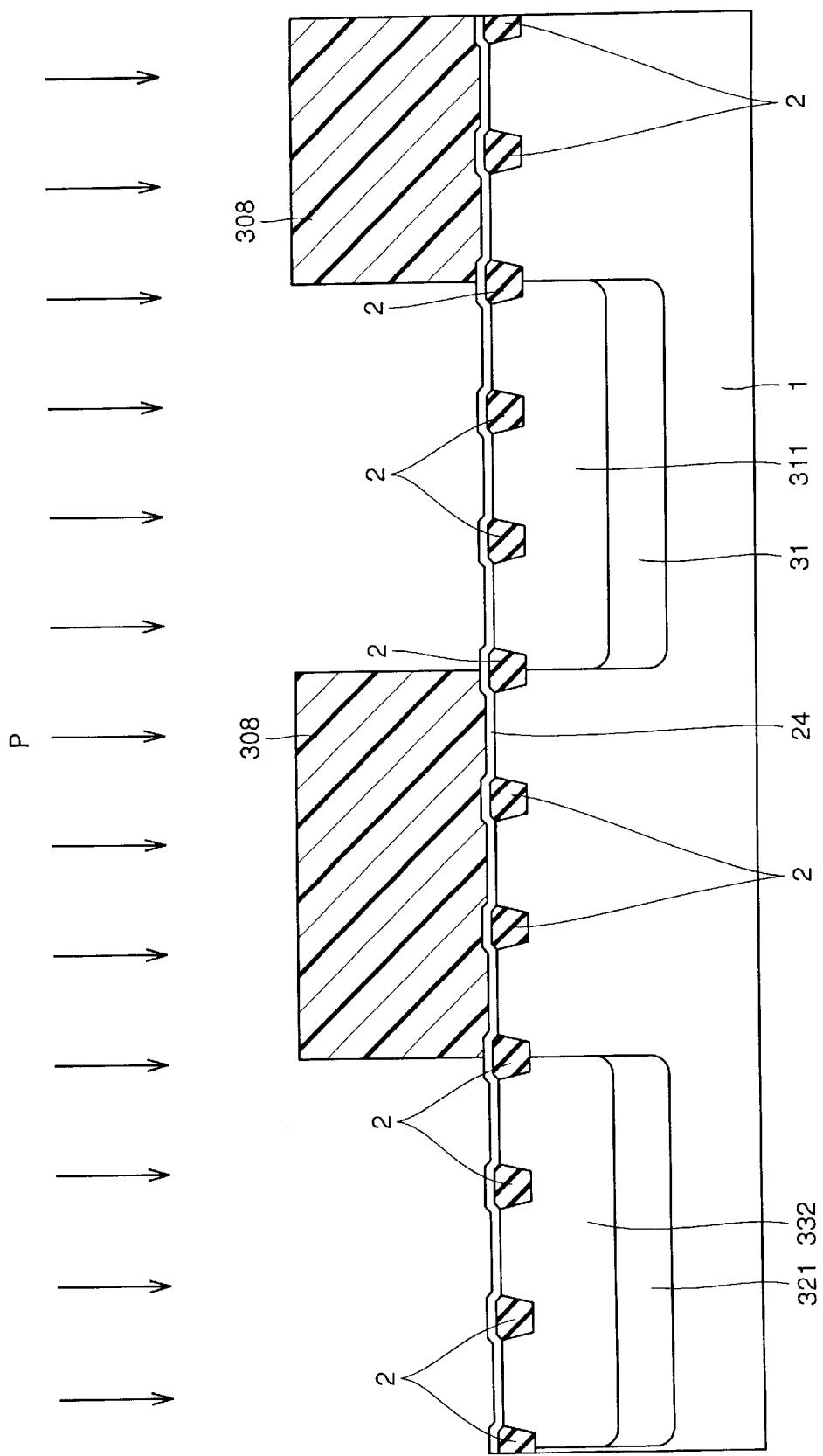
FIG. 32 is a cross section showing a step in a method of manufacturing the semiconductor device according to the third embodiment of the invention.

First, isolating and insulating film 2 and silicon oxide film 24 are formed at the surface of semiconductor substrate 1, similarly to the first embodiment. Then, a photoresist mask 308 having an opening located above the surface of the region, in which the triple well structure will be formed, is formed and high-energy implantation of the n-type impurity such as phosphorus is effected on the whole surface masked with photoresist mask 308 under the conditions of about 2–10 MeV and about $1\times10^{12}$–$1\times10^{14}$/cm$^2$. Thereby, n-wells 31 and 321 are formed. Further, high-energy implantation of the n-type impurity such as phosphorus is performed under the conditions of about 500 KeV–3 MeV and about $1\times10^{11}$–$1\times10^{13}$/cm$^2$. Thereby, n-wells 311 and 332 are formed. FIG. 32 shows a sectional structure of the elements of the semiconductor device after completion of the above step. Thereafter, photoresist mask 308 is removed.

Similarly to the first and second embodiments, p-wells 41–44 as well as n-wells 33, 34, 351 and 36 are formed. Thereafter, required elements are formed similarly to the first embodiment. n-well 36 may be formed in the step of forming n-wells 33, 34 and 351, and therefore at the same time as them. In this case, n-well 36 has the same concentration distribution as n-wells 33, 34 and 351. If formation in the same step is allowed as described above, such an effect can be achieved that the mask for forming n-well 36 as well as the ion implanting step using it can be eliminated.

In the method of manufacturing the semiconductor device of the third embodiment, n-wells 321, 332 and 311 are formed in the manner different from that in the method of manufacturing the semiconductor device of the first embodiment. Structures other than the above are formed in the same manners as the first embodiment. The order of formation of the respective wells and the interconnection structure can be changed similarly to the first embodiment, and the triple well structure in either the logic circuit region or the memory cell region of the third embodiment can be replaced with the triple structure in the first or second embodiment.

In the manners described above, the semiconductor device having the well structure shown in FIG. 28 is formed.

According to the method of manufacturing the semiconductor device of the third embodiment, even in the case where the depth of well is reduced in accordance with reduction in isolation width and well width due to miniaturization of the semiconductor integrated circuit, the well in the memory cell region can be formed at a large depth. Accordingly, it is possible to suppress deterioration of element characteristics such as increase in leak current at the pn junction between the semiconductor substrate (well) and the source/drain region, and the refresh characteristics can be improved.

Since the p-well provided with the transistor within the memory cell region is surrounded by the bottom n-well, the potential can be set independently of the substrate, and soft error is suppressed in the semiconductor device manufactured in the foregoing method.

In the logic circuit region, since the well is formed in a shallow position, the circuit can be miniaturized, and the potential on the triple well can be independently set so that even the logic circuit provided with the transistors having various functions can achieve various required performances, and can have multiple functions. The semiconductor device having these advantages can be manufactured through the simple steps.

In the memory cell region and the logic circuit region, the p-wells surrounded by the n-wells of the triple well structures can be formed in different steps to provide different concentration distributions, respectively. Accordingly, the nMOS transistors having different characteristics can be formed, and the device having multiple functions can be provided.

The bottom n-well which is formed at the bottom of the p-well in the triple well of the logic circuit region is formed simultaneously with the n-well, which is formed on the side of the p-well in the triple well of the memory cell region. Further, the concentrations of n-wells 332 and 311 are controlled. Thereby, n-wells 31 and 321 can be formed simultaneously with n-wells 311 and 332 with the single photoresist mask so that the number of required masks as well as the number of masking steps can be reduced.

Fourth Embodiment

Figure 33:
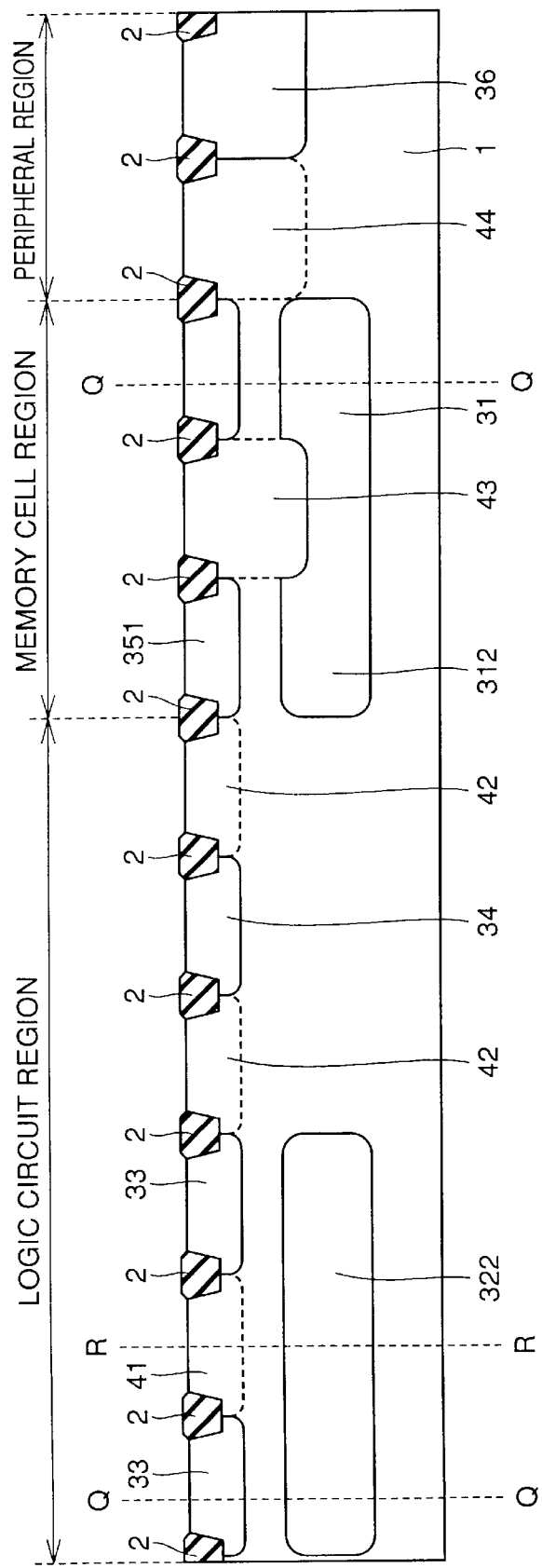
FIG. 33 is a cross section showing a semiconductor device according to a fourth embodiment of the invention.

FIG. 33 is a cross section showing a semiconductor device according to a fourth embodiment.

FIG. 33 shows by way of example the semiconductor device provided with the logic circuit, the memory cells and the peripheral circuit. Although not shown, pMOS transistors for the respective purposes are formed in n-wells 33, 34, 351 and 36, and nMOS transistors for the respective purposes are formed in p-wells 41–44. In some cases, a transistor is not formed in n-wells 33 and 351. p-well 43 has a bottom located at a depth where the impurity concentration of n-well 312 is higher than that of semiconductor substrate 1. Between n-wells 351 and 312 as well as between n-wells 33 and 322, there are regions where the concentration of impurity such as phosphorus contained in the n-well is higher than the concentration of impurity such as boron contained in semiconductor substrate 1, and therefore p-type semiconductors are formed. However, each region forming the p-type semiconductor has a small width of up to about 0.2 $\mu$m in the depth direction, and also has a small impurity concentration so that n-wells 33 and 322 are electrically connected together to form the triple structure.

Figure 34:
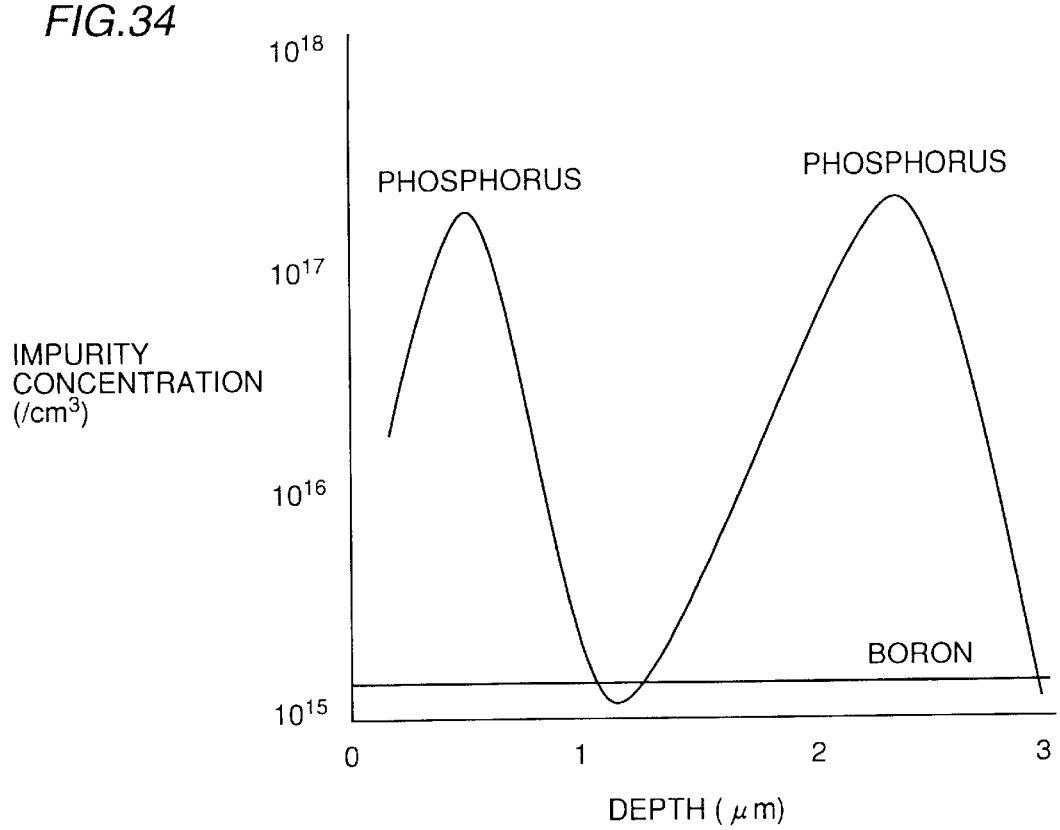
FIGS. 34 and 35 are graphs showing distributions of impurity concentrations on sections of the semiconductor device taken along lines Q—Q and R—R in FIG. 33 according to the fifth embodiment of the invention, respectively.

FIG. 34 is a graph showing distributions of impurity concentrations in the semiconductor device according to the fourth embodiment of the invention, and more specifically shows the impurity concentration distributions in n-well 33 (or 351), n-well 332 and semiconductor substrate 1 on a section taken along line Q—Q in FIG. 33. Referring to FIG. 34, n-well 33 (or 351) contains the impurity such as phosphorus at about $1\times10^{17}$–$1\times10^{19}$/cm$^3$, and the peak of the impurity concentration thereof is located at a depth of about 0.5–0.8 $\mu$m from the surface of the semiconductor substrate. n-wells 31 and 331 contain the n-type impurity such as phosphorus at about $1\times10^{17}$–$1\times10^{19}$/cm$^3$, and the peak of the impurity concentration thereof is located at a depth of about 2–2.5 $\mu$m from the surface of the semiconductor substrate.

Figure 35:
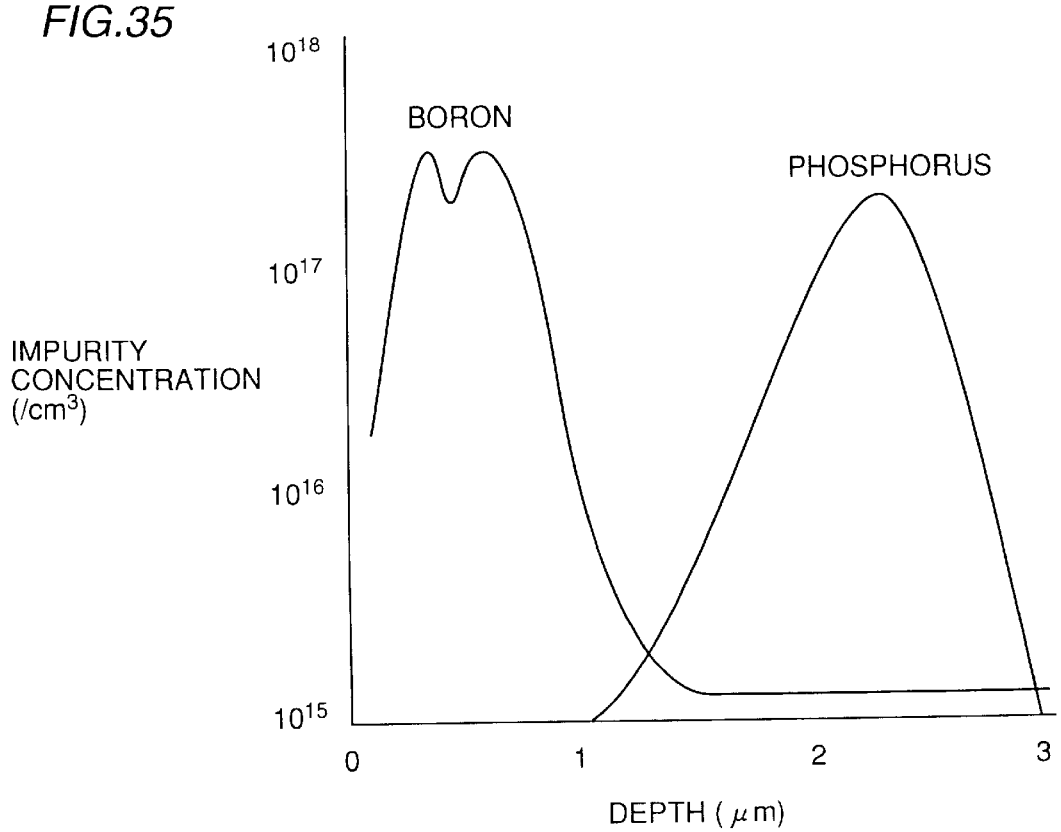

FIG. 35 is a graph showing distributions of impurity concentrations in the semiconductor device according to the fourth embodiment of the invention, and more specifically shows the impurity concentration distributions in n-well 312, p-well 43 and semiconductor substrate 1 on a section taken along line R—R in FIG. 33. Referring to FIG. 35, n-well 312 contains the n-type impurity such as phosphorus at about $1\times10^{17}$–$1\times10^{19}$/cm$^3$, and the peak of the impurity concentration thereof is located at a depth of about 2–2.5 $\mu$m from the surface of the semiconductor substrate. p-well 41 contains the impurity such as boron at about $1\times10^{17}$–$1\times10^{19}$/cm$^3$, and the peak of the impurity concent a depth of about 0.5–0.8 $\mu$m from the surface of the semiconductor substrate. Further, FIG. 35 shows the impurity concentration distribution in a channel stop layer (not shown in FIG. 33), which contains the impurity such as boron at about $1\times10^{17}$–$1\times10^{19}$/cm$^3$, and has the impurity concentration peak at a depth of about 0.2–0.5 $\mu$m from the semiconductor substrate surface.

The semiconductor device according to the fourth embodiment differs from the semiconductor device of the second embodiment in that n-well 352 in the second embodiment is not employed in the fourth embodiment. Structures other than the above are the same as those of the semiconductor device of the second embodiment. The triple well structure in either the logic circuit region or the memory cell region of the fourth embodiment may be replaced with the triple well structure in any one of the first, second and third embodiments.

According to the semiconductor device of the fourth embodiment, even in the case where the depth of well is reduced in accordance with reduction in isolation width and well width due to miniaturization of the semiconductor integrated circuit, it is possible to suppress deterioration of element characteristics such as increase in leak current at the pn junction between the semiconductor substrate (well) and the source/drain region in a portion provided with the capacitor within the memory cell region, and the refresh characteristics can be improved.

The transistor in DRAM memory cell region is formed in the deep p-well, which is surrounded by the bottom n-well. Thereby, the potential can be set independently of the substrate, and soft error is suppressed.

In the logic circuit region, since the well is formed in a shallow position, the circuit can be miniaturized, and the potential on the triple well can be independently set so that even the logic circuit provided with the transistors having various functions can achieve various required performances, and can have multiple functions.

A method of manufacturing the semiconductor device according to the fourth embodiment of the invention will now be described.

First, isolating and insulating film 2 and silicon oxide film 24 are formed at the surface of semiconductor substrate 1, similarly to the first embodiment. Then, a photoresist mask having an opening located above the surface of the region, in which the triple well structure will be formed, is formed and high-energy implantation of the n-type impurity such as phosphorus is effected on the whole surface masked with the photoresist mask under the conditions of about 2–10 MeV and about $1\times10^{12}$–$1\times10^{14}$/cm$^2$. Thereby, n-wells 311 and 332 are formed. Similarly to the second embodiment, p-wells 41–44 as well as n-wells 33, 34, 351 and 36 are formed. Thereafter, required elements are formed similarly to the first embodiment.

n-well 36 may be formed in the step of forming n-wells 33, 34 and 351, and therefore at the same time as them. In this case, n-well 36 has the same concentration distribution as n-wells 33, 34 and 351. If formation in the same step is allowed as described above, such an effect can be achieved that the mask for forming n-well 36 as well as the ion implanting step using it can be eliminated.

According to the method of manufacturing the semiconductor device of the fourth embodiment, even in the case where the depth of well is reduced in accordance with reduction in isolation width and well width due to miniaturization of the semiconductor integrated circuit, the well in the memory cell region can be formed at a large depth. Accordingly, it is possible to suppress deterioration of element characteristics such as increase in leak current at the pn junction between the semiconductor substrate (well) and the source/drain region, and the refresh characteristics can be improved.

Since the p-well provided with the transistor within the memory cell region is surrounded by the bottom n-well, the potential can be set independently of the substrate, and soft error is suppressed in the semiconductor device manufactured in the foregoing method.

In the logic circuit region, since the well can be formed in a shallow position, the circuit can be miniaturized, and the potential on the triple well can be independently set so that even the logic circuit provided with the transistors having various functions can achieve various required performances, and can have multiple functions. The semiconductor device having these advantages can be manufactured through the simple steps.

The bottom n-well which is formed at the bottom of the p-well in the triple well of the logic circuit region is formed simultaneously with the n-well, which is formed on the side of the p-well in the triple well of the memory cell region, by performing implantation one time. Therefore, the number of required masks as well as the number of masking steps can be reduced.

In the memory cell region and the logic circuit region, the p-wells surrounded by the n-wells of the triple well structures can be formed in different steps to provide different concentration distributions, respectively. Accordingly, the nMOS transistors having different characteristics can be formed, and the device having multiple functions can be provided.

Fifth Embodiment

Figure 36:
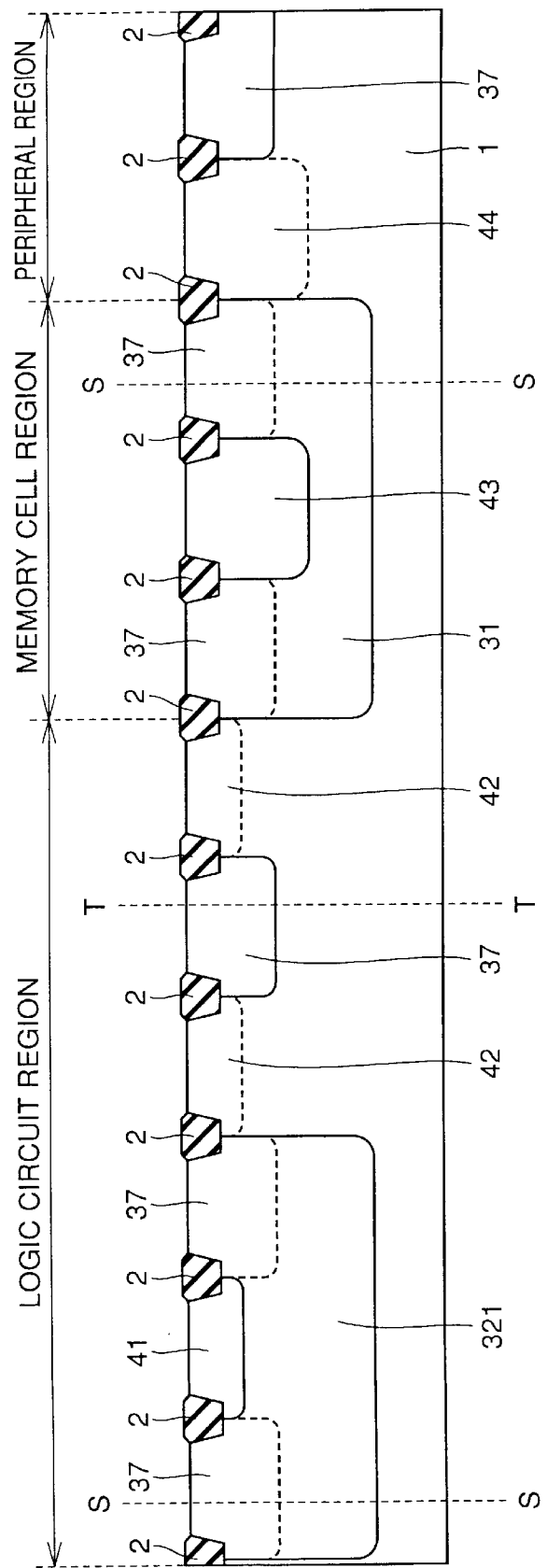
FIG. 36 is a cross section showing a semiconductor device according to a fifth embodiment of the invention.

FIG. 36 is a cross section showing a semiconductor device according to a fifth embodiment.

FIG. 36 shows by way of example the semiconductor device provided with the logic circuit, the memory cells and the peripheral circuit. Although not shown, pMOS transistors for the respective purposes are formed in n-well 37, and nMOS transistors for the respective purposes are formed in p-wells 41–44. However, one or some of these wells are not provided with a transistor, and are employed only for the purpose of cooperating with bottom n-well 31 (or 321) to isolate electrically p-well 41 (or 43) from semiconductor substrate 1. p-well 43 has a bottom located at a depth where n-well 312 has a higher impurity concentration than semiconductor substrate 1.

Figure 37:
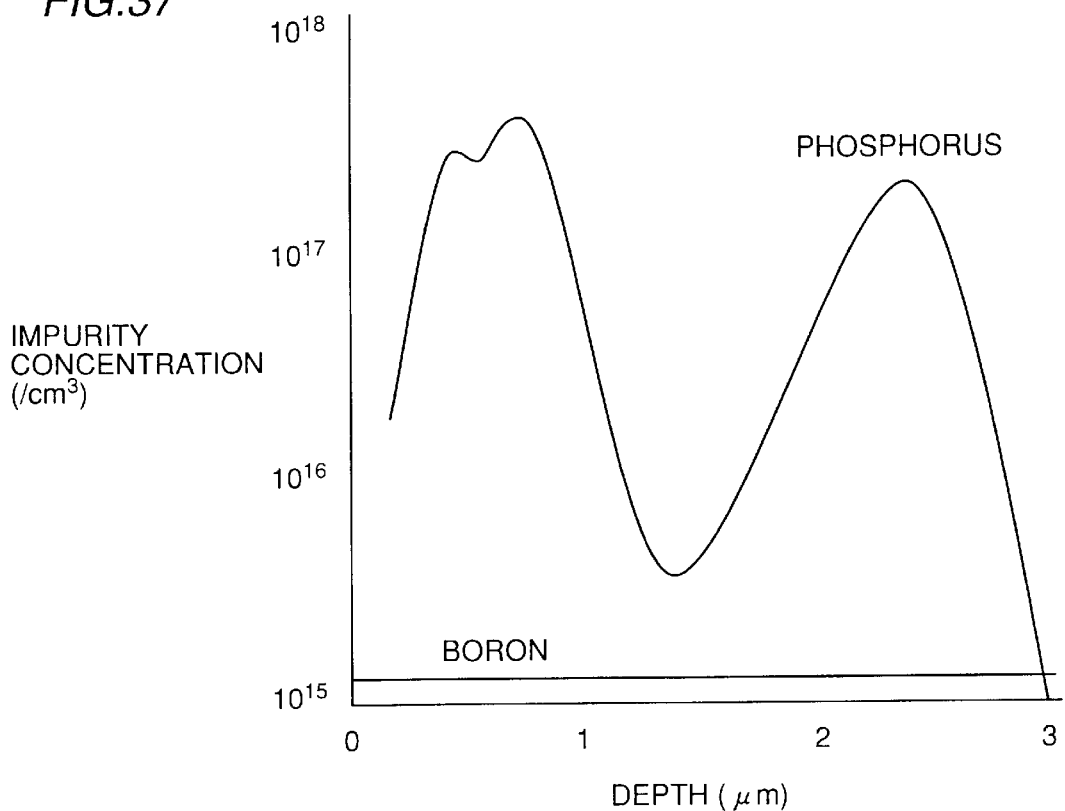
FIGS. 37 and 38 are graphs showing distributions of impurity concentrations on sections of the semiconductor device taken along lines S—S and T—T in FIG. 36 according to the fifth embodiment of the invention, respectively.

FIG. 37 is a graph showing distributions of impurity concentrations in the semiconductor device according to the fifth embodiment of the invention, and more specifically shows the impurity concentration distributions in n-well 31 (or 321), n-well 37 and semiconductor substrate 1 on a section taken along line S—S in FIG. 36. Referring to FIG. 37, n-wells 31 and 321 contain the n-type impurity such as phosphorus at about $1 \times 10^{17} - 1 \times 10^{19}/cm^3$, and the peak of the impurity concentration thereof is located at a depth of about 2–2.5 $\mu$m from the surface of the semiconductor substrate. n-well 37 contains the impurity such as phosphorus at about $1 \times 10^{17} - 1 \times 10^{19}/cm^3$, and the peak of the impurity concentration thereof is located at a depth of about 0.7–1.2 $\mu$m from the surface of the semiconductor substrate.

Figure 38:
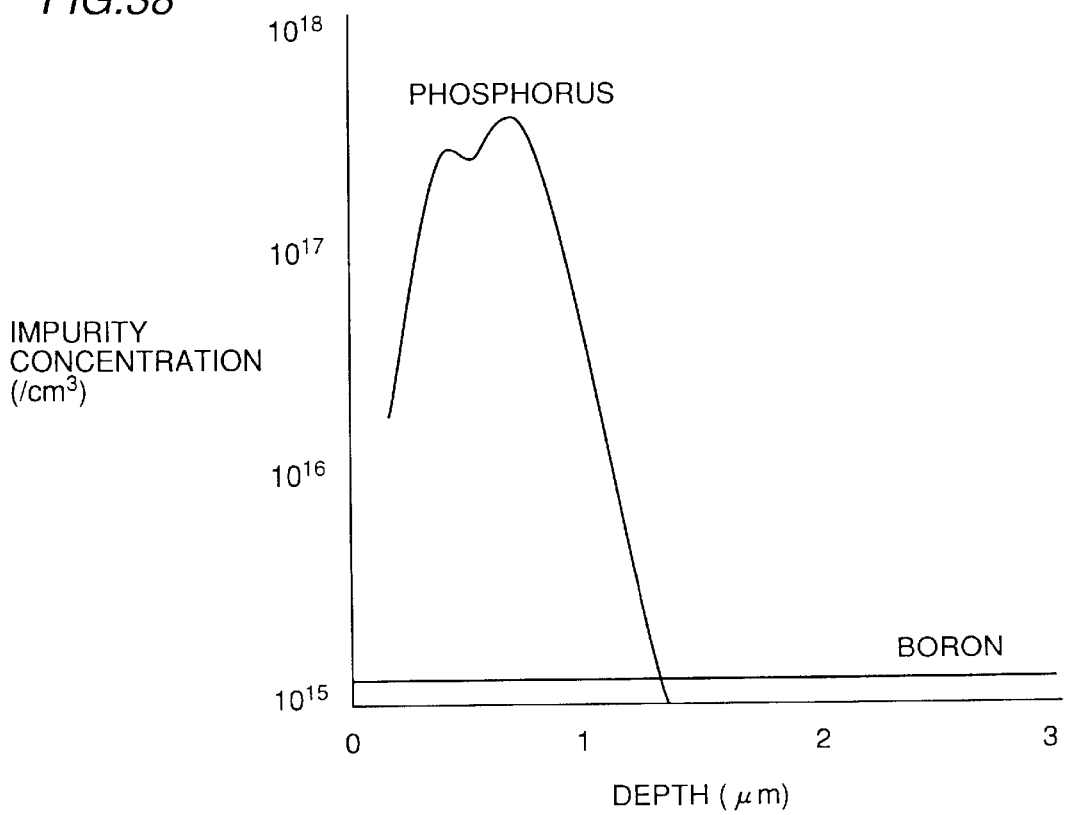

FIG. 38 is a graph showing distributions of impurity concentrations in the semiconductor device according to the fifth embodiment of the invention, and more specifically shows the impurity concentration distributions in n-well 37 and semiconductor substrate 1 on a section taken along line T—T in FIG. 36. Referring to FIG. 38, n-well 37 contains the impurity such as phosphorus at about $1 \times 10^{17} - 1 \times 10^{19}/cm^3$, and the peak of the impurity concentration thereof is located at a depth of about 0.7–1.2 $\mu$m from the surface of the semiconductor substrate.

The semiconductor device according to the fifth embodiment differs from the semiconductor device of the second embodiment in that n-wells 352 and 331 in the second embodiment are not employed in the fifth embodiment, and n-well 37 having the impurity concentration peak at a position deeper than p-well 41 and shallower than p-well 43 is formed. Structures other than the above are the same as those of the semiconductor device of the second embodiment.

According to the semiconductor device of the fifth embodiment, even in the case where the depth of well is reduced in accordance with reduction in isolation width and well width due to miniaturization of the semiconductor integrated circuit, it is possible to suppress deterioration of element characteristics such as increase in leak current at the pn junction between the semiconductor substrate (well) and the source/drain region in a portion provided with the capacitor within the memory cell region, and the refresh characteristics can be improved.

The transistor in DRAM memory cell region is formed in the deep p-well, which is surrounded by the bottom n-well. Thereby, the potential can be set independently of the substrate, and soft error is suppressed.

In the logic circuit region, since the well is formed in a shallow position, the circuit can be miniaturized, and the potential on the triple well can be independently set so that even the logic circuit provided with the transistors having various functions can achieve various required performances, and can have multiple functions.

Owing to provision of the n-well which has the concentration peak at a larger depth than the p-well provided with the memory cell transistor and at a smaller depth than the p-well in the logic circuit region, it is possible to provide the semiconductor device, which is miniaturized, and can suppress the leak current.

A method of manufacturing the semiconductor device according to the fifth embodiment of the invention will now be described.

Figure 39:
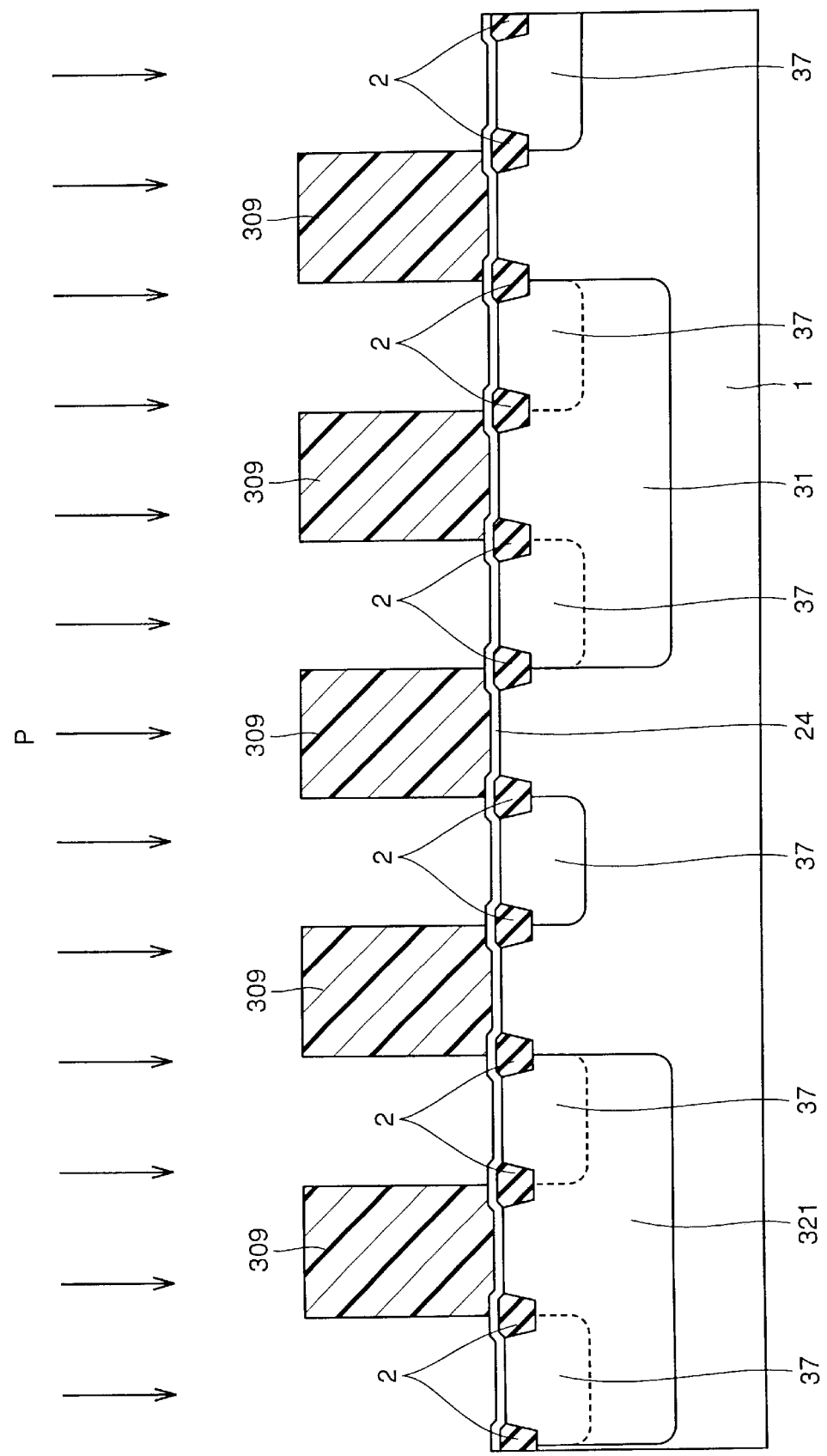
FIG. 39 is a cross section showing a step in a method of manufacturing the semiconductor device according to the fifth embodiment of the invention.

FIG. 39 is a cross section showing a step in the method of manufacturing the semiconductor device according to the fifth embodiment.

First, isolating and insulating film 2 and silicon oxide film 24 are formed at the surface of semiconductor substrate 1, similarly to the first embodiment. Then, a photoresist mask having an opening located above the surface of the region, in which the triple well structure will be formed, is formed similarly to the second embodiment, and high-energy implantation of the n-type impurity such as phosphorus is effected on the whole surface masked with the photoresist mask under the conditions of about 2–10 MeV and about $1 \times 10^{12} - 1 \times 10^{14}/cm^2$. Thereby, n-wells 31 and 321 are formed.

Thereafter, a photoresist mask 307 having an opening located above the surfaces of the n-well formation regions in the logic circuit region, memory cell region and peripheral region is formed as shown in FIG. 39, and high-energy implantation of the n-type impurity such as phosphorus is effected on the whole surface masked with photoresist mask under the conditions of about 300 KeV–2 MeV and about $1 \times 10^{12} - 1 \times 10^{14}/cm^2$. Thereby, n-well 37 is formed. FIG. 39 is a cross section showing the elements of the semiconductor device after completion of the above step.

Similarly to the second embodiment, p-wells 41–44 as well as required elements are formed similarly to the second embodiment. However, the order of formation of the p- and n-wells is not restricted.

According to the method of manufacturing the semiconductor device of the fifth embodiment, even in the case where the depth of well is reduced in accordance with reduction in isolation width and well width due to miniaturization of the semiconductor integrated circuit, the well in the memory cell region can be formed at a large depth. Accordingly, it is possible to suppress deterioration of element characteristics such as increase in leak current at the pnjunction between the semiconductor substrate (well) and the source/drain region, and the refresh characteristics can be improved.

Since the p-well provided with the transistor within the memory cell region is surrounded by the bottom n-well, the potential can be set independently of the substrate, and soft error is suppressed in the semiconductor device manufactured in the foregoing method.

In the logic circuit region, since the p-well can be formed in a shallow position, the circuit can be miniaturized, and the potential on the triple well can be independently set so that even the logic circuit provided with the transistors having various functions can achieve various required performances, and can have multiple functions. The semiconductor device having these advantages can be manufactured through the simple steps.

The bottom n-well which is formed at the bottom of the p-well in the triple well of the logic circuit region is formed simultaneously with the n-well, which is formed on the side of the p-well in the triple well of the memory cell region, by performing implantation one time. Therefore, the number of required masks as well as the number of masking steps can be reduced.

In the memory cell region and the logic circuit region, the p-wells surrounded by the n-wells of the triple well structures can be formed in different steps to provide different concentration distributions, respectively. Accordingly, the nMOS transistors having different characteristics can be formed, and the device having multiple functions can be provided.

Owing to provision of the n-well which has the concentration peak at a larger depth than the p-well provided with the memory cell transistor and at a smaller depth than the p-well in the logic circuit region, it is possible to provide the semiconductor device, which is miniaturized, and can suppress the leak current.

Sixth Embodiment

Figure 40:
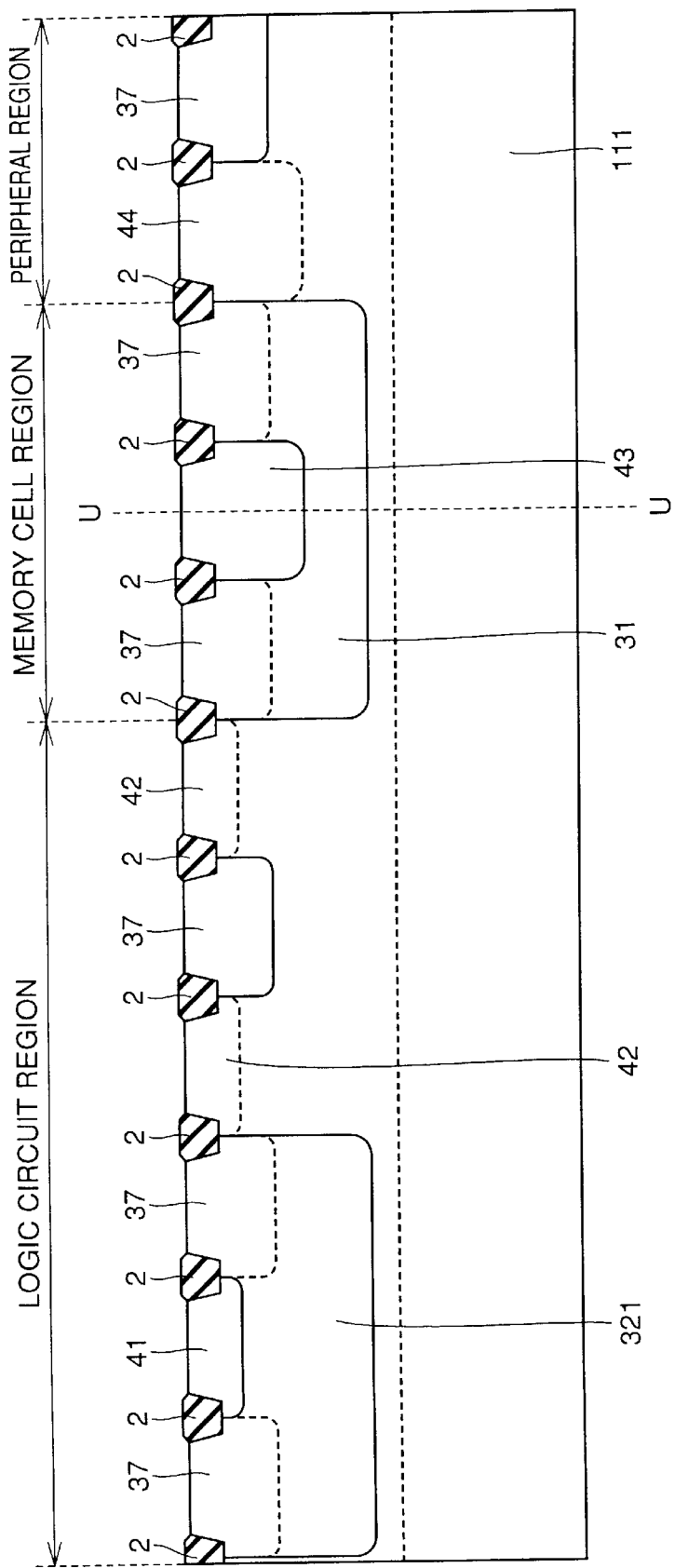
FIG. 40 is a cross section showing a semiconductor device according to a sixth embodiment of the invention.

FIG. 40 is a cross section showing a semiconductor device according to a sixth embodiment.

Referring to FIG. 40, a semiconductor substrate 111 contains a p-type impurity such as boron at about $1\times10^{19}/\text{cm}^3$, and is provided at its surface with an epitaxial layer 112 of a thickness of about 2.5–8.0 μm. Semiconductor device 111 has the substantially same structure as the semiconductor device of the fifth embodiment except for that n-wells 37 and 321 as well as p-wells 41–44 are formed in epitaxial layer 112.

Figure 41:
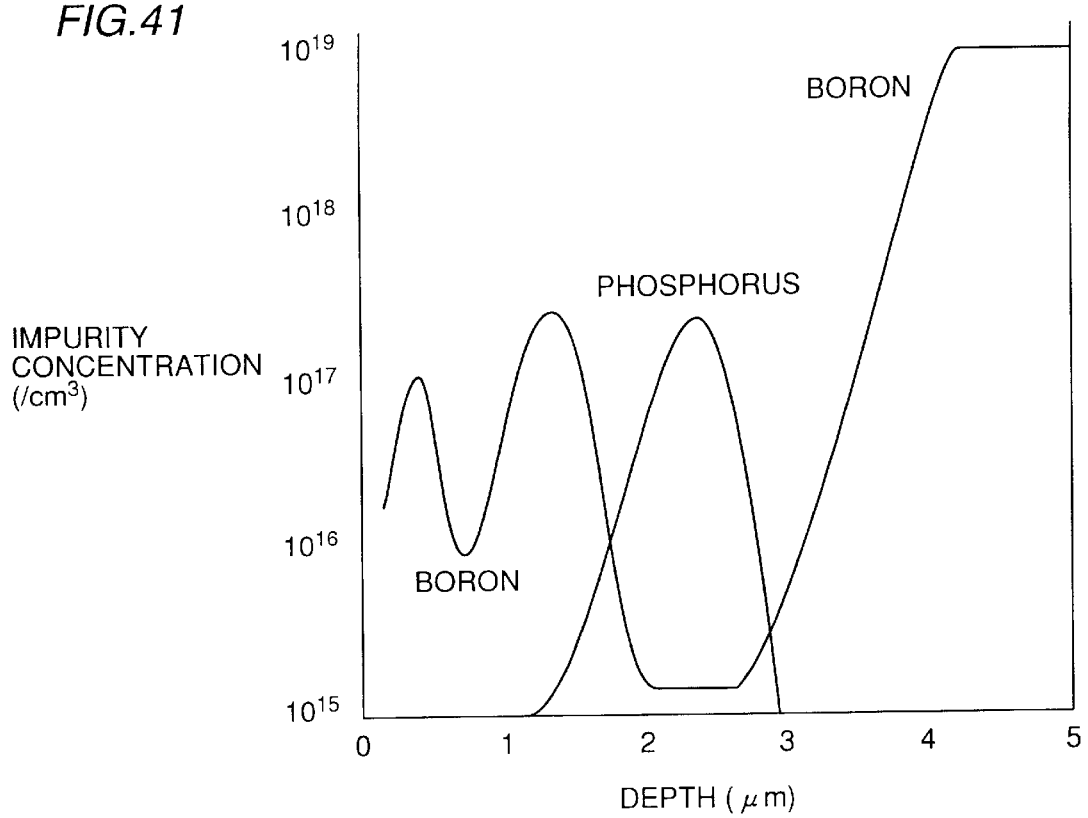
FIG. 41 is a graph showing distributions of impurity concentrations on a section of the semiconductor device taken along line U—U in FIG. 40 according to the sixth embodiment of the invention.

FIG. 41 is a graph showing distributions of impurity concentrations in the semiconductor device according to the sixth embodiment of the invention, and more specifically shows the impurity concentration distributions in n-well 31, p-well 43, epitaxial layer 112 and semiconductor substrate 111 on a section taken along line U—U in FIG. 40. Referring to FIG. 41, n-well 31 contains the impurity such as phosphorus at about $1\times10^{17}$–$1\times10^{19}/\text{cm}^3$, and the peak of the impurity concentration thereof is located at a depth of about 2–2.5 μm from the surface of the semiconductor substrate. p-well 43 contains the impurity such as boron at about $1\times10^{17}$–$1\times10^{19}/\text{cm}^3$, and the peak of the impurity concentration thereof is located at a depth of about 1–1.5 μm from the surface of the semiconductor substrate. It is preferable to minimize the thickness of epitaxial layer 112, but it is necessary to keep a distance of about 0.5 μm or more from the boundary between epitaxial layer 112 and semiconductor substrate 111 to the impurity concentration peak of n-well 31.

The description has been made on the structure, in which the semiconductor device in the fifth embodiment is formed on the surface of epitaxial layer 112 formed on heavily doped semiconductor substrate 111. However, similar effects can be achieved by the structure including the semiconductor device in any one of the first to fourth embodiments formed as described above provided that the relationships in impurity distribution are satisfied between semiconductor substrate 111, epitaxial layer 112 and n-well 31.

According to the semiconductor device of the sixth embodiment, the semiconductor substrate has a high impurity concentration, and can suppress the latch-up. Therefore, it is possible to reduce a distance between source/drain regions of the neighboring pMOS and nMOS transistors, and therefore the semiconductor device can be miniaturized to a further extent.

Since the transistors are formed at the surface of the epitaxial layer, the gate insulating film can have the improved reliability.

A method of manufacturing the semiconductor device according to the sixth embodiment of the invention will now be described.

Figure 42:
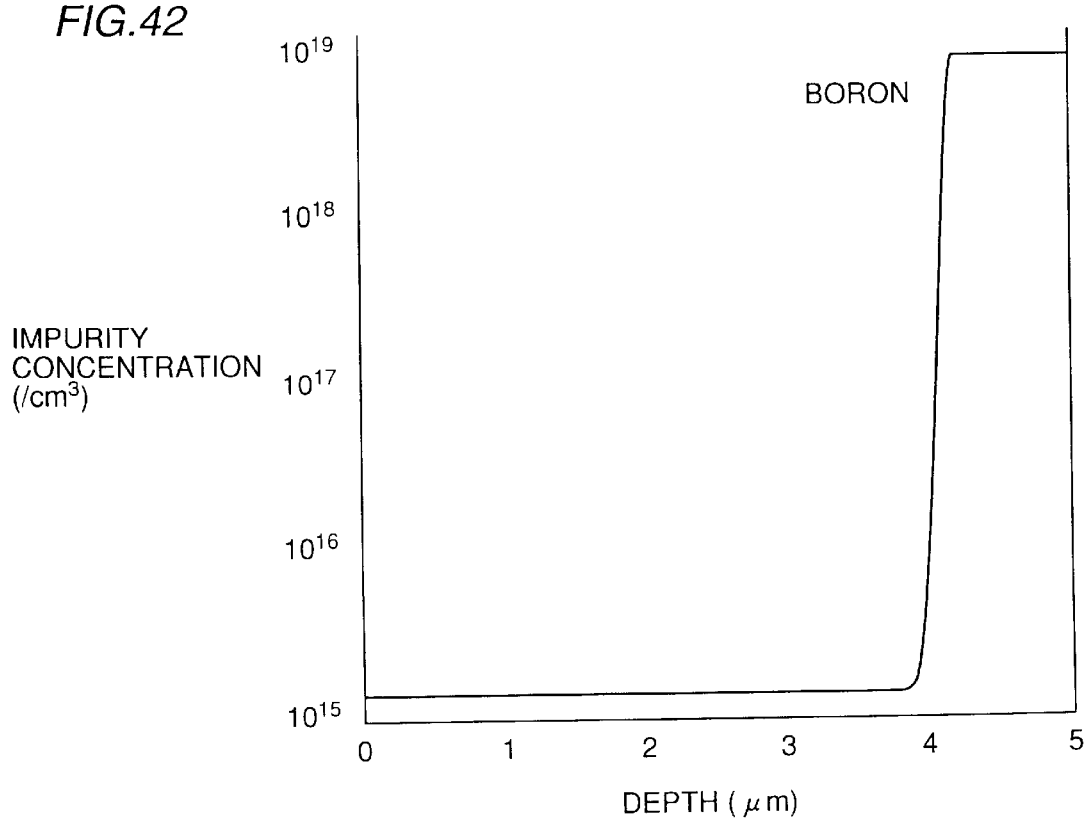
FIG. 42 is a graph showing an impurity concentration distribution of an epitaxial wafer according to the sixth embodiment of the invention.

FIG. 42 is a graph showing impurity concentration distributions of an epitaxial wafer (i.e., a wafer including epitaxial layer 112 formed on the surface of semiconductor substrate 111) before formation of the wells and elements according to the sixth embodiment. The wells and elements are formed at the surface of epitaxial layer 112 in the manners similar to those of the fifth embodiment so that the semiconductor device shown in FIG. 40 is completed. However, various heat treatments, which are performed for forming the isolating and insulating films and others, diffuse the impurity contained in semiconductor substrate 111. Accordingly, the structure in the state of the epitaxial wafer is different from the semiconductor substrate shown in FIG. 40 in distribution of impurities contained in semiconductor substrate 111 and epitaxial layer 112. The heat treatments to be performed in the manufacturing steps depend on the elements to be formed. If the heat treatment is performed many times, a large amount of impurity contained in semiconductor substrate 111 tends to diffuse into epitaxial layer 112 so that the thickness of epitaxial layer 112 must be controlled in accordance with the heat treatment.

According to the method of manufacturing the semiconductor device of the sixth embodiment, the semiconductor substrate has a high impurity concentration, and can suppress the latch-up. Therefore, it is possible to reduce a distance between source/drain regions of the neighboring pMOS and nMOS transistors, and therefore the semiconductor device can be miniaturized to a further extent.

Since the transistors are formed at the surface of the epitaxial layer, the gate insulating film can have the improved reliability.

Seventh Embodiment

Figure 43:
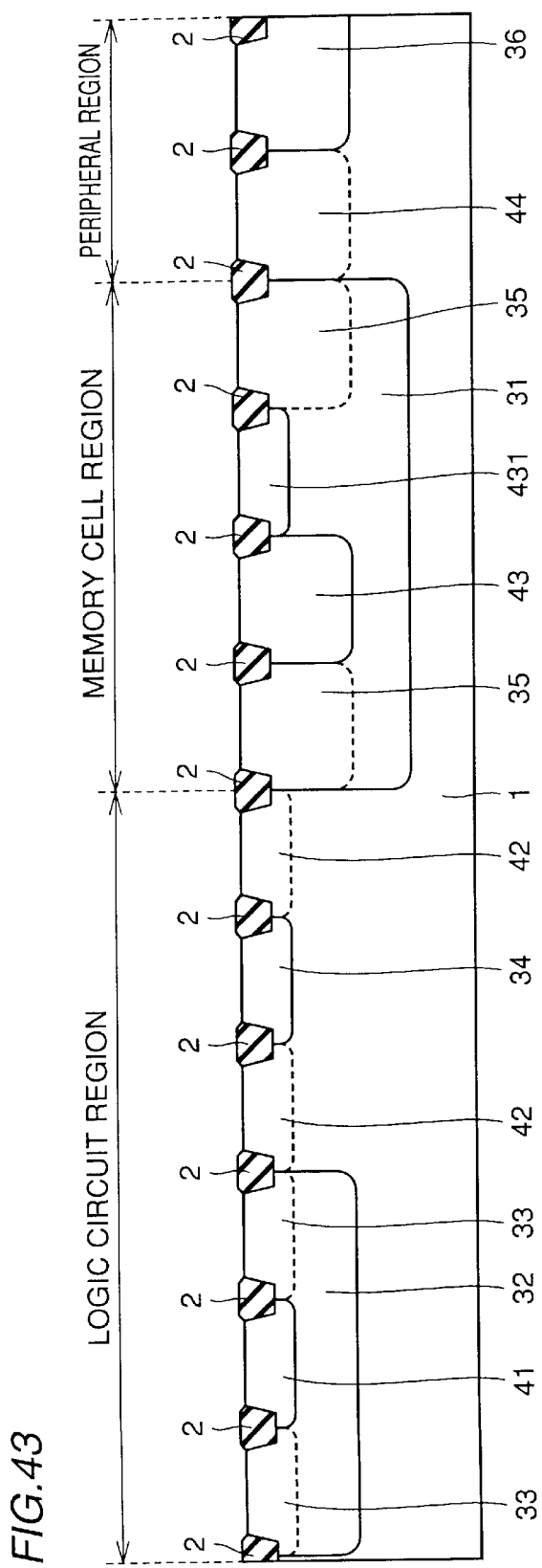
FIG. 43 is a cross section showing a semiconductor device according to a seventh embodiment of the invention.

FIG. 43 is a cross section showing a semiconductor device according to a seventh embodiment.

FIG. 43 shows by way of example a semiconductor device provided with the logic circuit, the memory cells and the peripheral circuit. The memory cell region is provided with p-well 431 having the same impurity concentration as p-wells 41 and 42 in the logic circuit. In the memory cell region, memory cell transistors are formed in p-well 43, and the other transistors are formed in p-well 431. Structures other than the above are the same as those of the first embodiment.

Figure 44:
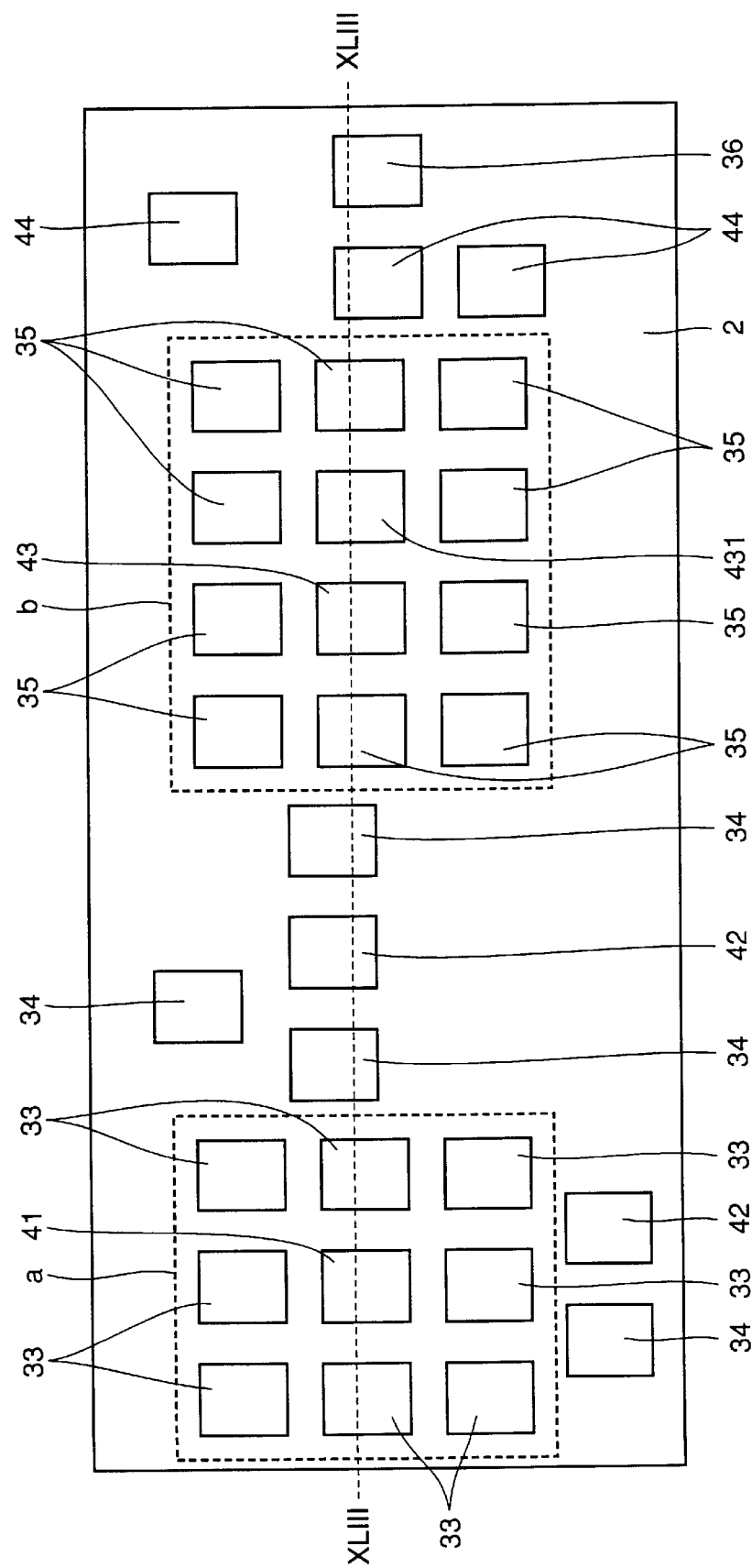
FIG. 44 is a top view showing the semiconductor device according to the seventh embodiment of the invention.

FIG. 44 is a top view of the semiconductor device according to the seventh embodiment of the invention. FIG. 43 shows a cross section taken along line V—V in FIG. 44. In FIG. 44, a portion surrounded by broken line a is provided with n-well 32 at a larger depth than p-well 41 and n-well 33. A portion surrounded by broken line b is provided with n-well 31 at a larger depth than p-wells 43 and 431 and n-well 35. p-wells 43 and 431 are electrically isolated from semiconductor substrate 1.

Although the description has been made in comparison with the first embodiment, similar effects can be achieved even by the structure in which the semiconductor device of any one of the first to sixth embodiments is formed.

According to the semiconductor device of the seventh embodiment, the nMOS transistors other than the memory cell transistors can be formed in the memory cell region while suppressing the leak current by forming the memory cell transistor in the p-well having an impurity concentration peak at a sufficiently large peak. Also, the refresh characteristics are improved. The p-well provided with the transistors other than the memory cell transistors has the impurity concentration peak at a much smaller depth, whereby the transistor can be formed even in the portion near the well end so that further miniaturization of the structure can be achieved while suppressing deterioration of the transistor characteristics.

In accordance with p-well 44 formed in the peripheral circuit region, all the p-wells other than p-well 43 may have shallow impurity concentration distributions, whereby the transistors in the regions other than the memory cell region can likewise be formed even in the portion near the well ends so that further miniaturization of the structure can be achieved while suppressing deterioration of the transistor characteristics.

A method of manufacturing the semiconductor device according to the seventh embodiment of the invention will now be described.

Figure 45:
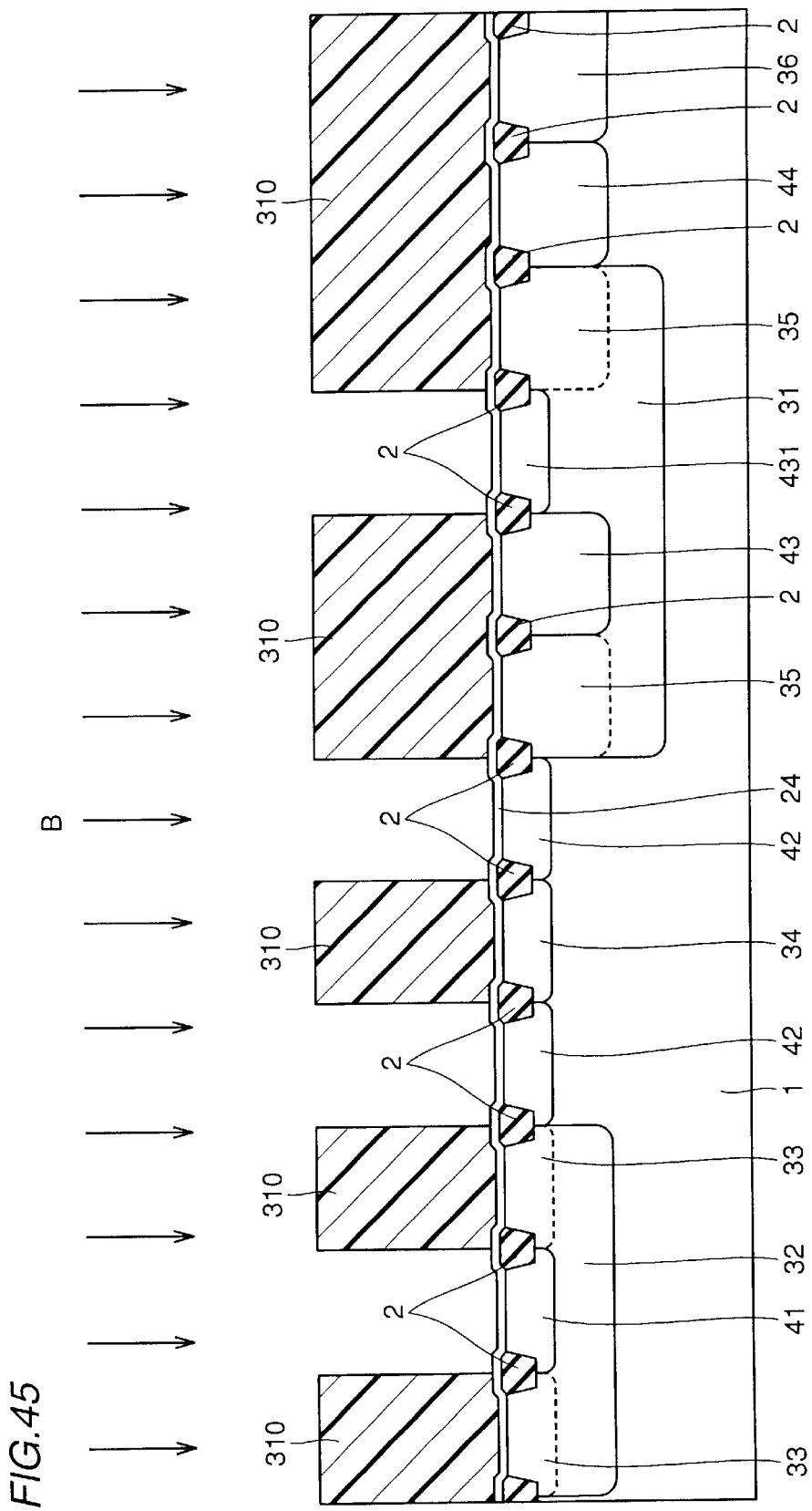
FIG. 45 is a cross section showing a step in a method of manufacturing the semiconductor device according to the seventh embodiment of the invention.

FIG. 45 is a cross section showing a step in a method of manufacturing the semiconductor device according to the seventh embodiment. In FIG. 45, 310 indicates a photoresist mask.

Similarly to the first embodiment, isolating and insulating film 2 and silicon oxide film 24 are formed at the surface of semiconductor substrate 1. Thereafter, n-wells 31, 32, 35 and 36 are formed, and p-wells 43 and 44 are formed.

Thereafter, a photoresist mask 310 is formed as shown in FIG. 45. Photoresist mask 310 has an opening located above the surfaces of the p-well formation regions in the logic circuit region and peripheral region as well as the surfaces of the p-well regions, where NMOS transistors other than the memory cell transistors are formed, in the memory cell region. High-energy implantation of a p-type impurity such as boron is effected on the whole surface masked with photoresist mask 310 under the conditions of about 150 KeV–1 MeV and about $1 \times 10^{12}$–$1 \times 10^{14}$/cm$^2$. Thereby, p-wells 41, 42 and 431 are formed. FIG. 44 is a cross section showing the elements of the semiconductor device after completion of the above step. p-well 44 may be formed simultaneously in the above structure, whereby p-well 44 can be formed at a smaller depth, and miniaturization can be achieved. Thereafter, photoresist mask 310 is removed.

Further, elements are formed similarly to the first embodiment. The order of formation of p-wells and n-wells is not restricted.

According to the method of manufacturing the semiconductor device of the seventh embodiment, the NMOS transistors other than the memory cell transistors can be formed in the memory cell region while achieving the following advantages. Since the p-well provided with the above NMOS transistor other than the memory cell transistor is formed simultaneously with the p-well in the logic circuit region, the impurity concentration peak of the p-well in the memory cell region can be changed through simple steps, and both the suppression of the leak current and the miniaturization can be achieved at the same time, Eighth Embodiment FIG. 46 is a cross section showing a semiconductor device according to an eighth embodiment of the invention.

Figure 46:
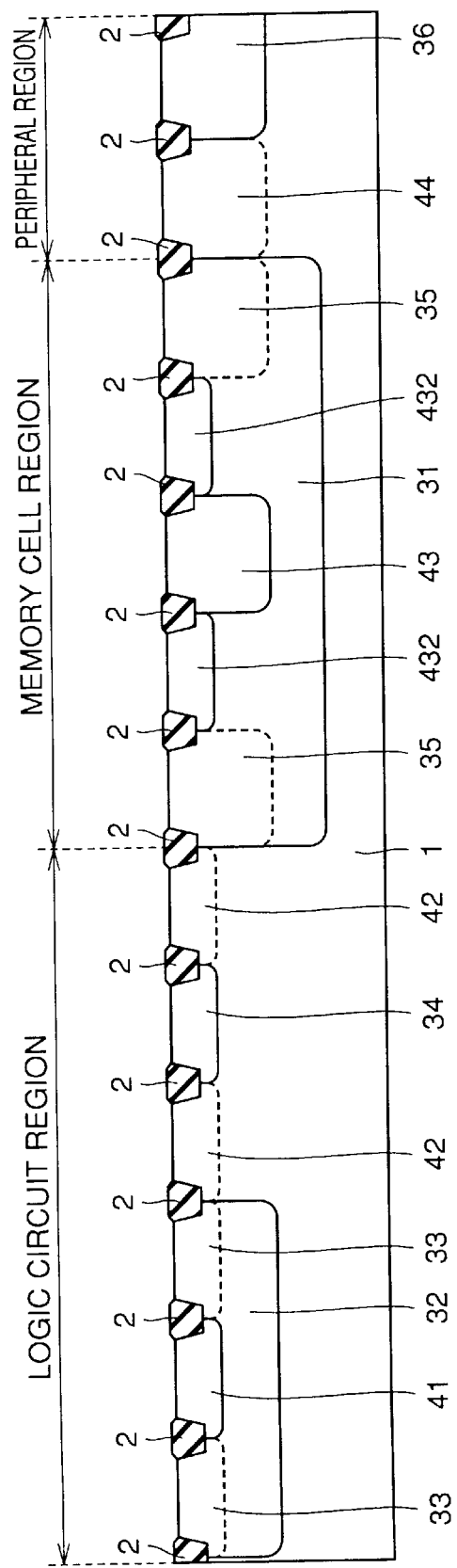
FIG. 46 is a cross section showing a semiconductor device according to an eighth embodiment of the invention.

FIG. 46 shows by way of example the semiconductor device provided with the logic circuit, the memory cells and the peripheral circuit. Even in the memory cell region, the memory cell transistor is formed in p-well 43, and the transistors other than the memory cell transistor are formed in a p-well 432. p-well 432 has the same impurity concentration distribution as p-wells 41 and 42 in the logic circuit region, and all the p-wells other than p-wells 43 and 44 have the same impurity concentration distributions.

Figure 47:
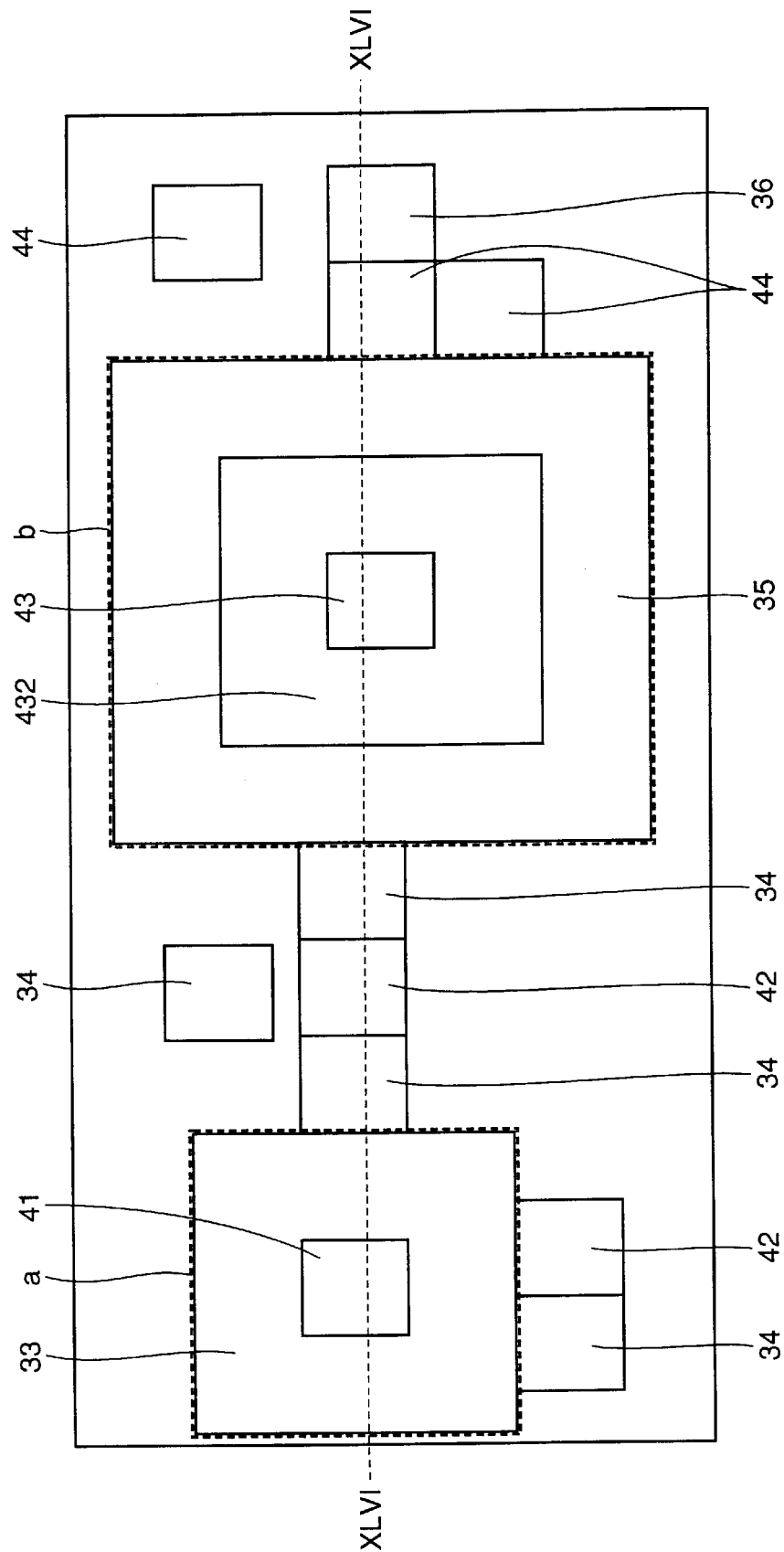
FIGS. 47–49 are top views showing the semiconductor device according to the eighth embodiment of the invention, respectively.

FIG. 47 is a top view of a semiconductor device according to an eighth embodiment of the invention. The section shown in FIG. 46 is taken along line W—W in FIG. 47. FIG. 47 does not show isolating and insulating film 2 for simplicity reason. Referring to FIG. 47, a portion surrounded by broken line a is provided with n-well 32 at a larger depth than p-well 41 and n-well 33. A portion surrounded by broken line b is provided with n-well 31 at a larger depth than p-well 43 and n-well 35. p-wells 41 and 43 are electrically isolated from semiconductor substrate 1. p-well 432 surrounds p-well 43 so that p-well 43 is not adjacent to n-well 35. Structures other than the above are the same as those in the seventh embodiment.

In the figures, p-well 44 in the peripheral circuit region has the same impurity distribution as p-well 43, but may have the same impurity distribution as the p-well in the logic circuit region.

Although the description has been made in comparison with the seventh embodiment, similar effects can be achieved even by the structure in which foregoing p-well 432 is employed in any one of the first to sixth embodiments.

Figure 48:
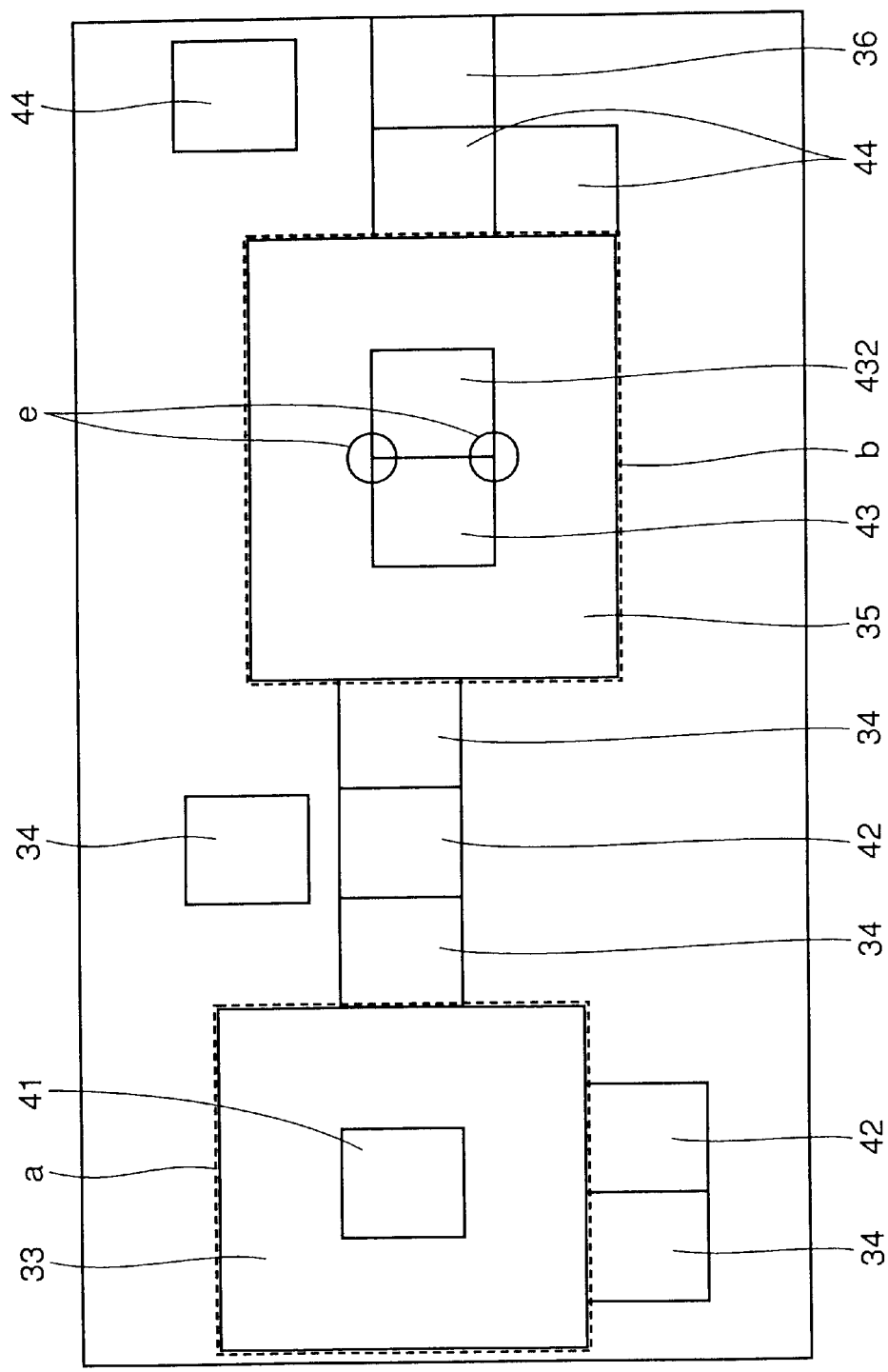

FIG. 48 is a top view of the semiconductor device according to the eighth embodiment of the invention, and does not show isolating and insulating film 2 in the top view of the semiconductor device according to the seventh embodiment shown in FIG. 44. In the seventh embodiment, p-wells 43 and 432 having different impurity concentration distributions are subjected to the ion implantation using different photoresist masks, respectively. Therefore, shift of the mask or the like may cause such a situation that the p-type impurity is implanted twice into the boundary portion between p-wells 43 and 432, and the impurity concentration becomes particularly high in the boundary portion. In portions within circles indicated by "e", the above situation causes formation of the high-concentration pn junction with the n-type impurity, which is contained in n-well 35. Thereby, a leak current flows, and the characteristics of the memory cell transistor formed in p-well 43 deteriorate. In the semiconductor device according to the eighth embodiment, however, p-well 43 provided with the memory cell transistor is surrounded by p-well 432 which has an impurity concentration distribution similar to those of p-wells 41 and 42, and is formed in the logic circuit region and others, i.e., the regions other than the memory cell region. Therefore, there is no possibility that the leak current occurs due to direct contact of n-well 35 with the portion having a high concentration due to overlapping of the ion implantation in p-wells 43 and 432. Accordingly, the characteristics of the memory cell transistor formed in p-well 43 are improved.

A method of manufacturing the semiconductor device according to the eighth embodiment of the invention will now be described.

The semiconductor device according to the eighth embodiment can be formed similarly to the semiconductor device of the seventh embodiment except for that the ion implantation is additionally effected on p-well 432 region shown in FIG. 47 when effecting the ion implantation for forming p-wells 41 and 42.

According to the method of manufacturing the semiconductor device of the eighth embodiment, it is possible to provide the semiconductor device, in which p-well 43 provided with the memory cell transistor is surrounded by p-well 432 having the impurity concentration distribution similar to p-wells 41 and 42 in the logic circuit region and others, i.e., the regions other than the memory cell region. Therefore, even the portion of a high concentration is formed due to overlapping of the ion implantation in p-wells 43 and 432, there is no possibility of direct contact with n-well and therefore occurrence of the leak current. Accordingly, the method can provide the semiconductor device, in which the memory cell transistor formed in p-well 43 has the improved characteristics.

Figure 49:
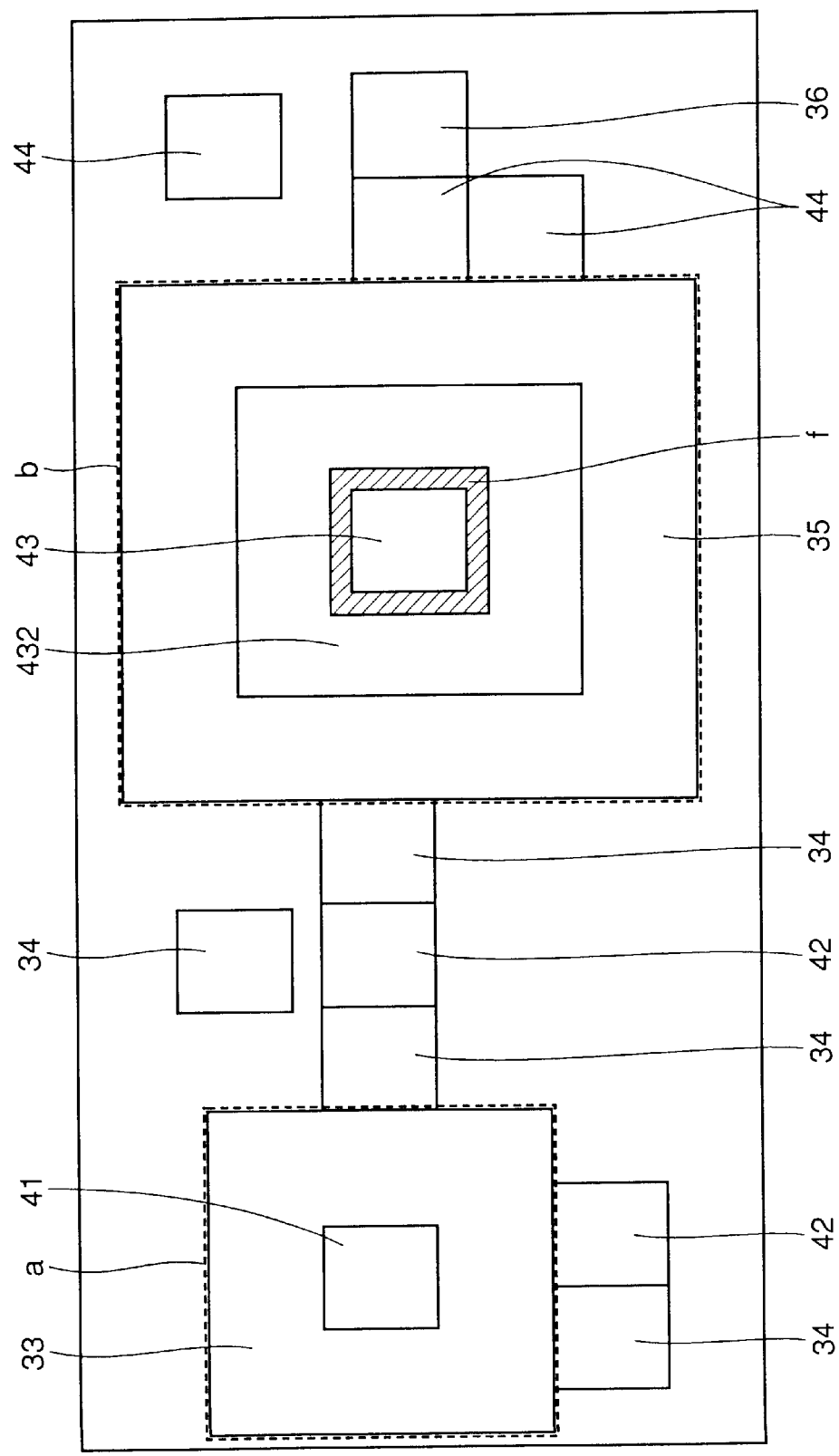
Figure 50:
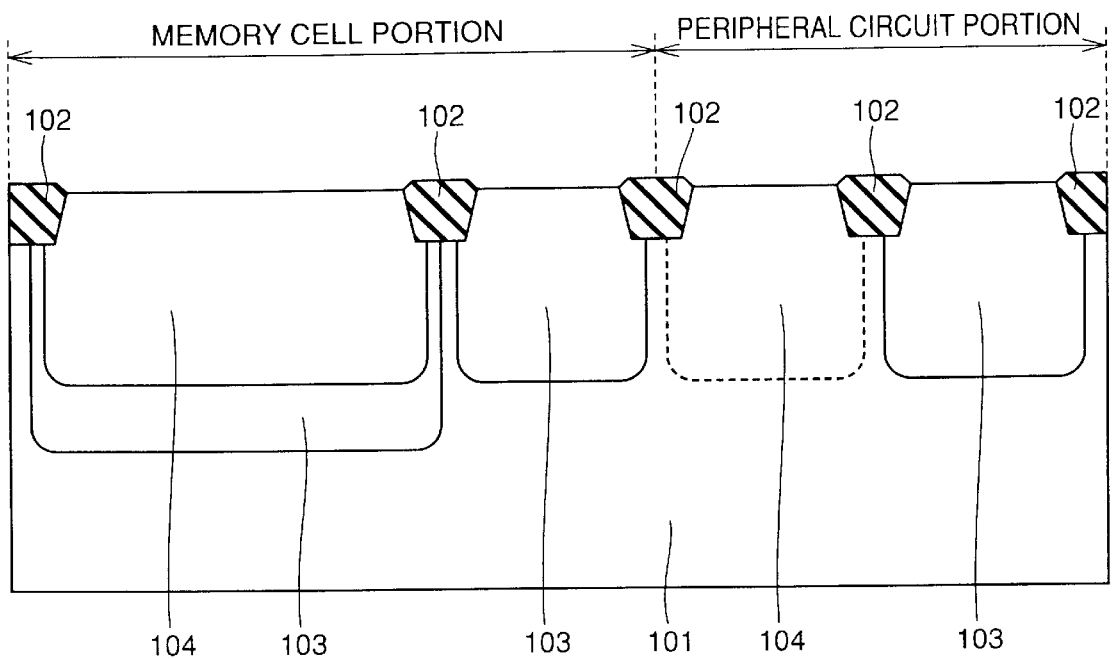
FIG. 50 is a cross section showing a semiconductor device in the prior art.

FIG. 49 is a top view of another semiconductor device according to the eighth embodiment. In FIG. 49, isolating and insulating film 2 is not shown for simplicity reason. As shown in FIG. 49, impurity implantation for forming p-well 432 and impurity implantation for forming p-well 43 may be both effected on a hatched portion f so that hatched portion f may have a high concentration. If ion implantation is performed in a manner which can prevent overlapping in p-wells 43 and 432, such a situation may occur due to shift of a mask that the p-type impurity is not implanted into a certain portion in hatched portion f, and a pnp junction is formed due to the n-type impurity of n-well 31 implanted into portion indicated by broken line b and the p-type impurity in p-wells 43 and 432. However, presence of hatched portion f eliminates the possibility of formation of the pnp junction, and improves the characteristics of the memory cell transistor formed in p-well 43.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device comprising:
a semiconductor layer of a first conductivity type;
a first impurity region of a second conductivity type formed at a main surface of said semiconductor layer and having a first impurity concentration peak;
a second impurity region of the first conductivity type formed at the main surface of said semiconductor layer, located within a planar region provided with said first impurity region, and having a second impurity concentration peak at a smaller depth than said first impurity concentration peak;
a third impurity region of the second conductivity type formed at the main surface of said semiconductor layer, located within the planar region provided with said first impurity region, surrounding said second impurity region, and having a third impurity concentration peak at a smaller depth than the first impurity concentration peak;
a fourth impurity region of the second conductivity type formed at the main surface of said semiconductor layer, located in a region spaced from said first impurity region, and having a fourth impurity concentration peak;
a fifth impurity region of the first conductivity type formed at the main surface of said semiconductor layer, located within a planar region provided with said fourth impurity region, and having a fifth impurity concentration peak at a smaller depth than said second and fourth impurity concentration peaks;
a sixth impurity region of the second conductivity type formed at the main surface of said semiconductor layer, located within a planar region provided with said fourth impurity region, surrounding said fifth impurity region and having a sixth impurity concentration peak at a smaller depth than the fourth impurity concentration peak;
a first field-effect element of the second conductivity type formed at the main surface of said second impurity region; and
a second field-effect element of the second conductivity type formed at the main surface of said fifth impurity region.

2. The semiconductor device according to claim 1, wherein
said first impurity concentration peak and said fourth impurity concentration peak are formed at the substantially equal depths from the main surface of said semiconductor layer, respectively.

3. The semiconductor device according to claim 2, wherein
said first and third impurity regions are spaced by a predetermined distance from each other in a direction of a depth determined from the main surface of said semiconductor layer, and said fourth and sixth impurity regions are spaced by a predetermined distance from each other in the direction of the depth determined from the main surface of said semiconductor layer.

4. The semiconductor device according to claim 2, further comprises:
a seventh impurity region of the second conductivity type formed at the main surface of said semiconductor layer, located within a planar region provided with said first impurity region, surrounding said second impurity region, and having a seventh impurity concentration peak located shallower than said first impurity concentration peak and deeper than said third impurity concentration peak and being lower in concentration than said first and third impurity concentration peaks; and
an eighth impurity region of the second conductivity type formed at the main surface of said semiconductor layer, located in a region provided with said fourth impurity region, surrounding said fifth impurity region, and having an eighth impurity concentration peak located shallower than said fourth impurity concentration peak and deeper than said sixth impurity concentration peak and being lower in concentration than said fourth and sixth impurity concentration peaks.

5. The semiconductor device according to claim 2, further comprising:
a seventh impurity region of the second conductivity type formed at the main surface of said semiconductor layer, located within a planar region provided with said first impurity region, surrounding said second impurity region with a predetermined distance therebetween, and having a seventh impurity concentration peak located shallower than said first impurity concentration peak and deeper than said third impurity concentration peak; and
a third field-effect element of the first conductivity type formed in said third impurity region.

6. The semiconductor device according to claim 1, wherein
said fourth impurity concentration peak is shallower than said first impurity concentration peak.

7. The semiconductor device according to claim 1, further comprising:
a ninth impurity region of the first conductivity type formed at the main surface of said semiconductor layer, located in a region different from said first and fourth impurity regions, and having a ninth impurity concentration peak at the substantially same depth as said second impurity concentration peak;
a tenth impurity region of the first conductivity type formed at the main surface of said semiconductor layer, located in a region different from said first, fourth and ninth impurity regions, and having a tenth impurity concentration peak at the substantially same depth as said fifth impurity concentration peak;
an eleventh impurity region of the second conductivity type formed at the main surface of said semiconductor layer, located in a region different from said first, fourth, ninth and tenth impurity regions, and having an eleventh impurity concentration peak at the substantially same depth as the fifth impurity concentration peak;
a twelfth impurity region of the second conductivity type formed at the main surface of said semiconductor layer, located in a region different from said first, fourth, ninth, tenth and eleventh impurity regions, and having a twelfth impurity concentration peak at the substantially same depth as said second impurity concentration peak;
a third field-effect element of the second conductivity type formed at the main surface of said ninth impurity region;
a fourth field-effect element of the second conductivity type formed at the main surface of said tenth impurity region;
a fifth field-effect element of the first conductivity type formed at the main surface of said eleventh impurity region; and
a sixth field-effect element of the first conductivity type formed at the main surface of said twelfth impurity region.

8. The semiconductor device according to claim 1, further comprising:

a ninth impurity region of the first conductivity type formed at the main surface of said semiconductor layer, located in a region different from said first and fourth impurity regions, and having a ninth impurity concentration peak at the substantially same depth as said second impurity concentration peak;
a tenth impurity region of the first conductivity type formed at the main surface of said semiconductor layer, located in a region different from said first, fourth and ninth impurity regions, and having a tenth impurity concentration peak at the substantially same depth as said fifth impurity concentration peak;
an eleventh impurity region of the second conductivity type formed at the main surface of said semiconductor layer, located in a region different from said first, fourth, ninth and tenth impurity regions, and having an eleventh impurity concentration peak;
a third field-effect element of the second conductivity type formed at the main surface of said ninth impurity region;
a fourth field-effect element of the second conductivity type formed at the main surface of said tenth impurity region; and
a fifth field-effect element of the first conductivity type formed at the main surface of said eleventh impurity region, wherein
said third, sixth and eleventh impurity concentration peaks are located at the substantially same depth as said fifth impurity concentration peak.

9. The semiconductor device according to claim 2, wherein
said third and sixth impurity concentration peaks are shallower than said second impurity concentration peak and deeper than said fifth impurity concentration peak.

10. The semiconductor device according to claim 9, further comprising:
an impurity region of the second conductivity type formed at the main surface of said semiconductor layer, located in a region different from said first and fourth regions, and having an impurity concentration peak at the substantially same depth as the third and sixth impurity concentration peaks; and an element of the first conductivity type formed in this impurity region.

11. The semiconductor device according to claim 1, further comprising:
an impurity region of the first conductivity type formed at the main surface of said semiconductor layer, located in a region between said second impurity region and said third impurity region, and having an impurity concentration peak shallower than said second impurity concentration; and an element of the second conductivity type formed in this impurity region.

12. The semiconductor device according to claim 1, further comprising:
another semiconductor layer disposed on another main surface of said semiconductor layer, and having a higher impurity concentration than said semiconductor layer.

13. A semiconductor device comprising:
a semiconductor layer of a first conductivity type;
a first impurity region of a second conductivity type formed at a main surface of said semiconductor layer and having a first impurity concentration peak;
a second impurity region of the first conductivity type formed at the main surface of said semiconductor layer provided with said first impurity region, surrounded entirely by said first impurity region and having a second impurity concentration peak at a smaller depth than said first impurity concentration peak;

a third impurity region of the first conductivity type formed at the main surface of said semiconductor layer, located in a region between said first and second impurity regions, surrounding said second impurity region, and having a third impurity concentration peak at a smaller depth than said second impurity concentration peak; and a first field-effect element of the second conductivity type formed at the main surface of said second impurity region.

14. The semiconductor device according to claim 13, wherein
an impurity region of the second conductivity type is not present between said second impurity region and said third impurity region.

15. The semiconductor device according to claim 13, further comprising:
a fourth impurity region of the first conductivity type formed at the main surface of said semiconductor layer, located in a region different from said first impurity region, and having a fourth impurity concentration peak at the substantially same depth as said second impurity concentration peak;

a fifth impurity region of the first conductivity type formed at the main surface of said semiconductor layer, located in a region different from said first and fourth impurity regions, and having a fifth impurity concentration peak at a smaller depth than said second and fourth impurity concentration peaks;

a sixth impurity region of the second conductivity type formed at the main surface of said semiconductor layer, located in a region different from said first, fourth and fifth impurity regions, and having a sixth impurity concentration peak at the substantially same depth as said fifth impurity concentration peak;

a seventh impurity region of the second conductivity type formed at the main surface of said semiconductor layer, located in a region different from said first, fourth and sixth impurity regions, and having a seventh impurity concentration peak at the substantially same depth as said fourth impurity concentration peak;

a second field-effect element of the second conductivity type formed at the main surface of said fourth impurity region;

a third field-effect element of the second conductivity type formed at the main surface of said fifth impurity region;

a fourth field-effect element of the first conductivity type formed at the main surface of said sixth impurity region;

a fifth field-effect element of the first conductivity type formed at the main surface of said seventh impurity region; and a capacitor connected to one of source/drain regions of said first element.

16. The semiconductor device according to claim 13, further comprising:
another semiconductor layer disposed on another main surface of said semiconductor layer, and having a higher impurity concentration than said semiconductor layer.

17. A method of manufacturing a semiconductor device comprising the steps of:

forming a first impurity region of a second conductivity type having a first impurity concentration peak at a main surface of a semiconductor layer of a first conductivity type;

forming a second impurity region of the second conductivity type arranged at the main surface of said semiconductor layer, located in a region different from said first impurity region and having a second impurity concentration peak;

forming a third impurity region of the first conductivity type arranged at the main surface of said semiconductor layer provided with said first impurity region, and having a third impurity concentration peak at a smaller depth than said first impurity concentration peak;

forming a fourth impurity region of the first conductivity type formed at the main surface of said semiconductor layer provided with said second impurity region, and having a fourth impurity concentration peak at a smaller depth than said second impurity concentration peak;

forming a fifth impurity region of the second conductivity type arranged at the main surface of said semiconductor layer provided with the first impurity region, and having a fifth impurity concentration peak at a smaller depth than said first and third impurity concentration peaks, and a sixth impurity region of the second conductivity type arranged at the main surface of said semiconductor layer provided with said second impurity region, surrounding said fourth impurity region and having said fifth impurity concentration peak;

forming a first element of the second conductivity type at the main surface of said third impurity region; and forming a second element of the second conductivity type at the main surface of said fourth impurity region.

18. The method of manufacturing the semiconductor device according to claim 17, further comprising the step of:
forming a seventh impurity region of the second conductivity type arranged at the main surface of said semiconductor layer, located in a planar region provided with said first impurity region, surrounding said third impurity region, and having a seventh impurity concentration peak located shallower than said first impurity concentration peak and deeper than said fourth impurity concentration peak and being lower in concentration than said first and sixth impurity concentration peaks; and an eighth impurity region of the second conductivity type arranged at the main surface of said semiconductor layer, located in a region provided with said second impurity region, surrounding said fourth impurity region, and having said seventh impurity concentration peak.

19. The method of manufacturing the semiconductor device according to claim 17, wherein
said step of forming said third impurity region includes the step of forming a ninth impurity region of the first conductivity type arranged at the main surface of said semiconductor layer, located in a region different from said first and second impurity regions, and having a ninth impurity concentration peak;

said step of forming said fourth impurity region includes the step of forming a tenth impurity region of the first conductivity type arranged at the main surface of said semiconductor layer, located in a region different from said first, second and ninth impurity regions, and having a tenth impurity concentration peak; and said step of forming said fifth and sixth impurity regions includes the step of forming an eleventh impurity region of the second conductivity type arranged at the main surface of said semiconductor layer, located in a region different from said first, second, ninth and tenth impurity regions, and having an eleventh impurity concentration peak.

20. The method of manufacturing the semiconductor device according to claim 19, wherein said fifth, sixth and eleventh impurity concentration peaks are disposed shallower than said third impurity concentration peak and deeper than said fourth impurity concentration peak.

* * * * *

UNITED STATES PATENT AND TRADEMARK OFFICE
CERTIFICATE OF CORRECTION

PATENT NO. : 6,388,295 B1
DATED : May 14, 2002
INVENTOR(S) : Tomohiro Yamashita et al.

It is certified that error appears in the above-identified patent and that said Letters Patent is hereby corrected as shown below:

Column 12,
Line 13, replace "A-A" with -- I-I --

Column 21,
Line 23, replace "J-J" with -- XXI-XXI --

Column 33,
Line 15, replace "V-V" with -- XLIII-XLIII --

Column 34,
Line 35, replace "W-W" with -- XLVI-XLVI --

Signed and Sealed this

Twenty-eighth Day of January, 2003

JAMES E. ROGAN
*Director of the United States Patent and Trademark Office*